US011777342B2

(12) United States Patent
Leabman

(10) Patent No.: US 11,777,342 B2
(45) Date of Patent: *Oct. 3, 2023

(54) WIRELESS POWER RECEIVER WITH A TRANSISTOR RECTIFIER

(71) Applicant: Energous Corporation, San Jose, CA (US)

(72) Inventor: Michael A. Leabman, Pleasanton, CA (US)

(73) Assignee: Energous Corporation, San Jose, CA (US)

( * ) Notice: Subject to any disclaimer, the term of this patent is extended or adjusted under 35 U.S.C. 154(b) by 181 days.

This patent is subject to a terminal disclaimer.

(21) Appl. No.: 17/176,334

(22) Filed: Feb. 16, 2021

(65) Prior Publication Data

US 2021/0184503 A1 Jun. 17, 2021

Related U.S. Application Data

(63) Continuation of application No. 15/803,476, filed on Nov. 3, 2017, now Pat. No. 10,923,954.

(Continued)

(51) Int. Cl.
*H02J 7/00* (2006.01)
*H02J 7/14* (2006.01)
(Continued)

(52) U.S. Cl.
CPC .......... *H02J 50/12* (2016.02); *H02J 7/00712* (2020.01); *H02J 50/20* (2016.02);
(Continued)

(58) Field of Classification Search
CPC .. H02J 50/12; H02J 7/00712; H02M 3/33592; H03F 1/3223; H03F 3/193; H03F 3/2176
(Continued)

(56) References Cited

U.S. PATENT DOCUMENTS 787,412 A 4/1905 Tesla
2,811,624 A 10/1957 Haagensen
(Continued)

FOREIGN PATENT DOCUMENTS

CN 201278367 Y 7/2009
CN 102227884 A 10/2011
(Continued)

OTHER PUBLICATIONS

Energous Corp., IPRP, PCT/US2014/037072, Nov. 10, 2015, 6 pgs.
(Continued)

*Primary Examiner* — Alexis B Pacheco
(74) *Attorney, Agent, or Firm* — Morgan, Lewis & Bockius LLP

(57) ABSTRACT

Embodiments disclosed herein describe a wireless power receiver including a synchronous transistor rectifier using a Class-E or a Class-F amplifier. The wireless power receiver includes at least one radio frequency (RF) antenna configured to generate an alternating current (AC) waveform from received RF waves. The wireless power receiver further includes a power line configured to carry a first signal based on the AC current generated by the least one RF antenna, and a tap-line coupled to the power line, the tap-line being configured to carry a second signal. The second signal is based on the AC current generated by the least one RF antenna and distinct from the first signal. The wireless power receiver also includes a transistor coupled to at least the power line and the tap-line. The transistor is configured to provide a direct current (DC) waveform to a load based on the first and second signals.

24 Claims, 10 Drawing Sheets

Related U.S. Application Data

(60) Provisional application No. 62/417,115, filed on Nov. 3, 2016.

(51) Int. Cl.
*H02J 50/12* (2016.01)
*H03F 1/32* (2006.01)
*H03F 3/217* (2006.01)
*H03F 3/193* (2006.01)
*H02J 50/20* (2016.01)
*H02M 3/335* (2006.01)
*H02M 7/217* (2006.01)

(52) U.S. Cl.
CPC ...... *H02M 3/33592* (2013.01); *H03F 1/3223* (2013.01); *H03F 3/193* (2013.01); *H03F 3/2176* (2013.01); *H02M 7/217* (2013.01); *Y02B 70/10* (2013.01)

(58) Field of Classification Search
USPC ........................................................ 320/108
See application file for complete search history.

(56) References Cited

U.S. PATENT DOCUMENTS

| | | |
|---|---|---|
| 2,863,148 A | 12/1958 | Gammon et al. |
| 3,167,775 A | 1/1965 | Guertler |
| 3,434,678 A | 3/1969 | Brown et al. |
| 3,696,384 A | 10/1972 | Lester |
| 3,754,269 A | 8/1973 | Clavin |
| 4,101,895 A | 7/1978 | Jones, Jr. |
| 4,360,741 A | 11/1982 | Fitzsimmons et al. |
| 4,944,036 A | 7/1990 | Hyatt |
| 4,995,010 A | 2/1991 | Knight |
| 5,200,759 A | 4/1993 | McGinnis |
| 5,211,471 A | 5/1993 | Rohrs |
| 5,276,455 A | 1/1994 | Fitzsimmons et al. |
| 5,548,292 A | 8/1996 | Hirshfield et al. |
| 5,556,749 A | 9/1996 | Mitsuhashi et al. |
| 5,568,088 A | 10/1996 | Dent et al. |
| 5,631,572 A | 5/1997 | Sheen et al. |
| 5,646,633 A | 7/1997 | Dahlberg |
| 5,697,063 A | 12/1997 | Kishigami et al. |
| 5,712,642 A | 1/1998 | Hulderman |
| 5,936,527 A | 8/1999 | Isaacman et al. |
| 5,982,139 A | 11/1999 | Parise |
| 6,046,708 A | 4/2000 | MacDonald, Jr. et al. |
| 6,061,025 A | 5/2000 | Jackson et al. |
| 6,127,799 A | 10/2000 | Krishnan |
| 6,127,942 A | 10/2000 | Welle |
| 6,163,296 A | 12/2000 | Lier et al. |
| 6,176,433 B1 | 1/2001 | Uesaka et al. |
| 6,271,799 B1 | 8/2001 | Rief |
| 6,289,237 B1 | 9/2001 | Mickle et al. |
| 6,329,908 B1 | 12/2001 | Frecska |
| 6,400,586 B2 | 6/2002 | Raddi et al. |
| 6,421,235 B2 | 7/2002 | Ditzik |
| 6,437,685 B2 | 8/2002 | Hanaki |
| 6,456,253 B1 | 9/2002 | Rummeli et al. |
| 6,476,795 B1 | 11/2002 | Derocher et al. |
| 6,501,414 B2 | 12/2002 | Arndt et al. |
| 6,583,723 B2 | 6/2003 | Watanabe et al. |
| 6,597,897 B2 | 7/2003 | Tang |
| 6,615,074 B2 | 9/2003 | Mickle et al. |
| 6,650,376 B1 | 11/2003 | Obitsu |
| 6,664,920 B1 | 12/2003 | Mott et al. |
| 6,680,700 B2 | 1/2004 | Hilgers |
| 6,798,716 B1 | 9/2004 | Charych |
| 6,803,744 B1 | 10/2004 | Sabo |
| 6,853,197 B1 | 2/2005 | McFarland |
| 6,856,291 B2 | 2/2005 | Mickle et al. |
| 6,911,945 B2 | 6/2005 | Korva |
| 6,960,968 B2 | 11/2005 | Odendaal et al. |
| 6,967,462 B1 | 11/2005 | Landis |
| 6,988,026 B2 | 1/2006 | Breed et al. |
| 7,003,350 B2 | 2/2006 | Denker et al. |
| 7,012,572 B1 | 3/2006 | Schaffner et al. |
| 7,027,311 B2 | 4/2006 | Vanderelli et al. |
| 7,068,234 B2 | 6/2006 | Sievenpiper |
| 7,068,991 B2 | 6/2006 | Parise |
| 7,079,079 B2 | 7/2006 | Jo et al. |
| 7,183,748 B1 | 2/2007 | Unno et al. |
| 7,191,013 B1 | 3/2007 | Miranda et al. |
| 7,193,644 B2 | 3/2007 | Carter |
| 7,196,663 B2 | 3/2007 | Bolzer et al. |
| 7,205,749 B2 | 4/2007 | Hagen et al. |
| 7,215,296 B2 | 5/2007 | Abramov et al. |
| 7,222,356 B1 | 5/2007 | Yonezawa et al. |
| 7,274,334 B2 | 9/2007 | O'Riordan et al. |
| 7,274,336 B2 | 9/2007 | Carson |
| 7,351,975 B2 | 4/2008 | Brady et al. |
| 7,359,730 B2 | 4/2008 | Dennis et al. |
| 7,372,408 B2 | 5/2008 | Gaucher |
| 7,392,068 B2 | 6/2008 | Dayan |
| 7,403,803 B2 | 7/2008 | Mickle et al. |
| 7,443,057 B2 | 10/2008 | Nunally |
| 7,451,839 B2 | 11/2008 | Perlman |
| 7,463,201 B2 | 12/2008 | Chiang et al. |
| 7,471,247 B2 | 12/2008 | Saily |
| 7,535,195 B1 | 5/2009 | Horovitz et al. |
| 7,614,556 B2 | 11/2009 | Overhultz et al. |
| 7,639,994 B2 | 12/2009 | Greene et al. |
| 7,643,312 B2 | 1/2010 | Vanderelli et al. |
| 7,652,577 B1 | 1/2010 | Madhow et al. |
| 7,679,576 B2 | 3/2010 | Riedel et al. |
| 7,702,771 B2 | 4/2010 | Ewing et al. |
| 7,786,419 B2 | 8/2010 | Hyde et al. |
| 7,812,771 B2 | 10/2010 | Greene et al. |
| 7,830,312 B2 | 11/2010 | Choudhury et al. |
| 7,844,306 B2 | 11/2010 | Shearer et al. |
| 7,868,482 B2 | 1/2011 | Greene et al. |
| 7,898,105 B2 | 3/2011 | Greene et al. |
| 7,904,117 B2 | 3/2011 | Doan et al. |
| 7,911,386 B1 | 3/2011 | Ito et al. |
| 7,925,308 B2 | 4/2011 | Greene et al. |
| 7,948,208 B2 | 5/2011 | Partovi et al. |
| 8,049,676 B2 | 11/2011 | Yoon et al. |
| 8,055,003 B2 | 11/2011 | Mittleman et al. |
| 8,070,595 B2 | 12/2011 | Alderucci et al. |
| 8,072,380 B2 | 12/2011 | Crouch |
| 8,092,301 B2 | 1/2012 | Alderucci et al. |
| 8,099,140 B2 | 1/2012 | Arai |
| 8,115,448 B2 | 2/2012 | John |
| 8,159,090 B2 | 4/2012 | Greene et al. |
| 8,159,364 B2 | 4/2012 | Zeine |
| 8,180,286 B2 | 5/2012 | Yamasuge |
| 8,184,454 B2 | 5/2012 | Mao |
| 8,228,194 B2 | 7/2012 | Mickle |
| 8,234,509 B2 | 7/2012 | Gioscia et al. |
| 8,264,101 B2 | 9/2012 | Hyde et al. |
| 8,264,291 B2 | 9/2012 | Morita |
| 8,276,325 B2 | 10/2012 | Clifton et al. |
| 8,278,784 B2 | 10/2012 | Cook et al. |
| 8,284,101 B2 | 10/2012 | Fusco |
| 8,310,201 B1 | 11/2012 | Wright |
| 8,338,991 B2 | 12/2012 | Von Novak et al. |
| 8,362,745 B2 | 1/2013 | Tinaphong |
| 8,380,255 B2 | 2/2013 | Shearer et al. |
| 8,384,600 B2 | 2/2013 | Huang et al. |
| 8,410,953 B2 | 4/2013 | Zeine |
| 8,411,963 B2 | 4/2013 | Luff |
| 8,432,062 B2 | 4/2013 | Greene et al. |
| 8,432,071 B2 | 4/2013 | Huang et al. |
| 8,446,248 B2 | 5/2013 | Zeine |
| 8,447,234 B2 | 5/2013 | Cook et al. |
| 8,451,189 B1 | 5/2013 | Fluhler |
| 8,452,235 B2 | 5/2013 | Kirby et al. |
| 8,457,656 B2 | 6/2013 | Perkins et al. |
| 8,461,817 B2 | 6/2013 | Martin et al. |
| 8,467,733 B2 | 6/2013 | Leabman |
| 8,497,601 B2 | 7/2013 | Hall et al. |
| 8,497,658 B2 | 7/2013 | Von Novak et al. |
| 8,552,597 B2 | 8/2013 | Song et al. |

(56) References Cited

U.S. PATENT DOCUMENTS

| | | |
|---|---|---|
| 8,558,661 B2 | 10/2013 | Zeine |
| 8,560,026 B2 | 10/2013 | Chanterac |
| 8,564,485 B2 | 10/2013 | Milosavljevic et al. |
| 8,604,746 B2 | 12/2013 | Lee |
| 8,614,643 B2 | 12/2013 | Leabman |
| 8,621,245 B2 | 12/2013 | Shearer et al. |
| 8,626,249 B2 | 1/2014 | Kuusilinna et al. |
| 8,629,576 B2 | 1/2014 | Levine |
| 8,653,966 B2 | 2/2014 | Rao et al. |
| 8,674,551 B2 | 3/2014 | Low et al. |
| 8,686,685 B2 | 4/2014 | Moshfeghi |
| 8,686,905 B2 | 4/2014 | Shtrom |
| 8,712,355 B2 | 4/2014 | Black et al. |
| 8,712,485 B2 | 4/2014 | Tam |
| 8,718,773 B2 | 5/2014 | Wills et al. |
| 8,729,737 B2 | 5/2014 | Schatz et al. |
| 8,736,228 B1 | 5/2014 | Freed et al. |
| 8,760,113 B2 | 6/2014 | Keating |
| 8,770,482 B2 | 7/2014 | Ackermann et al. |
| 8,772,960 B2 | 7/2014 | Yoshida |
| 8,823,319 B2 | 9/2014 | Von Novak, III et al. |
| 8,832,646 B1 | 9/2014 | Wendling |
| 8,854,176 B2 | 10/2014 | Zeine |
| 8,860,364 B2 | 10/2014 | Low et al. |
| 8,897,770 B1 | 11/2014 | Frolov et al. |
| 8,903,456 B2 | 12/2014 | Chu et al. |
| 8,917,057 B2 | 12/2014 | Hui |
| 8,923,189 B2 | 12/2014 | Leabman |
| 8,928,544 B2 | 1/2015 | Massie et al. |
| 8,937,408 B2 | 1/2015 | Ganem et al. |
| 8,946,940 B2 | 2/2015 | Kim et al. |
| 8,963,486 B2 | 2/2015 | Kirby et al. |
| 8,970,070 B2 | 3/2015 | Sada et al. |
| 8,989,053 B1 | 3/2015 | Skaaksrud et al. |
| 9,000,616 B2 | 4/2015 | Greene et al. |
| 9,001,622 B2 | 4/2015 | Perry |
| 9,006,934 B2 | 4/2015 | Kozakai et al. |
| 9,021,277 B2 | 4/2015 | Shearer et al. |
| 9,030,161 B2 | 5/2015 | Lu et al. |
| 9,059,598 B2 | 6/2015 | Kang et al. |
| 9,059,599 B2 | 6/2015 | Won et al. |
| 9,077,188 B2 | 7/2015 | Moshfeghi |
| 9,083,595 B2 | 7/2015 | Rakib et al. |
| 9,088,216 B2 | 7/2015 | Garrity et al. |
| 9,124,125 B2 | 9/2015 | Leabman et al. |
| 9,130,397 B2 | 9/2015 | Leabman et al. |
| 9,130,602 B2 | 9/2015 | Cook |
| 9,142,998 B2 | 9/2015 | Yu et al. |
| 9,143,000 B2 | 9/2015 | Leabman et al. |
| 9,143,010 B2 | 9/2015 | Urano |
| 9,153,074 B2 | 10/2015 | Zhou et al. |
| 9,178,389 B2 | 11/2015 | Hwang |
| 9,225,196 B2 | 12/2015 | Huang et al. |
| 9,240,469 B2 | 1/2016 | Sun et al. |
| 9,242,411 B2 | 1/2016 | Kritchman et al. |
| 9,244,500 B2 | 1/2016 | Cain et al. |
| 9,252,628 B2 | 2/2016 | Leabman et al. |
| 9,270,344 B2 | 2/2016 | Rosenberg |
| 9,276,329 B2 | 3/2016 | Jones et al. |
| 9,282,582 B1 | 3/2016 | Dunsbergen et al. |
| 9,294,840 B1 | 3/2016 | Anderson et al. |
| 9,297,896 B1 | 3/2016 | Andrews |
| 9,318,898 B2 | 4/2016 | John |
| 9,368,020 B1 | 6/2016 | Bell et al. |
| 9,401,977 B1 | 7/2016 | Gaw |
| 9,409,490 B2 | 8/2016 | Kawashima |
| 9,419,335 B2 | 8/2016 | Pintos |
| 9,438,045 B1 | 9/2016 | Leabman |
| 9,438,046 B1 | 9/2016 | Leabman |
| 9,444,283 B2 | 9/2016 | Son et al. |
| 9,450,449 B1 | 9/2016 | Leabman et al. |
| 9,461,502 B2 | 10/2016 | Lee et al. |
| 9,520,725 B2 | 12/2016 | Masaoka et al. |
| 9,520,748 B2 | 12/2016 | Hyde et al. |
| 9,522,270 B2 | 12/2016 | Perryman et al. |
| 9,532,748 B2 | 1/2017 | Denison et al. |
| 9,537,354 B2 | 1/2017 | Bell et al. |
| 9,537,357 B2 | 1/2017 | Leabman |
| 9,537,358 B2 | 1/2017 | Leabman |
| 9,538,382 B2 | 1/2017 | Bell et al. |
| 9,544,640 B2 | 1/2017 | Lau |
| 9,559,553 B2 | 1/2017 | Bae |
| 9,564,773 B2 | 2/2017 | Pogorelik et al. |
| 9,571,974 B2 | 2/2017 | Choi et al. |
| 9,590,317 B2 | 3/2017 | Zimmerman et al. |
| 9,590,444 B2 | 3/2017 | Walley |
| 9,620,996 B2 | 4/2017 | Zeine |
| 9,647,328 B2 | 5/2017 | Dobric |
| 9,706,137 B2 | 7/2017 | Scanlon et al. |
| 9,711,999 B2 | 7/2017 | Hietala et al. |
| 9,723,635 B2 | 8/2017 | Nambord et al. |
| 9,793,758 B2 | 10/2017 | Leabman |
| 9,793,764 B2 | 10/2017 | Perry |
| 9,800,172 B1 | 10/2017 | Leabman |
| 9,806,564 B2 | 10/2017 | Leabman |
| 9,819,230 B2 | 11/2017 | Petras et al. |
| 9,825,674 B1 | 11/2017 | Leabman |
| 9,843,229 B2 | 12/2017 | Leabman |
| 9,847,669 B2 | 12/2017 | Leabman |
| 9,847,677 B1 | 12/2017 | Leabman |
| 9,853,361 B2 | 12/2017 | Chen et al. |
| 9,853,692 B1 | 12/2017 | Bell et al. |
| 9,859,758 B1 | 1/2018 | Leabman |
| 9,866,279 B2 | 1/2018 | Bell et al. |
| 9,867,032 B2 | 1/2018 | Verma et al. |
| 9,871,301 B2 | 1/2018 | Contopanagos |
| 9,876,380 B1 | 1/2018 | Leabman et al. |
| 9,876,394 B1 | 1/2018 | Leabman |
| 9,876,536 B1 | 1/2018 | Bell et al. |
| 9,882,394 B1 | 1/2018 | Bell et al. |
| 9,887,584 B1 | 2/2018 | Bell et al. |
| 9,893,555 B1 | 2/2018 | Leabman et al. |
| 9,893,564 B2 | 2/2018 | de Rochemont |
| 9,899,744 B1 | 2/2018 | Contopanagos et al. |
| 9,899,844 B1 | 2/2018 | Bell et al. |
| 9,899,861 B1 | 2/2018 | Leabman et al. |
| 9,906,275 B2 | 2/2018 | Leabman |
| 9,916,485 B1 | 3/2018 | Lilly et al. |
| 9,917,477 B1 | 3/2018 | Bell et al. |
| 9,923,386 B1 | 3/2018 | Leabman et al. |
| 9,939,864 B1 | 4/2018 | Bell et al. |
| 9,948,135 B2 | 4/2018 | Leabman et al. |
| 9,965,009 B1 | 5/2018 | Bell et al. |
| 9,966,765 B1 | 5/2018 | Leabman |
| 9,966,784 B2 | 5/2018 | Leabman |
| 9,967,743 B1 | 5/2018 | Bell et al. |
| 9,973,008 B1 | 5/2018 | Leabman |
| 10,003,211 B1 | 6/2018 | Leabman et al. |
| 10,008,777 B1 | 6/2018 | Broyde et al. |
| 10,008,875 B1 | 6/2018 | Leabman |
| 10,014,728 B1 | 7/2018 | Leabman |
| 10,020,678 B1 | 7/2018 | Leabman |
| 10,027,159 B2 | 7/2018 | Hosseini |
| 10,027,168 B2 | 7/2018 | Leabman |
| 10,033,222 B1 | 7/2018 | Leabman |
| 10,038,337 B1 | 7/2018 | Leabman et al. |
| 10,050,462 B1 | 8/2018 | Leabman et al. |
| 10,050,470 B1 | 8/2018 | Leabman |
| 10,056,782 B1 | 8/2018 | Leabman |
| 10,063,064 B1 | 8/2018 | Bell et al. |
| 10,068,703 B1 | 9/2018 | Contopanagos |
| 10,075,008 B1 | 9/2018 | Bell et al. |
| 10,090,699 B1 | 10/2018 | Leabman |
| 10,090,714 B2 | 10/2018 | Bohn et al. |
| 10,090,886 B1 | 10/2018 | Bell et al. |
| 10,103,552 B1 | 10/2018 | Leabman et al. |
| 10,103,582 B1 | 10/2018 | Leabman et al. |
| 10,110,046 B1 | 10/2018 | Esquibel et al. |
| 10,122,219 B1 | 11/2018 | Hosseini et al. |
| 10,124,754 B1 | 11/2018 | Leabman |
| 10,128,686 B1 | 11/2018 | Leabman et al. |
| 10,134,260 B1 | 11/2018 | Bell et al. |
| 10,135,112 B1 | 11/2018 | Hosseini |
| 10,135,294 B1 | 11/2018 | Leabman |

(56) References Cited

U.S. PATENT DOCUMENTS

| | | |
|---|---|---|
| 10,135,295 B2 | 11/2018 | Leabman |
| 10,141,771 B1 | 11/2018 | Hosseini et al. |
| 10,148,097 B1 | 12/2018 | Leabman et al. |
| 10,153,645 B1 | 12/2018 | Bell et al. |
| 10,153,653 B1 | 12/2018 | Bell et al. |
| 10,153,660 B1 | 12/2018 | Leabman et al. |
| 10,158,257 B2 | 12/2018 | Leabman |
| 10,158,259 B1 | 12/2018 | Leabman |
| 10,164,478 B2 | 12/2018 | Leabman |
| 10,170,917 B1 | 1/2019 | Bell et al. |
| 10,181,756 B2 | 1/2019 | Bae et al. |
| 10,186,892 B2 | 1/2019 | Hosseini et al. |
| 10,193,396 B1 | 1/2019 | Bell et al. |
| 10,199,835 B2 | 2/2019 | Bell |
| 10,199,849 B1 | 2/2019 | Bell |
| 10,199,850 B2 | 2/2019 | Leabman |
| 10,205,239 B1 | 2/2019 | Contopanagos et al. |
| 10,211,674 B1 | 2/2019 | Leabman et al. |
| 10,223,717 B1 | 3/2019 | Bell |
| 10,224,758 B2 | 3/2019 | Leabman et al. |
| 10,224,982 B1 | 3/2019 | Leabman |
| 10,230,266 B1 | 3/2019 | Leabman et al. |
| 10,243,414 B1 | 3/2019 | Leabman et al. |
| 10,256,657 B2 | 4/2019 | Hosseini et al. |
| 10,256,677 B2 | 4/2019 | Hosseini et al. |
| 10,263,432 B1 | 4/2019 | Leabman et al. |
| 10,291,055 B1 | 5/2019 | Bell et al. |
| 10,291,066 B1 | 5/2019 | Leabman |
| 10,291,294 B2 | 5/2019 | Leabman |
| 10,298,024 B2 | 5/2019 | Leabman |
| 10,298,133 B2 | 5/2019 | Leabman |
| 10,305,315 B2 | 5/2019 | Leabman et al. |
| 10,312,715 B2 | 6/2019 | Leabman |
| 10,333,332 B1 | 6/2019 | Hosseini |
| 10,396,588 B2 | 8/2019 | Leabman |
| 10,490,346 B2 | 11/2019 | Contopanagos |
| 10,491,029 B2 | 11/2019 | Hosseini |
| 10,498,144 B2 | 12/2019 | Leabman et al. |
| 10,511,097 B2 | 12/2019 | Kornaros et al. |
| 10,516,301 B2 | 12/2019 | Leabman |
| 10,523,033 B2 | 12/2019 | Leabman |
| 10,523,058 B2 | 12/2019 | Leabman |
| 10,615,647 B2 | 4/2020 | Johnston et al. |
| 10,714,984 B2 | 7/2020 | Hosseini et al. |
| 10,923,954 B2 * | 2/2021 | Leabman ............... H03F 1/3223 |
| 10,985,617 B1 | 4/2021 | Jolinston et al. |
| 2001/0027876 A1 | 10/2001 | Tsukamoto et al. |
| 2002/0001307 A1 | 1/2002 | Nguyen et al. |
| 2002/0024471 A1 | 2/2002 | Ishitobi |
| 2002/0028655 A1 | 3/2002 | Rosener et al. |
| 2002/0034958 A1 | 3/2002 | Oberschmidt et al. |
| 2002/0054330 A1 | 5/2002 | Jinbo et al. |
| 2002/0065052 A1 | 5/2002 | Pande et al. |
| 2002/0072784 A1 | 6/2002 | Sheppard et al. |
| 2002/0095980 A1 | 7/2002 | Breed et al. |
| 2002/0103447 A1 | 8/2002 | Terry |
| 2002/0123776 A1 | 9/2002 | Von Arx |
| 2002/0133592 A1 | 9/2002 | Matsuda |
| 2002/0171594 A1 | 11/2002 | Fang |
| 2002/0172223 A1 | 11/2002 | Stilp |
| 2003/0005759 A1 | 1/2003 | Breed et al. |
| 2003/0038750 A1 | 2/2003 | Chen |
| 2003/0058187 A1 | 3/2003 | Billiet et al. |
| 2003/0076274 A1 | 4/2003 | Phelan et al. |
| 2003/0179152 A1 | 9/2003 | Watada et al. |
| 2003/0179573 A1 | 9/2003 | Chun |
| 2003/0192053 A1 | 10/2003 | Sheppard et al. |
| 2004/0019624 A1 | 1/2004 | Sukegawa |
| 2004/0020100 A1 | 2/2004 | O'Brian et al. |
| 2004/0036657 A1 | 2/2004 | Forster et al. |
| 2004/0066251 A1 | 4/2004 | Eleftheriades et al. |
| 2004/0107641 A1 | 6/2004 | Walton et al. |
| 2004/0113543 A1 | 6/2004 | Daniels |
| 2004/0119675 A1 | 6/2004 | Washio et al. |
| 2004/0130425 A1 | 7/2004 | Dayan et al. |
| 2004/0130442 A1 | 7/2004 | Breed |
| 2004/0142733 A1 | 7/2004 | Parise |
| 2004/0145342 A1 | 7/2004 | Lyon |
| 2004/0155832 A1 | 8/2004 | Yuanzhu |
| 2004/0196190 A1 | 10/2004 | Mendolia et al. |
| 2004/0203979 A1 | 10/2004 | Attar et al. |
| 2004/0207559 A1 | 10/2004 | Milosavljevic |
| 2004/0218759 A1 | 11/2004 | Yacobi |
| 2004/0241402 A1 | 12/2004 | Kawate |
| 2004/0259604 A1 | 12/2004 | Mickle et al. |
| 2004/0263124 A1 | 12/2004 | Wieck et al. |
| 2005/0007276 A1 | 1/2005 | Barrick et al. |
| 2005/0030118 A1 | 2/2005 | Wang |
| 2005/0046584 A1 | 3/2005 | Breed |
| 2005/0055316 A1 | 3/2005 | Williams |
| 2005/0077872 A1 | 4/2005 | Single |
| 2005/0093766 A1 | 5/2005 | Turner |
| 2005/0116683 A1 | 6/2005 | Cheng |
| 2005/0117660 A1 | 6/2005 | Vialle et al. |
| 2005/0134517 A1 | 6/2005 | Gotti |
| 2005/0171411 A1 | 8/2005 | KenKnight |
| 2005/0198673 A1 | 9/2005 | Kit et al. |
| 2005/0227619 A1 | 10/2005 | Lee et al. |
| 2005/0232469 A1 | 10/2005 | Schofield |
| 2005/0237249 A1 | 10/2005 | Nagel |
| 2005/0237258 A1 | 10/2005 | Abramov et al. |
| 2005/0282591 A1 | 12/2005 | Shaff |
| 2006/0013335 A1 | 1/2006 | Leabman |
| 2006/0019712 A1 | 1/2006 | Choi |
| 2006/0030279 A1 | 2/2006 | Leabman et al. |
| 2006/0033674 A1 | 2/2006 | Essig, Jr. et al. |
| 2006/0056855 A1 | 3/2006 | Nakagawa et al. |
| 2006/0071308 A1 | 4/2006 | Tang et al. |
| 2006/0092079 A1 | 5/2006 | de Rochemont |
| 2006/0094425 A1 | 5/2006 | Mickle et al. |
| 2006/0113955 A1 | 6/2006 | Nunally |
| 2006/0119532 A1 | 6/2006 | Yun et al. |
| 2006/0136004 A1 | 6/2006 | Cowan et al. |
| 2006/0160517 A1 | 7/2006 | Yoon |
| 2006/0183473 A1 | 8/2006 | Ukon |
| 2006/0190063 A1 | 8/2006 | Kanzius |
| 2006/0192913 A1 | 8/2006 | Shutou et al. |
| 2006/0199620 A1 | 9/2006 | Greene et al. |
| 2006/0238365 A1 | 10/2006 | Vecchione et al. |
| 2006/0266564 A1 | 11/2006 | Perlman et al. |
| 2006/0266917 A1 | 11/2006 | Baldis et al. |
| 2006/0278706 A1 | 12/2006 | Hatakayama et al. |
| 2006/0284593 A1 | 12/2006 | Nagy et al. |
| 2006/0287094 A1 | 12/2006 | Mahaffey et al. |
| 2007/0007821 A1 | 1/2007 | Rossetti |
| 2007/0019693 A1 | 1/2007 | Graham |
| 2007/0021140 A1 | 1/2007 | Keyes |
| 2007/0060185 A1 | 3/2007 | Simon et al. |
| 2007/0070490 A1 | 3/2007 | Tsunoda et al. |
| 2007/0090997 A1 | 4/2007 | Brown et al. |
| 2007/0093269 A1 | 4/2007 | Leabman et al. |
| 2007/0097653 A1 | 5/2007 | Gilliland et al. |
| 2007/0103110 A1 | 5/2007 | Sagoo |
| 2007/0106894 A1 | 5/2007 | Zhang |
| 2007/0109121 A1 | 5/2007 | Cohen |
| 2007/0139000 A1 | 6/2007 | Kozuma |
| 2007/0149162 A1 | 6/2007 | Greene et al. |
| 2007/0164868 A1 | 7/2007 | Deavours et al. |
| 2007/0173196 A1 | 7/2007 | Gallic |
| 2007/0173214 A1 | 7/2007 | Mickle et al. |
| 2007/0178857 A1 | 8/2007 | Greene et al. |
| 2007/0178945 A1 | 8/2007 | Cook et al. |
| 2007/0182367 A1 | 8/2007 | Partovi |
| 2007/0191074 A1 | 8/2007 | Harrist et al. |
| 2007/0191075 A1 | 8/2007 | Greene et al. |
| 2007/0197281 A1 | 8/2007 | Stronach |
| 2007/0210960 A1 | 9/2007 | Rofougaran et al. |
| 2007/0222681 A1 | 9/2007 | Greene et al. |
| 2007/0228833 A1 | 10/2007 | Stevens et al. |
| 2007/0229261 A1 | 10/2007 | Zimmerman et al. |
| 2007/0240297 A1 | 10/2007 | Yang et al. |
| 2007/0257634 A1 | 11/2007 | Leschin et al. |
| 2007/0273486 A1 | 11/2007 | Shiotsu |
| 2007/0291165 A1 | 12/2007 | Wang |

(56) References Cited

U.S. PATENT DOCUMENTS

| | | |
|---|---|---|
| 2007/0296639 A1 | 12/2007 | Hook et al. |
| 2007/0298846 A1 | 12/2007 | Greene et al. |
| 2008/0014897 A1 | 1/2008 | Cook et al. |
| 2008/0024376 A1 | 1/2008 | Norris et al. |
| 2008/0048917 A1 | 2/2008 | Achour et al. |
| 2008/0062062 A1 | 3/2008 | Borau et al. |
| 2008/0062255 A1 | 3/2008 | Gal |
| 2008/0067874 A1 | 3/2008 | Tseng |
| 2008/0074324 A1 | 3/2008 | Puzella et al. |
| 2008/0089277 A1 | 4/2008 | Alexander et al. |
| 2008/0110263 A1 | 5/2008 | Klessel et al. |
| 2008/0113816 A1 | 5/2008 | Mahaffey et al. |
| 2008/0122297 A1 | 5/2008 | Arai |
| 2008/0123383 A1 | 5/2008 | Shionoiri |
| 2008/0129536 A1 | 6/2008 | Randall et al. |
| 2008/0140278 A1 | 6/2008 | Breed |
| 2008/0169910 A1 | 7/2008 | Greene et al. |
| 2008/0197802 A1 | 8/2008 | Onishi |
| 2008/0204342 A1 | 8/2008 | Kharadly |
| 2008/0204350 A1 | 8/2008 | Tam et al. |
| 2008/0210762 A1 | 9/2008 | Osada et al. |
| 2008/0211458 A1 | 9/2008 | Lawther et al. |
| 2008/0233890 A1 | 9/2008 | Baker |
| 2008/0248758 A1 | 10/2008 | Schedelbeck et al. |
| 2008/0248846 A1 | 10/2008 | Stronach et al. |
| 2008/0258993 A1 | 10/2008 | Gummalla et al. |
| 2008/0266191 A1 | 10/2008 | Hilgers |
| 2008/0278378 A1 | 11/2008 | Chang et al. |
| 2008/0309452 A1 | 12/2008 | Zeine |
| 2009/0002493 A1 | 1/2009 | Kates |
| 2009/0010316 A1 | 1/2009 | Rofougaran et al. |
| 2009/0019183 A1 | 1/2009 | Wu et al. |
| 2009/0036065 A1 | 2/2009 | Siu |
| 2009/0039828 A1 | 2/2009 | Jakubowski |
| 2009/0047998 A1 | 2/2009 | Alberth, Jr. |
| 2009/0058354 A1 | 3/2009 | Harrison |
| 2009/0058361 A1 | 3/2009 | John |
| 2009/0058731 A1 | 3/2009 | Geary et al. |
| 2009/0060012 A1 | 3/2009 | Gresset et al. |
| 2009/0067198 A1 | 3/2009 | Graham et al. |
| 2009/0067208 A1 | 3/2009 | Martin et al. |
| 2009/0073066 A1 | 3/2009 | Jordon et al. |
| 2009/0096412 A1 | 4/2009 | Huang |
| 2009/0096413 A1 | 4/2009 | Partovi |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0122847 A1 | 5/2009 | Nysen et al. |
| 2009/0128262 A1 | 5/2009 | Lee et al. |
| 2009/0157911 A1 | 6/2009 | Aihara |
| 2009/0174604 A1 | 7/2009 | Keskitalo |
| 2009/0180653 A1 | 7/2009 | Sjursen et al. |
| 2009/0200985 A1 | 8/2009 | Zane et al. |
| 2009/0206791 A1 | 8/2009 | Jung |
| 2009/0207090 A1 | 8/2009 | Pettus et al. |
| 2009/0207092 A1 | 8/2009 | Nysen et al. |
| 2009/0218884 A1 | 9/2009 | Soar |
| 2009/0218891 A1 | 9/2009 | McCollough |
| 2009/0219903 A1 | 9/2009 | Alamouti et al. |
| 2009/0243397 A1 | 10/2009 | Cook et al. |
| 2009/0256752 A1 | 10/2009 | Akkermans et al. |
| 2009/0264069 A1 | 10/2009 | Yamasuge |
| 2009/0271048 A1 | 10/2009 | Wakamatsu |
| 2009/0280866 A1 | 11/2009 | Lo et al. |
| 2009/0281678 A1 | 11/2009 | Wakamatsu |
| 2009/0284082 A1 | 11/2009 | Mohammadian |
| 2009/0284083 A1 | 11/2009 | Karalis et al. |
| 2009/0284220 A1 | 11/2009 | Toncich et al. |
| 2009/0284227 A1 | 11/2009 | Mohammadian et al. |
| 2009/0284325 A1 | 11/2009 | Rossiter et al. |
| 2009/0286475 A1 | 11/2009 | Toncich et al. |
| 2009/0286476 A1 | 11/2009 | Toncich et al. |
| 2009/0291634 A1 | 11/2009 | Saarisalo |
| 2009/0299175 A1 | 12/2009 | Bernstein et al. |
| 2009/0308936 A1 | 12/2009 | Nitzan et al. |
| 2009/0312046 A1 | 12/2009 | Clevenger et al. |
| 2009/0315412 A1 | 12/2009 | Yamamoto et al. |
| 2009/0322281 A1 | 12/2009 | Kamijo et al. |
| 2010/0001683 A1 | 1/2010 | Huang et al. |
| 2010/0007307 A1 | 1/2010 | Baarman et al. |
| 2010/0007569 A1 | 1/2010 | Sim et al. |
| 2010/0019686 A1 | 1/2010 | Gutierrez, Jr. |
| 2010/0019908 A1 | 1/2010 | Cho et al. |
| 2010/0026605 A1 | 2/2010 | Yang et al. |
| 2010/0027379 A1 | 2/2010 | Saulnier et al. |
| 2010/0029383 A1 | 2/2010 | Dai |
| 2010/0033021 A1 | 2/2010 | Bennett |
| 2010/0033390 A1 | 2/2010 | Alamouti et al. |
| 2010/0034238 A1 | 2/2010 | Bennett |
| 2010/0041453 A1 | 2/2010 | Grimm, Jr. |
| 2010/0044123 A1 | 2/2010 | Perlman et al. |
| 2010/0054200 A1 | 3/2010 | Tsai |
| 2010/0060534 A1 | 3/2010 | Oodachi |
| 2010/0066631 A1 | 3/2010 | Puzella et al. |
| 2010/0075607 A1 | 3/2010 | Hosoya |
| 2010/0079005 A1 | 4/2010 | Hyde et al. |
| 2010/0079011 A1 | 4/2010 | Hyde et al. |
| 2010/0082193 A1 | 4/2010 | Chiappetta |
| 2010/0087227 A1 | 4/2010 | Francos et al. |
| 2010/0090524 A1 | 4/2010 | Obayashi |
| 2010/0090656 A1 | 4/2010 | Shearer et al. |
| 2010/0109443 A1 | 5/2010 | Cook et al. |
| 2010/0117596 A1 | 5/2010 | Cook et al. |
| 2010/0117926 A1 | 5/2010 | DeJean, II |
| 2010/0119234 A1 | 5/2010 | Suematsu et al. |
| 2010/0123618 A1 | 5/2010 | Martin et al. |
| 2010/0123624 A1 | 5/2010 | Minear et al. |
| 2010/0124040 A1 | 5/2010 | Diebel et al. |
| 2010/0127660 A1 | 5/2010 | Cook et al. |
| 2010/0142418 A1 | 6/2010 | Nishioka et al. |
| 2010/0142509 A1 | 6/2010 | Zhu et al. |
| 2010/0148723 A1 | 6/2010 | Cook et al. |
| 2010/0151808 A1 | 6/2010 | Toncich et al. |
| 2010/0156721 A1 | 6/2010 | Alamouti et al. |
| 2010/0156741 A1 | 6/2010 | Vazquez et al. |
| 2010/0164296 A1 | 7/2010 | Kurs et al. |
| 2010/0164433 A1 | 7/2010 | Janefalker et al. |
| 2010/0167664 A1 | 7/2010 | Szini |
| 2010/0171461 A1 | 7/2010 | Baarman et al. |
| 2010/0171676 A1 | 7/2010 | Tani et al. |
| 2010/0174629 A1 | 7/2010 | Taylor et al. |
| 2010/0176934 A1 | 7/2010 | Chou et al. |
| 2010/0181961 A1 | 7/2010 | Novak et al. |
| 2010/0181964 A1 | 7/2010 | Huggins et al. |
| 2010/0194206 A1 | 8/2010 | Burdo et al. |
| 2010/0201189 A1 | 8/2010 | Kirby et al. |
| 2010/0201201 A1 | 8/2010 | Mobarhan et al. |
| 2010/0201314 A1 | 8/2010 | Toncich et al. |
| 2010/0207572 A1 | 8/2010 | Kirby et al. |
| 2010/0210233 A1 | 8/2010 | Cook et al. |
| 2010/0213895 A1 | 8/2010 | Keating et al. |
| 2010/0214177 A1 | 8/2010 | Parsche |
| 2010/0222010 A1 | 9/2010 | Ozaki et al. |
| 2010/0225270 A1 | 9/2010 | Jacobs et al. |
| 2010/0227570 A1 | 9/2010 | Hendin |
| 2010/0231470 A1 | 9/2010 | Lee et al. |
| 2010/0237709 A1 | 9/2010 | Hall et al. |
| 2010/0244576 A1 | 9/2010 | Hillan et al. |
| 2010/0253281 A1 | 10/2010 | Li |
| 2010/0256831 A1 | 10/2010 | Abramo et al. |
| 2010/0259110 A1 | 10/2010 | Kurs et al. |
| 2010/0259447 A1 | 10/2010 | Crouch |
| 2010/0264747 A1 | 10/2010 | Hall et al. |
| 2010/0277003 A1 | 11/2010 | Von Novak et al. |
| 2010/0277121 A1 | 11/2010 | Hall et al. |
| 2010/0279606 A1 | 11/2010 | Hillan et al. |
| 2010/0289341 A1 | 11/2010 | Ozaki et al. |
| 2010/0295372 A1 | 11/2010 | Hyde et al. |
| 2010/0308767 A1 | 12/2010 | Rofougaran et al. |
| 2010/0309079 A1 | 12/2010 | Rofougaran et al. |
| 2010/0309088 A1 | 12/2010 | Hyvonen et al. |
| 2010/0315045 A1 | 12/2010 | Zeine |
| 2010/0316163 A1 | 12/2010 | Forenza et al. |
| 2010/0327766 A1 | 12/2010 | Recker et al. |

(56) References Cited

U.S. PATENT DOCUMENTS

| | | |
|---|---|---|
| 2010/0328044 A1 | 12/2010 | Waffenschmidt et al. |
| 2010/0332401 A1 | 12/2010 | Prahlad et al. |
| 2011/0013198 A1 | 1/2011 | Shirley |
| 2011/0018360 A1 | 1/2011 | Baarman et al. |
| 2011/0028114 A1 | 2/2011 | Kerselaers |
| 2011/0031928 A1 | 2/2011 | Soar |
| 2011/0032149 A1 | 2/2011 | Leabman |
| 2011/0032866 A1 | 2/2011 | Leabman |
| 2011/0034190 A1 | 2/2011 | Leabman |
| 2011/0034191 A1 | 2/2011 | Leabman |
| 2011/0043047 A1 | 2/2011 | Karalis et al. |
| 2011/0043163 A1 | 2/2011 | Baarman et al. |
| 2011/0043327 A1 | 2/2011 | Baarman et al. |
| 2011/0050166 A1 | 3/2011 | Cook et al. |
| 2011/0055037 A1 | 3/2011 | Hayashigawa et al. |
| 2011/0056215 A1 | 3/2011 | Ham |
| 2011/0057607 A1 | 3/2011 | Carobolante |
| 2011/0057853 A1 | 3/2011 | Kim et al. |
| 2011/0062788 A1 | 3/2011 | Chen et al. |
| 2011/0074342 A1 | 3/2011 | MacLaughlin |
| 2011/0074349 A1 | 3/2011 | Ghovanloo |
| 2011/0074620 A1 | 3/2011 | Wintermantel |
| 2011/0078092 A1 | 3/2011 | Kim et al. |
| 2011/0090126 A1 | 4/2011 | Szini et al. |
| 2011/0109167 A1 | 5/2011 | Park et al. |
| 2011/0114401 A1 | 5/2011 | Kanno |
| 2011/0115303 A1 | 5/2011 | Baarman et al. |
| 2011/0115432 A1 | 5/2011 | El-Maleh |
| 2011/0115605 A1 | 5/2011 | Dimig et al. |
| 2011/0121660 A1 | 5/2011 | Azancot et al. |
| 2011/0122018 A1 | 5/2011 | Tarng et al. |
| 2011/0122026 A1 | 5/2011 | DeLaquil et al. |
| 2011/0127845 A1 | 6/2011 | Walley et al. |
| 2011/0127952 A1 | 6/2011 | Walley et al. |
| 2011/0133655 A1 | 6/2011 | Recker et al. |
| 2011/0133691 A1 | 6/2011 | Hautanen |
| 2011/0148578 A1 | 6/2011 | Aioi et al. |
| 2011/0148595 A1 | 6/2011 | Miller et al. |
| 2011/0151789 A1 | 6/2011 | Viglione et al. |
| 2011/0154429 A1 | 6/2011 | Stantchev |
| 2011/0156493 A1 | 6/2011 | Bennett |
| 2011/0156494 A1 | 6/2011 | Mashinsky |
| 2011/0156640 A1 | 6/2011 | Moshfeghi |
| 2011/0163128 A1 | 7/2011 | Taguchi et al. |
| 2011/0175455 A1 | 7/2011 | Hashiguchi |
| 2011/0175461 A1 | 7/2011 | Tinaphong |
| 2011/0181120 A1 | 7/2011 | Liu et al. |
| 2011/0182245 A1 | 7/2011 | Malkamaki et al. |
| 2011/0184842 A1 | 7/2011 | Melen |
| 2011/0188207 A1 | 8/2011 | Won et al. |
| 2011/0193688 A1 | 8/2011 | Forsell |
| 2011/0194543 A1 | 8/2011 | Zhao et al. |
| 2011/0195722 A1 | 8/2011 | Walter et al. |
| 2011/0199046 A1 | 8/2011 | Tsai et al. |
| 2011/0215086 A1 | 9/2011 | Yeh |
| 2011/0217923 A1 | 9/2011 | Ma |
| 2011/0220634 A1 | 9/2011 | Yeh |
| 2011/0221389 A1 | 9/2011 | Won et al. |
| 2011/0222272 A1 | 9/2011 | Yeh |
| 2011/0227725 A1 | 9/2011 | Muirhead |
| 2011/0243040 A1 | 10/2011 | Khan et al. |
| 2011/0243050 A1 | 10/2011 | Yanover |
| 2011/0244913 A1 | 10/2011 | Kim et al. |
| 2011/0248573 A1 | 10/2011 | Kanno et al. |
| 2011/0248575 A1 | 10/2011 | Kim et al. |
| 2011/0249678 A1 | 10/2011 | Bonicatto |
| 2011/0254377 A1 | 10/2011 | Widmer et al. |
| 2011/0254503 A1 | 10/2011 | Widmer et al. |
| 2011/0259953 A1 | 10/2011 | Baarman et al. |
| 2011/0273977 A1 | 11/2011 | Shapira et al. |
| 2011/0278941 A1 | 11/2011 | Krishna et al. |
| 2011/0279226 A1 | 11/2011 | Chen et al. |
| 2011/0281535 A1 | 11/2011 | Low et al. |
| 2011/0282415 A1 | 11/2011 | Eckhoff et al. |
| 2011/0285213 A1 | 11/2011 | Kowalewski |
| 2011/0286374 A1 | 11/2011 | Shin et al. |
| 2011/0291489 A1 | 12/2011 | Tsai et al. |
| 2011/0302078 A1 | 12/2011 | Failing |
| 2011/0304216 A1 | 12/2011 | Baarman |
| 2011/0304437 A1 | 12/2011 | Beeler |
| 2011/0304521 A1 | 12/2011 | Ando et al. |
| 2012/0007441 A1 | 1/2012 | John |
| 2012/0013196 A1 | 1/2012 | Kim et al. |
| 2012/0013198 A1 | 1/2012 | Uramoto et al. |
| 2012/0013296 A1 | 1/2012 | Heydari et al. |
| 2012/0019419 A1 | 1/2012 | Prat et al. |
| 2012/0025622 A1 | 2/2012 | Kim et al. |
| 2012/0043887 A1 | 2/2012 | Mesibov |
| 2012/0051109 A1 | 3/2012 | Kim et al. |
| 2012/0051294 A1 | 3/2012 | Guillouard |
| 2012/0056486 A1 | 3/2012 | Endo et al. |
| 2012/0056741 A1 | 3/2012 | Zhu et al. |
| 2012/0068906 A1 | 3/2012 | Asher et al. |
| 2012/0074891 A1 | 3/2012 | Anderson et al. |
| 2012/0075072 A1 | 3/2012 | Pappu |
| 2012/0080944 A1 | 4/2012 | Recker et al. |
| 2012/0080957 A1 | 4/2012 | Cooper et al. |
| 2012/0086284 A1 | 4/2012 | Capanella et al. |
| 2012/0086615 A1 | 4/2012 | Norair |
| 2012/0095617 A1 | 4/2012 | Martin et al. |
| 2012/0098350 A1 | 4/2012 | Campanella et al. |
| 2012/0098485 A1 | 4/2012 | Kang et al. |
| 2012/0099675 A1 | 4/2012 | Kitamura et al. |
| 2012/0103562 A1 | 5/2012 | Clayton |
| 2012/0104849 A1 | 5/2012 | Jackson |
| 2012/0105252 A1 | 5/2012 | Wang |
| 2012/0112532 A1 | 5/2012 | Kesler et al. |
| 2012/0119914 A1 | 5/2012 | Uchida |
| 2012/0126743 A1 | 5/2012 | Rivers, Jr. |
| 2012/0132647 A1 | 5/2012 | Beverly et al. |
| 2012/0133214 A1 | 5/2012 | Yun et al. |
| 2012/0142291 A1 | 6/2012 | Rath et al. |
| 2012/0146426 A1 | 6/2012 | Sabo |
| 2012/0146576 A1 | 6/2012 | Partovi |
| 2012/0146577 A1 | 6/2012 | Tanabe |
| 2012/0147802 A1 | 6/2012 | Ukita et al. |
| 2012/0149307 A1 | 6/2012 | Terada et al. |
| 2012/0150670 A1 | 6/2012 | Taylor et al. |
| 2012/0153894 A1 | 6/2012 | Widmer et al. |
| 2012/0157019 A1 | 6/2012 | Li |
| 2012/0161531 A1 | 6/2012 | Kim et al. |
| 2012/0161544 A1 | 6/2012 | Kashiwagi et al. |
| 2012/0169276 A1 | 7/2012 | Wang |
| 2012/0169278 A1 | 7/2012 | Choi |
| 2012/0173418 A1 | 7/2012 | Beardsmore et al. |
| 2012/0179004 A1 | 7/2012 | Roesicke et al. |
| 2012/0181973 A1 | 7/2012 | Lyden |
| 2012/0182427 A1 | 7/2012 | Marshall |
| 2012/0188142 A1 | 7/2012 | Shashi et al. |
| 2012/0187851 A1 | 8/2012 | Huggins et al. |
| 2012/0193999 A1 | 8/2012 | Zeine |
| 2012/0200399 A1 | 8/2012 | Chae |
| 2012/0201153 A1 | 8/2012 | Bharadia et al. |
| 2012/0201173 A1 | 8/2012 | Jian et al. |
| 2012/0206299 A1 | 8/2012 | Valdes-Garcia |
| 2012/0211214 A1 | 8/2012 | Phan |
| 2012/0212071 A1 | 8/2012 | Miyabayashi et al. |
| 2012/0212072 A1 | 8/2012 | Miyabayashi et al. |
| 2012/0214462 A1 | 8/2012 | Chu et al. |
| 2012/0214536 A1 | 8/2012 | Kim et al. |
| 2012/0228392 A1 | 9/2012 | Cameron et al. |
| 2012/0228956 A1 | 9/2012 | Kamata |
| 2012/0231856 A1 | 9/2012 | Lee et al. |
| 2012/0235636 A1 | 9/2012 | Partovi |
| 2012/0242283 A1 | 9/2012 | Kim et al. |
| 2012/0248886 A1 | 10/2012 | Kesler et al. |
| 2012/0248888 A1 | 10/2012 | Kesler et al. |
| 2012/0248891 A1 | 10/2012 | Drennen |
| 2012/0249051 A1 | 10/2012 | Son et al. |
| 2012/0262002 A1 | 10/2012 | Widmer et al. |
| 2012/0265272 A1 | 10/2012 | Judkins |
| 2012/0267900 A1 | 10/2012 | Huffman et al. |
| 2012/0268238 A1 | 10/2012 | Park et al. |
| 2012/0274154 A1 | 11/2012 | DeLuca |

(56) References Cited

U.S. PATENT DOCUMENTS

| | | |
|---|---|---|
| 2012/0280650 A1 | 11/2012 | Kim et al. |
| 2012/0286582 A1 | 11/2012 | Kim et al. |
| 2012/0292993 A1 | 11/2012 | Mettler et al. |
| 2012/0293021 A1 | 11/2012 | Teggatz et al. |
| 2012/0293119 A1 | 11/2012 | Park et al. |
| 2012/0299389 A1 | 11/2012 | Lee et al. |
| 2012/0299540 A1 | 11/2012 | Perry |
| 2012/0299541 A1 | 11/2012 | Perry |
| 2012/0299542 A1 | 11/2012 | Perry |
| 2012/0300588 A1 | 11/2012 | Perry |
| 2012/0300592 A1 | 11/2012 | Perry |
| 2012/0300593 A1 | 11/2012 | Perry |
| 2012/0306284 A1 | 12/2012 | Lee et al. |
| 2012/0306433 A1 | 12/2012 | Kim et al. |
| 2012/0306572 A1 | 12/2012 | Hietala et al. |
| 2012/0306705 A1 | 12/2012 | Sakurai et al. |
| 2012/0306707 A1 | 12/2012 | Yang et al. |
| 2012/0306720 A1 | 12/2012 | Tanmi et al. |
| 2012/0307873 A1 | 12/2012 | Kim et al. |
| 2012/0309295 A1 | 12/2012 | Maguire |
| 2012/0309308 A1 | 12/2012 | Kim et al. |
| 2012/0309332 A1 | 12/2012 | Liao |
| 2012/0313446 A1 | 12/2012 | Park et al. |
| 2012/0313449 A1 | 12/2012 | Kurs |
| 2012/0313835 A1 | 12/2012 | Gebretnsae |
| 2012/0326660 A1 | 12/2012 | Lu et al. |
| 2013/0002550 A1 | 1/2013 | Zalewski |
| 2013/0005252 A1 | 1/2013 | Lee et al. |
| 2013/0018439 A1 | 1/2013 | Chow et al. |
| 2013/0024059 A1 | 1/2013 | Miller et al. |
| 2013/0026981 A1 | 1/2013 | Van Der Lee |
| 2013/0026982 A1 | 1/2013 | Rothenbaum |
| 2013/0032589 A1 | 2/2013 | Chung |
| 2013/0033571 A1 | 2/2013 | Steen |
| 2013/0038124 A1 | 2/2013 | Newdoll et al. |
| 2013/0038402 A1 | 2/2013 | Karalis et al. |
| 2013/0043738 A1 | 2/2013 | Park et al. |
| 2013/0044035 A1 | 2/2013 | Zhuang |
| 2013/0049471 A1 | 2/2013 | Oleynik |
| 2013/0049475 A1 | 2/2013 | Kim et al. |
| 2013/0049484 A1 | 2/2013 | Weissentern et al. |
| 2013/0057078 A1 | 3/2013 | Lee |
| 2013/0057205 A1 | 3/2013 | Lee et al. |
| 2013/0057210 A1 | 3/2013 | Negaard et al. |
| 2013/0057364 A1 | 3/2013 | Kesler et al. |
| 2013/0058379 A1 | 3/2013 | Kim et al. |
| 2013/0062959 A1 | 3/2013 | Lee et al. |
| 2013/0063082 A1 | 3/2013 | Lee et al. |
| 2013/0063143 A1 | 3/2013 | Adalsteinsson et al. |
| 2013/0063266 A1 | 3/2013 | Yunker et al. |
| 2013/0069444 A1 | 3/2013 | Waffenschmidt et al. |
| 2013/0076308 A1 | 3/2013 | Niskala et al. |
| 2013/0077650 A1 | 3/2013 | Traxler et al. |
| 2013/0078918 A1 | 3/2013 | Crowley et al. |
| 2013/0082651 A1 | 4/2013 | Park et al. |
| 2013/0082653 A1 | 4/2013 | Lee et al. |
| 2013/0083774 A1 | 4/2013 | Son et al. |
| 2013/0088082 A1 | 4/2013 | Kang et al. |
| 2013/0088090 A1 | 4/2013 | Wu |
| 2013/0088192 A1 | 4/2013 | Eaton |
| 2013/0088331 A1 | 4/2013 | Cho |
| 2013/0093388 A1 | 4/2013 | Partovi |
| 2013/0099389 A1 | 4/2013 | Hong et al. |
| 2013/0099586 A1 | 4/2013 | Kato |
| 2013/0106197 A1 | 5/2013 | Bae et al. |
| 2013/0107023 A1 | 5/2013 | Tanaka et al. |
| 2013/0119777 A1 | 5/2013 | Rees |
| 2013/0119778 A1 | 5/2013 | Jung |
| 2013/0119929 A1 | 5/2013 | Partovi |
| 2013/0120052 A1 | 5/2013 | Siska |
| 2013/0120205 A1 | 5/2013 | Thomson et al. |
| 2013/0120206 A1 | 5/2013 | Biancotto et al. |
| 2013/0120217 A1 | 5/2013 | Ueda et al. |
| 2013/0130621 A1 | 5/2013 | Kim et al. |
| 2013/0132010 A1 | 5/2013 | Winger et al. |
| 2013/0134923 A1 | 5/2013 | Smith |
| 2013/0137455 A1 | 5/2013 | Xia |
| 2013/0141037 A1 | 6/2013 | Jenwatanavet et al. |
| 2013/0148341 A1 | 6/2013 | Williams |
| 2013/0149975 A1 | 6/2013 | Yu et al. |
| 2013/0154387 A1 | 6/2013 | Lee et al. |
| 2013/0155748 A1 | 6/2013 | Sundstrom |
| 2013/0157729 A1 | 6/2013 | Tabe |
| 2013/0162335 A1 | 6/2013 | Kim et al. |
| 2013/0169061 A1 | 7/2013 | Microshnichenko et al. |
| 2013/0169219 A1 | 7/2013 | Gray |
| 2013/0169348 A1 | 7/2013 | Shi |
| 2013/0171939 A1 | 7/2013 | Tian et al. |
| 2013/0175877 A1 | 7/2013 | Abe et al. |
| 2013/0178253 A1 | 7/2013 | Karaoguz |
| 2013/0181881 A1 | 7/2013 | Christie et al. |
| 2013/0187475 A1 | 7/2013 | Vendik |
| 2013/0190031 A1 | 7/2013 | Persson et al. |
| 2013/0193769 A1 | 8/2013 | Mehta et al. |
| 2013/0197320 A1 | 8/2013 | Albert et al. |
| 2013/0200064 A1 | 8/2013 | Alexander |
| 2013/0207477 A1 | 8/2013 | Nam et al. |
| 2013/0207604 A1 | 8/2013 | Zeine |
| 2013/0207879 A1 | 8/2013 | Rada et al. |
| 2013/0210357 A1 | 8/2013 | Qin et al. |
| 2013/0221757 A1 | 8/2013 | Cho et al. |
| 2013/0222201 A1 | 8/2013 | Ma et al. |
| 2013/0234530 A1 | 9/2013 | Miyauchi |
| 2013/0234536 A1 | 9/2013 | Chemishkian et al. |
| 2013/0234658 A1 | 9/2013 | Endo et al. |
| 2013/0241306 A1 | 9/2013 | Aber et al. |
| 2013/0241468 A1 | 9/2013 | Moshfeghi |
| 2013/0241474 A1 | 9/2013 | Moshfeghi |
| 2013/0249478 A1 | 9/2013 | Hirano |
| 2013/0249479 A1 | 9/2013 | Partovi |
| 2013/0250102 A1 | 9/2013 | Scanlon et al. |
| 2013/0254578 A1 | 9/2013 | Huang et al. |
| 2013/0264997 A1 | 10/2013 | Lee et al. |
| 2013/0268782 A1 | 10/2013 | Tam et al. |
| 2013/0270923 A1 | 10/2013 | Cook et al. |
| 2013/0278076 A1 | 10/2013 | Proud |
| 2013/0278209 A1 | 10/2013 | Von Novak |
| 2013/0285464 A1 | 10/2013 | Miwa |
| 2013/0285477 A1 | 10/2013 | Lo et al. |
| 2013/0285606 A1 | 10/2013 | Ben-Shalom et al. |
| 2013/0288600 A1 | 10/2013 | Kuusilinna et al. |
| 2013/0288617 A1 | 10/2013 | Kim et al. |
| 2013/0293423 A1 | 11/2013 | Moshfeghi |
| 2013/0307751 A1 | 11/2013 | Yu-Juin et al. |
| 2013/0310020 A1 | 11/2013 | Kazuhiro |
| 2013/0311798 A1 | 11/2013 | Sultenfuss |
| 2013/0328417 A1 | 12/2013 | Takeuchi |
| 2013/0334883 A1 | 12/2013 | Kim et al. |
| 2013/0339108 A1 | 12/2013 | Ryder et al. |
| 2013/0343208 A1 | 12/2013 | Sexton et al. |
| 2013/0343251 A1 | 12/2013 | Zhang |
| 2014/0001846 A1 | 1/2014 | Mosebrook |
| 2014/0001875 A1 | 1/2014 | Nahidipour |
| 2014/0001876 A1 | 1/2014 | Fujiwara et al. |
| 2014/0006017 A1 | 1/2014 | Sen |
| 2014/0008992 A1 | 1/2014 | Leabman |
| 2014/0008993 A1 | 1/2014 | Leabman |
| 2014/0009108 A1 | 1/2014 | Leabman |
| 2014/0009110 A1 | 1/2014 | Lee |
| 2014/0011531 A1 | 1/2014 | Burstrom et al. |
| 2014/0015336 A1 | 1/2014 | Weber et al. |
| 2014/0015344 A1 | 1/2014 | Mohamadi |
| 2014/0021907 A1 | 1/2014 | Yu et al. |
| 2014/0021908 A1 | 1/2014 | McCool |
| 2014/0024325 A1 | 1/2014 | Iun et al. |
| 2014/0035524 A1 | 2/2014 | Zeine |
| 2014/0035526 A1 | 2/2014 | Tripathi et al. |
| 2014/0035786 A1 | 2/2014 | Ley |
| 2014/0043248 A1 | 2/2014 | Yeh |
| 2014/0049422 A1 | 2/2014 | Von Novak et al. |
| 2014/0054971 A1 | 2/2014 | Kissin |
| 2014/0055098 A1 | 2/2014 | Lee et al. |
| 2014/0057618 A1 | 2/2014 | Zirwas et al. |
| 2014/0062395 A1 | 3/2014 | Kwon et al. |

(56) References Cited

U.S. PATENT DOCUMENTS

| | | |
|---|---|---|
| 2014/0082435 A1 | 3/2014 | Kitgawa |
| 2014/0086125 A1 | 3/2014 | Polo et al. |
| 2014/0086592 A1 | 3/2014 | Nakahara et al. |
| 2014/0091756 A1 | 4/2014 | Ofstein et al. |
| 2014/0091968 A1 | 4/2014 | Harel et al. |
| 2014/0091974 A1 | 4/2014 | Desclos et al. |
| 2014/0103869 A1 | 4/2014 | Radovic |
| 2014/0104157 A1 | 4/2014 | Burns |
| 2014/0111147 A1 | 4/2014 | Soar |
| 2014/0111153 A1 | 4/2014 | Kwon et al. |
| 2014/0113689 A1 | 4/2014 | Lee |
| 2014/0117946 A1 | 5/2014 | Muller et al. |
| 2014/0118140 A1 | 5/2014 | Amis |
| 2014/0128107 A1 | 5/2014 | An |
| 2014/0132210 A1 | 5/2014 | Partovi |
| 2014/0133279 A1 | 5/2014 | Khuri-Yakub |
| 2014/0139034 A1 | 5/2014 | Sankar et al. |
| 2014/0139039 A1 | 5/2014 | Cook et al. |
| 2014/0139180 A1 | 5/2014 | Kim et al. |
| 2014/0141838 A1 | 5/2014 | Cai et al. |
| 2014/0142876 A1 | 5/2014 | John et al. |
| 2014/0143933 A1 | 5/2014 | Low et al. |
| 2014/0145879 A1 | 5/2014 | Pan |
| 2014/0145884 A1 | 5/2014 | Dang et al. |
| 2014/0152117 A1 | 6/2014 | Sanker |
| 2014/0159651 A1 | 6/2014 | Von Novak et al. |
| 2014/0159652 A1 | 6/2014 | Hall et al. |
| 2014/0159662 A1 | 6/2014 | Furui |
| 2014/0159667 A1 | 6/2014 | Kim et al. |
| 2014/0169385 A1 | 6/2014 | Hadani et al. |
| 2014/0175893 A1 | 6/2014 | Sengupta et al. |
| 2014/0176054 A1 | 6/2014 | Porat et al. |
| 2014/0176061 A1 | 6/2014 | Cheatham, III et al. |
| 2014/0176082 A1 | 6/2014 | Visser |
| 2014/0177399 A1 | 6/2014 | Teng et al. |
| 2014/0183964 A1 | 7/2014 | Walley |
| 2014/0184148 A1 | 7/2014 | Van Der Lee et al. |
| 2014/0184155 A1 | 7/2014 | Cha |
| 2014/0184163 A1 | 7/2014 | Das et al. |
| 2014/0184170 A1 | 7/2014 | Jeong |
| 2014/0191568 A1 | 7/2014 | Partovi |
| 2014/0191818 A1 | 7/2014 | Waffenschmidt et al. |
| 2014/0194092 A1 | 7/2014 | Wanstedt et al. |
| 2014/0194095 A1 | 7/2014 | Wanstedt et al. |
| 2014/0197691 A1 | 7/2014 | Wang |
| 2014/0203629 A1 | 7/2014 | Hoffman et al. |
| 2014/0206384 A1 | 7/2014 | Kim et al. |
| 2014/0210281 A1 | 7/2014 | Ito et al. |
| 2014/0217955 A1 | 8/2014 | Lin |
| 2014/0217967 A1 | 8/2014 | Zeine et al. |
| 2014/0225805 A1 | 8/2014 | Pan et al. |
| 2014/0232320 A1 | 8/2014 | Ento July et al. |
| 2014/0232610 A1 | 8/2014 | Shigemoto et al. |
| 2014/0239733 A1 | 8/2014 | Mach et al. |
| 2014/0241231 A1 | 8/2014 | Zeine |
| 2014/0245036 A1 | 8/2014 | Oishi |
| 2014/0246416 A1 | 9/2014 | White |
| 2014/0247152 A1 | 9/2014 | Proud |
| 2014/0252813 A1 | 9/2014 | Lee et al. |
| 2014/0252866 A1 | 9/2014 | Walsh et al. |
| 2014/0265725 A1 | 9/2014 | Angle et al. |
| 2014/0265727 A1 | 9/2014 | Berte |
| 2014/0265943 A1 | 9/2014 | Angle et al. |
| 2014/0266025 A1 | 9/2014 | Jakubowski |
| 2014/0266946 A1 | 9/2014 | Bily et al. |
| 2014/0273819 A1 | 9/2014 | Nadakuduti et al. |
| 2014/0273892 A1 | 9/2014 | Nourbakhsh |
| 2014/0281655 A1 | 9/2014 | Angle et al. |
| 2014/0292090 A1 | 10/2014 | Cordeiro et al. |
| 2014/0292451 A1 | 10/2014 | Zimmerman |
| 2014/0300452 A1 | 10/2014 | Rofe et al. |
| 2014/0312706 A1 | 10/2014 | Fiorello et al. |
| 2014/0325218 A1 | 10/2014 | Shimizu et al. |
| 2014/0327320 A1 | 11/2014 | Muhs et al. |
| 2014/0327390 A1 | 11/2014 | Park et al. |
| 2014/0333142 A1 | 11/2014 | Desrosiers |
| 2014/0346860 A1 | 11/2014 | Aubry et al. |
| 2014/0354063 A1 | 12/2014 | Leabman et al. |
| 2014/0354221 A1 | 12/2014 | Leabman et al. |
| 2014/0355718 A1 | 12/2014 | Guan et al. |
| 2014/0357309 A1 | 12/2014 | Leabman et al. |
| 2014/0368048 A1 | 12/2014 | Leabman et al. |
| 2014/0368161 A1 | 12/2014 | Leabman et al. |
| 2014/0368405 A1 | 12/2014 | Ek et al. |
| 2014/0375139 A1 | 12/2014 | Tsukamoto |
| 2014/0375253 A1 | 12/2014 | Leabman et al. |
| 2014/0375255 A1 | 12/2014 | Leabman et al. |
| 2014/0375258 A1 | 12/2014 | Arkhipenkov |
| 2014/0375261 A1 | 12/2014 | Manova-Elssibony et al. |
| 2014/0376646 A1 | 12/2014 | Leabman et al. |
| 2015/0001949 A1 | 1/2015 | Leabman et al. |
| 2015/0002086 A1 | 1/2015 | Matos et al. |
| 2015/0003207 A1 | 1/2015 | Lee et al. |
| 2015/0008980 A1 | 1/2015 | Kim et al. |
| 2015/0011160 A1 | 1/2015 | Uurgovan et al. |
| 2015/0015180 A1 | 1/2015 | Miller et al. |
| 2015/0015182 A1 | 1/2015 | Brandtman et al. |
| 2015/0015192 A1 | 1/2015 | Leabman et al. |
| 2015/0015194 A1 | 1/2015 | Leabman et al. |
| 2015/0015195 A1 | 1/2015 | Leabman et al. |
| 2015/0021990 A1 | 1/2015 | Myer et al. |
| 2015/0022008 A1 | 1/2015 | Leabman et al. |
| 2015/0022009 A1 | 1/2015 | Leabman et al. |
| 2015/0022010 A1 | 1/2015 | Leabman et al. |
| 2015/0022194 A1 | 1/2015 | Almalki et al. |
| 2015/0023204 A1 | 1/2015 | Wil et al. |
| 2015/0028688 A1 | 1/2015 | Masaoka |
| 2015/0028694 A1 | 1/2015 | Leabman et al. |
| 2015/0028697 A1 | 1/2015 | Leabman et al. |
| 2015/0028875 A1 | 1/2015 | Irie et al. |
| 2015/0029397 A1 | 1/2015 | Leabman et al. |
| 2015/0035378 A1 | 2/2015 | Calhoun et al. |
| 2015/0035715 A1 | 2/2015 | Kim et al. |
| 2015/0039482 A1 | 2/2015 | Fuinaga |
| 2015/0041459 A1 | 2/2015 | Leabman et al. |
| 2015/0042264 A1 | 2/2015 | Leabman et al. |
| 2015/0042265 A1 | 2/2015 | Leabman et al. |
| 2015/0044977 A1 | 2/2015 | Ramasamy et al. |
| 2015/0046526 A1 | 2/2015 | Bush et al. |
| 2015/0061404 A1 | 3/2015 | Lamenza et al. |
| 2015/0076917 A1 | 3/2015 | Leabman et al. |
| 2015/0076927 A1 | 3/2015 | Leabman et al. |
| 2015/0077036 A1 | 3/2015 | Leabman et al. |
| 2015/0077037 A1 | 3/2015 | Leabman et al. |
| 2015/0091520 A1 | 4/2015 | Blum et al. |
| 2015/0091706 A1 | 4/2015 | Chemishkian et al. |
| 2015/0097442 A1 | 4/2015 | Muurinen |
| 2015/0097663 A1 | 4/2015 | Sloo et al. |
| 2015/0102681 A1 | 4/2015 | Leabman et al. |
| 2015/0102764 A1 | 4/2015 | Leabman et al. |
| 2015/0102769 A1 | 4/2015 | Leabman et al. |
| 2015/0102942 A1 | 4/2015 | Houser et al. |
| 2015/0102973 A1 | 4/2015 | Hand et al. |
| 2015/0108848 A1 | 4/2015 | Joehren |
| 2015/0109181 A1 | 4/2015 | Hyde et al. |
| 2015/0115877 A1 | 4/2015 | Aria et al. |
| 2015/0115878 A1 | 4/2015 | Park |
| 2015/0116153 A1 | 4/2015 | Chen et al. |
| 2015/0123496 A1 | 5/2015 | Leabman et al. |
| 2015/0128733 A1 | 5/2015 | Taylor et al. |
| 2015/0130285 A1 | 5/2015 | Leabman et al. |
| 2015/0130293 A1 | 5/2015 | Hajimiri et al. |
| 2015/0137612 A1 | 5/2015 | Yamakawa et al. |
| 2015/0148664 A1 | 5/2015 | Stolka et al. |
| 2015/0155737 A1 | 6/2015 | Mayo |
| 2015/0155738 A1 | 6/2015 | Leabman et al. |
| 2015/0162662 A1 | 6/2015 | Chen et al. |
| 2015/0162751 A1 | 6/2015 | Leabman et al. |
| 2015/0162779 A1 | 6/2015 | Lee et al. |
| 2015/0171512 A1 | 6/2015 | Chen et al. |
| 2015/0171513 A1 | 6/2015 | Chen et al. |
| 2015/0171656 A1 | 6/2015 | Leabman et al. |
| 2015/0171658 A1 | 6/2015 | Manova-Elssibony et al. |
| 2015/0171931 A1 | 6/2015 | Won et al. |

(56) References Cited

U.S. PATENT DOCUMENTS

| | | |
|---|---|---|
| 2015/0177326 A1 | 6/2015 | Chakraborty et al. |
| 2015/0180133 A1 | 6/2015 | Hunt |
| 2015/0180249 A1 | 6/2015 | Jeon et al. |
| 2015/0180284 A1 | 6/2015 | Kang et al. |
| 2015/0181117 A1 | 6/2015 | Park et al. |
| 2015/0187491 A1 | 7/2015 | Yanagawa |
| 2015/0188352 A1 | 7/2015 | Peek et al. |
| 2015/0199665 A1 | 7/2015 | Chu |
| 2015/0201385 A1 | 7/2015 | Mercer et al. |
| 2015/0207333 A1 | 7/2015 | Baarman et al. |
| 2015/0207542 A1 | 7/2015 | Zeine |
| 2015/0222126 A1 | 8/2015 | Leabman et al. |
| 2015/0233987 A1 | 8/2015 | Von Novak, III et al. |
| 2015/0234144 A1 | 8/2015 | Cameron et al. |
| 2015/0236520 A1 | 8/2015 | Baarman |
| 2015/0236877 A1 | 8/2015 | Peng et al. |
| 2015/0244070 A1 | 8/2015 | Cheng et al. |
| 2015/0244080 A1 | 8/2015 | Gregoire |
| 2015/0244187 A1 | 8/2015 | Horie |
| 2015/0244201 A1 | 8/2015 | Chu |
| 2015/0244341 A1 | 8/2015 | Ritter et al. |
| 2015/0249484 A1 | 9/2015 | Mach et al. |
| 2015/0255989 A1 | 9/2015 | Walley et al. |
| 2015/0256097 A1 | 9/2015 | Gudan et al. |
| 2015/0260835 A1 | 9/2015 | Widmer et al. |
| 2015/0262465 A1 | 9/2015 | Pritchett |
| 2015/0263534 A1 | 9/2015 | Lee et al. |
| 2015/0263548 A1 | 9/2015 | Cooper |
| 2015/0270618 A1 | 9/2015 | Zhu et al. |
| 2015/0270622 A1 | 9/2015 | Takasaki et al. |
| 2015/0270741 A1 | 9/2015 | Leabman et al. |
| 2015/0278558 A1 | 10/2015 | Priev et al. |
| 2015/0280429 A1 | 10/2015 | Makita et al. |
| 2015/0280484 A1 | 10/2015 | Radziemski et al. |
| 2015/0288074 A1 | 10/2015 | Harper et al. |
| 2015/0288438 A1 | 10/2015 | Maltsev et al. |
| 2015/0311585 A1 | 10/2015 | Church et al. |
| 2015/0312721 A1 | 10/2015 | Singh |
| 2015/0318729 A1 | 11/2015 | Leabman |
| 2015/0326024 A1 | 11/2015 | Bell et al. |
| 2015/0326025 A1 | 11/2015 | Bell et al. |
| 2015/0326051 A1 | 11/2015 | Bell et al. |
| 2015/0326063 A1 | 11/2015 | Leabman et al. |
| 2015/0326068 A1 | 11/2015 | Bell et al. |
| 2015/0326070 A1 | 11/2015 | Petras et al. |
| 2015/0326071 A1 | 11/2015 | Contopanagos |
| 2015/0326072 A1 | 11/2015 | Petras et al. |
| 2015/0326143 A1 | 11/2015 | Petras et al. |
| 2015/0327085 A1 | 11/2015 | Hadani |
| 2015/0333528 A1 | 11/2015 | Leabman |
| 2015/0333529 A1 | 11/2015 | Leabman |
| 2015/0333573 A1 | 11/2015 | Leabman |
| 2015/0333800 A1 | 11/2015 | Perry et al. |
| 2015/0339497 A1 | 11/2015 | Kurian |
| 2015/0340759 A1 | 11/2015 | Bridgelall et al. |
| 2015/0340903 A1 | 11/2015 | Bell et al. |
| 2015/0340909 A1 | 11/2015 | Bell et al. |
| 2015/0340911 A1 | 11/2015 | Bell et al. |
| 2015/0341087 A1 | 11/2015 | Moore et al. |
| 2015/0349574 A1 | 12/2015 | Leabman |
| 2015/0358222 A1 | 12/2015 | Berger et al. |
| 2015/0365137 A1 | 12/2015 | Miller et al. |
| 2015/0365138 A1 | 12/2015 | Miller et al. |
| 2016/0005068 A1 | 1/2016 | Im et al. |
| 2016/0012695 A1 | 1/2016 | Bell et al. |
| 2016/0013560 A1 | 1/2016 | Daniels |
| 2016/0013656 A1 | 1/2016 | Bell et al. |
| 2016/0013661 A1 | 1/2016 | Kurs et al. |
| 2016/0013677 A1 | 1/2016 | Bell et al. |
| 2016/0013678 A1 | 1/2016 | Bell et al. |
| 2016/0013855 A1 | 1/2016 | Campos |
| 2016/0020636 A1 | 1/2016 | Khlat |
| 2016/0020647 A1 | 1/2016 | Leabman et al. |
| 2016/0020830 A1 | 1/2016 | Bell et al. |
| 2016/0028403 A1 | 1/2016 | McCaughan et al. |
| 2016/0033254 A1 | 2/2016 | Zeine et al. |
| 2016/0042206 A1 | 2/2016 | Pesavento et al. |
| 2016/0043571 A1 | 2/2016 | Kesler et al. |
| 2016/0054395 A1 | 2/2016 | Bell et al. |
| 2016/0054396 A1 | 2/2016 | Bell et al. |
| 2016/0054440 A1 | 2/2016 | Younis |
| 2016/0056635 A1 | 2/2016 | Bell |
| 2016/0056640 A1 | 2/2016 | Mao |
| 2016/0056669 A1 | 2/2016 | Bell |
| 2016/0056966 A1 | 2/2016 | Bell |
| 2016/0065005 A1 | 3/2016 | Won et al. |
| 2016/0079799 A1 | 3/2016 | Khlat |
| 2016/0087483 A1 | 3/2016 | Hietala et al. |
| 2016/0087486 A1 | 3/2016 | Pogorelik et al. |
| 2016/0094091 A1 | 3/2016 | Shin et al. |
| 2016/0094092 A1 | 3/2016 | Davlantes et al. |
| 2016/0099601 A1 | 4/2016 | Leabman et al. |
| 2016/0099602 A1 | 4/2016 | Leabman et al. |
| 2016/0099609 A1 | 4/2016 | Leabman et al. |
| 2016/0099610 A1 | 4/2016 | Leabman et al. |
| 2016/0099611 A1 | 4/2016 | Leabman et al. |
| 2016/0099612 A1 | 4/2016 | Leabman et al. |
| 2016/0099613 A1 | 4/2016 | Leabman et al. |
| 2016/0099614 A1 | 4/2016 | Leabman et al. |
| 2016/0099755 A1 | 4/2016 | Leabman et al. |
| 2016/0099756 A1 | 4/2016 | Leabman et al. |
| 2016/0099757 A1 | 4/2016 | Leabman et al. |
| 2016/0100124 A1 | 4/2016 | Leabman et al. |
| 2016/0112787 A1 | 4/2016 | Rich |
| 2016/0126749 A1 | 5/2016 | Shichino et al. |
| 2016/0126752 A1 | 5/2016 | Vuori et al. |
| 2016/0126776 A1 | 5/2016 | Kim et al. |
| 2016/0141908 A1 | 5/2016 | Jaki et al. |
| 2016/0164563 A1 | 6/2016 | Khawand et al. |
| 2016/0174162 A1 | 6/2016 | Nadakuduti et al. |
| 2016/0181849 A1 | 6/2016 | Govindaraj |
| 2016/0181854 A1 | 6/2016 | Leabman |
| 2016/0181867 A1 | 6/2016 | Daniel et al. |
| 2016/0181873 A1 | 6/2016 | Mitcheson et al. |
| 2016/0191121 A1 | 6/2016 | Bell |
| 2016/0197522 A1 | 7/2016 | Zeine et al. |
| 2016/0202343 A1 | 7/2016 | Okutsu |
| 2016/0204622 A1 | 7/2016 | Leabman |
| 2016/0204642 A1 | 7/2016 | Oh |
| 2016/0233582 A1 | 8/2016 | Piskun |
| 2016/0238365 A1 | 8/2016 | Wixey et al. |
| 2016/0240908 A1 | 8/2016 | Strong |
| 2016/0248276 A1 | 8/2016 | Hong et al. |
| 2016/0294225 A1 | 10/2016 | Blum et al. |
| 2016/0299210 A1 | 10/2016 | Zeine |
| 2016/0301240 A1 | 10/2016 | Zeine |
| 2016/0322868 A1 | 11/2016 | Akuzawa et al. |
| 2016/0323000 A1 | 11/2016 | Liu et al. |
| 2016/0336804 A1 | 11/2016 | Son et al. |
| 2016/0339258 A1 | 11/2016 | Perryman et al. |
| 2016/0344098 A1 | 11/2016 | Ming |
| 2016/0359367 A1 | 12/2016 | Rothschild |
| 2016/0380464 A1 | 12/2016 | Chin et al. |
| 2016/0380466 A1 | 12/2016 | Yang et al. |
| 2017/0005481 A1 | 1/2017 | Von Novak, III |
| 2017/0005516 A9 | 1/2017 | Leabman et al. |
| 2017/0005524 A1 | 1/2017 | Akuzawa et al. |
| 2017/0005530 A1 | 1/2017 | Zeine et al. |
| 2017/0012448 A1 | 1/2017 | Miller et al. |
| 2017/0025887 A1 | 1/2017 | Hyun et al. |
| 2017/0025903 A1 | 1/2017 | Song et al. |
| 2017/0026087 A1 | 1/2017 | Tanabe |
| 2017/0040700 A1 | 2/2017 | Leung |
| 2017/0043675 A1 | 2/2017 | Jones et al. |
| 2017/0047784 A1 | 2/2017 | Jung et al. |
| 2017/0187225 A1 | 2/2017 | Hosseini |
| 2017/0063168 A1 | 3/2017 | Uchida |
| 2017/0077733 A1 | 3/2017 | Jeong et al. |
| 2017/0077764 A1 | 3/2017 | Bell et al. |
| 2017/0077765 A1 | 3/2017 | Bell et al. |
| 2017/0077979 A1 | 3/2017 | Papa et al. |
| 2017/0085437 A1 | 3/2017 | Condeixa et al. |
| 2017/0092115 A1 | 3/2017 | Sloo et al. |
| 2017/0104263 A1 | 4/2017 | Hosseini |

(56) References Cited

U.S. PATENT DOCUMENTS

| | | |
|---|---|---|
| 2017/0110886 A1 | 4/2017 | Reynolds et al. |
| 2017/0110887 A1 | 4/2017 | Bell et al. |
| 2017/0110888 A1 | 4/2017 | Leabman |
| 2017/0110889 A1 | 4/2017 | Bell |
| 2017/0110910 A1 | 4/2017 | Zeine et al. |
| 2017/0110914 A1 | 4/2017 | Bell |
| 2017/0127196 A1 | 5/2017 | Blum et al. |
| 2017/0134686 A9 | 5/2017 | Leabman |
| 2017/0141582 A1 | 5/2017 | Adolf et al. |
| 2017/0141583 A1 | 5/2017 | Adolf et al. |
| 2017/0163076 A1 | 6/2017 | Park et al. |
| 2017/0168595 A1 | 6/2017 | Sakaguchi et al. |
| 2017/0179763 A9 | 6/2017 | Leabman |
| 2017/0179771 A1 | 6/2017 | Leabman |
| 2017/0187224 A1 | 6/2017 | Hosseini |
| 2017/0187228 A1 | 6/2017 | Hosseini |
| 2017/0187247 A1 | 6/2017 | Leabman |
| 2017/0187422 A1 | 6/2017 | Hosseini |
| 2017/0214422 A1 | 7/2017 | Na et al. |
| 2017/0338695 A1 | 11/2017 | Port |
| 2018/0006611 A1 | 1/2018 | de Jong et al. |
| 2018/0040929 A1 | 2/2018 | Chappelle |
| 2018/0048178 A1 | 2/2018 | Leabman |
| 2018/0090992 A1 | 3/2018 | Shrivastava et al. |
| 2018/0131238 A1 | 5/2018 | Leabman |
| 2018/0166924 A1 | 6/2018 | Hosseini |
| 2018/0198199 A1 | 7/2018 | Hosseini |
| 2018/0212474 A1 | 7/2018 | Hosseini |
| 2018/0226840 A1 | 8/2018 | Leabman |
| 2018/0227018 A1 | 8/2018 | Moshfeghi |
| 2018/0241255 A1 | 8/2018 | Leabman |
| 2018/0248409 A1 | 8/2018 | Johnston |
| 2018/0254639 A1 | 9/2018 | Bell |
| 2018/0262040 A1 | 9/2018 | Contopanagos |
| 2018/0262060 A1 | 9/2018 | Johnston |
| 2018/0269570 A1 | 9/2018 | Hosseini |
| 2018/0287431 A1 | 10/2018 | Liu et al. |
| 2018/0301934 A1 | 10/2018 | Prabhala et al. |
| 2018/0309314 A1 | 10/2018 | White et al. |
| 2018/0331429 A1 | 11/2018 | Kornaros |
| 2018/0331581 A1 | 11/2018 | Hosseini |
| 2018/0337534 A1 | 11/2018 | Bell et al. |
| 2018/0375340 A1 | 12/2018 | Bell et al. |
| 2018/0375368 A1 | 12/2018 | Leabman et al. |
| 2018/0376235 A1 | 12/2018 | Leabman |
| 2019/0074728 A1 | 3/2019 | Leabman |
| 2019/0074862 A1 | 3/2019 | Wang et al. |
| 2019/0131827 A1 | 5/2019 | Johnston |
| 2019/0245389 A1 | 8/2019 | Johnston et al. |
| 2019/0288567 A1 | 9/2019 | Leabman et al. |
| 2019/0296586 A1 | 9/2019 | Moshfeghi |
| 2019/0326782 A1 | 10/2019 | Graham et al. |
| 2019/0372384 A1 | 12/2019 | Hosseini et al. |
| 2019/0386522 A1 | 12/2019 | Park et al. |
| 2019/0393729 A1 | 12/2019 | Contopanagos et al. |
| 2019/0393928 A1 | 12/2019 | Leabman |
| 2020/0006988 A1 | 1/2020 | Leabman |
| 2020/0021128 A1 | 1/2020 | Bell et al. |
| 2020/0044488 A1 | 2/2020 | Johnston et al. |
| 2020/0091608 A1 | 3/2020 | Alpman et al. |
| 2020/0119592 A1 | 4/2020 | Hosseini |
| 2020/0153117 A1 | 5/2020 | Papio-Toda et al. |
| 2020/0235614 A1 | 7/2020 | Swan et al. |
| 2020/0244111 A1 | 7/2020 | Johnston et al. |
| 2020/0274397 A1 | 8/2020 | Hwang et al. |
| 2021/0184503 A1 | 6/2021 | Leabman |

FOREIGN PATENT DOCUMENTS

| | | |
|---|---|---|
| CN | 102292896 A | 12/2011 |
| CN | 102860037 A | 1/2013 |
| CN | 103151848 A | 6/2013 |
| CN | 103348563 A | 10/2013 |
| CN | 203826555 U | 9/2014 |
| CN | 104090265 A | 10/2014 |
| CN | 105765821 A | 7/2016 |
| CN | 106329116 A | 1/2017 |
| CN | 103380561 B | 9/2017 |
| DE | 20016655 U1 | 2/2002 |
| DE | 102013216953 A1 | 2/2015 |
| EP | 1028482 A2 | 8/2000 |
| EP | 1081506 A1 | 3/2001 |
| EP | 2346136 A1 | 7/2011 |
| EP | 2397973 A1 | 2/2012 |
| EP | 2545635 A2 | 1/2013 |
| EP | 2747195 A1 | 6/2014 |
| EP | 3067983 A1 | 9/2016 |
| EP | 3118970 A1 | 1/2017 |
| EP | 3145052 A1 | 3/2017 |
| GB | 2404497 A | 2/2005 |
| GB | 2556620 A | 6/2018 |
| JP | 2002319816 A | 10/2002 |
| JP | 2006157586 A | 6/2006 |
| JP | 2007043432 A | 2/2007 |
| JP | 2008167017 A | 7/2008 |
| JP | 2009525715 A | 7/2009 |
| JP | 2009201328 A | 9/2009 |
| JP | 2012016171 A | 1/2012 |
| JP | 2013099249 A | 5/2013 |
| JP | 2013162624 A | 8/2013 |
| JP | 2014075927 A | 4/2014 |
| JP | 2015128349 A | 7/2015 |
| JP | WO2015177859 A1 | 4/2017 |
| KR | 20060061776 A | 6/2006 |
| KR | 20070044302 A | 4/2007 |
| KR | 100755144 B1 | 9/2007 |
| KR | 20110132059 A | 12/2011 |
| KR | 20110135540 A1 | 12/2011 |
| KR | 20120009843 A | 2/2012 |
| KR | 20120108759 A | 10/2012 |
| KR | 20130026977 A | 3/2013 |
| KR | 20140023409 A | 2/2014 |
| KR | 20140023410 A | 3/2014 |
| KR | 20140085200 A | 7/2014 |
| KR | 20140148270 A | 12/2014 |
| KR | 20150077678 A | 7/2015 |
| RU | 2658332 C1 | 6/2018 |
| WO | WO 199508125 A1 | 3/1995 |
| WO | WO 199831070 A1 | 7/1998 |
| WO | WO 199952173 A1 | 10/1999 |
| WO | WO 2000111716 A1 | 2/2001 |
| WO | WO 2003091943 A1 | 11/2003 |
| WO | WO 2004077550 A1 | 9/2004 |
| WO | WO 2006122783 A2 | 11/2006 |
| WO | WO 2007070571 A2 | 6/2007 |
| WO | WO 2008024993 A2 | 2/2008 |
| WO | WO 2008156571 A2 | 12/2008 |
| WO | WO 2010022181 A1 | 2/2010 |
| WO | WO 2010039246 A1 | 4/2010 |
| WO | WO 2010138994 A1 | 12/2010 |
| WO | WO 2011112022 A2 | 9/2011 |
| WO | WO 2012177283 A1 | 12/2012 |
| WO | WO 2013031988 A1 | 3/2013 |
| WO | WO 2013035190 A1 | 3/2013 |
| WO | WO 2013038074 A2 | 3/2013 |
| WO | WO 2013042399 A1 | 3/2013 |
| WO | WO 2013052950 A1 | 4/2013 |
| WO | WO 2013105920 A2 | 7/2013 |
| WO | WO 2014068992 A1 | 5/2014 |
| WO | WO 2014075103 A1 | 5/2014 |
| WO | WO 2014132258 A1 | 9/2014 |
| WO | WO 2014134996 A1 | 9/2014 |
| WO | WO 2014182788 A2 | 11/2014 |
| WO | WO 2014182788 A3 | 11/2014 |
| WO | WO 2014197472 A1 | 12/2014 |
| WO | WO 2014209587 A1 | 12/2014 |
| WO | WO 2015038773 A1 | 3/2015 |
| WO | WO 2015097809 A1 | 7/2015 |
| WO | WO 2015130902 A1 | 9/2015 |
| WO | WO 2015161323 A1 | 10/2015 |
| WO | WO 2016024869 A1 | 2/2016 |
| WO | WO 2016048512 A1 | 3/2016 |

(56) References Cited

FOREIGN PATENT DOCUMENTS

WO WO 2016088261 A1 6/2016
WO WO 2016187357 A1 11/2016

OTHER PUBLICATIONS

Energous Corp., IPRP, PCT/US2014/037109, Apr. 12, 2016, 9 pgs.
Energous Corp., IPRP, PCT/US2014/037170, Nov. 10, 2015, 8 pgs.
Energous Corp., IPRP, PCT/US2014/040648, Dec. 8, 2015, 8 pgs.
Energous Corp., IPRP, PCT/US2014/040697, Dec. 8, 2015, 9 pgs.
Energous Corp., IPRP, PCT/US2014/040705, Dec. 8, 2015, 6 pgs.
Energous Corp., IPRP, PCT/US2014/041323, Dec. 22, 2015, 8 pgs.
Energous Corp., IPRP, PCT/US2014/041342, Dec. 15, 2015, 8 pgs.
Energous Corp., IPRP, PCT/US2014/041534, Dec. 29, 2015, 7 pgs.
Energous Corp., IPRP, PCT/US2014/041546, Dec. 29, 2015, 9 pgs.
Energous Corp., IPRP, PCT/US2014/041558, Dec. 29, 2015, 6 pgs.
Energous Corp., IPRP, PCT/US2014/044810, Jan. 5, 2016, 10 pgs.
Energous Corp., IPRP, PCT/US2014/045102, Jan. 12, 2016, 11 pgs.
Energous Corp., IPRP, PCT/US2014/045119, Jan. 12, 2016, 9 pgs.
Energous Corp., IPRP, PCT/US2014/045237, Jan. 12, 2016, 12 pgs.
Energous Corp., IPRP, PCT/US2014/046941, Jan. 19, 2016, 9 pgs.
Energous Corp., IPRP, PCT/US2014/046956, Jan. 19, 2016, 7 pgs.
Energous Corp., IPRP, PCT/US2014/046961, Jan. 19, 2016, 8 pgs.
Energous Corp., IPRP, PCT/US2014/047963, Jan. 26, 2016, 10 pgs.
Energous Corp., IPRP, PCT/US2014/048002, Feb. 12, 2015 8 pgs.
Energous Corp., IPRP, PCT/US2014/049666, Feb. 9, 2016, 5 pgs.
Energous Corp., IPRP, PCT/US2014/049669, Feb. 9, 2016, 8 pgs.
Energous Corp., IPRP, PCT/US2014/049673, Feb. 9, 2016, 6 pgs.
Energous Corp., IPRP, PCT/US2014/054891, Mar. 15, 2016, 10 pgs.
Energous Corp., IPRP, PCT/US2014/054897, Mar. 15, 2016, 8 pgs.
Energous Corp., IPRP, PCT/US2014/054953, Mar. 22, 2016, 5 pgs.
Energous Corp., IPRP, PCT/US2014/055195, Mar. 22, 2016, 9 pgs.
Energous Corp., IPRP, PCT/US2014/059317, Apr. 12, 2016, 10 pgs.
Energous Corp., IPRP, PCT/US2014/059340, Apr. 12, 2016, 11 pgs.
Energous Corp., IPRP, PCT/US2014/059871, Apr. 12, 2016, 9 pgs.
Energous Corp., IPRP, PCT/US2014/062661, May 3, 2016, 10 pgs.
Energous Corp., IPRP, PCT/US2014/062672, May 10, 2016, 8 pgs.
Energous Corp., IPRP, PCT/US2014/062682, May 3, 2016, 8 pgs.
Energous Corp., IPRP, PCT/US2014/068282, Jun. 7, 2016, 10 pgs.
Energous Corp., IPRP, PCT/US2014/068568, Jun. 14, 2016, 8 pgs.
Energous Corp., IPRP, PCT/US2014/068586, Jun. 14, 2016, 8 pgs.
Energous Corp., IPRP, PCT/US2015/067242, Jun. 27, 2017, 7 pgs.
Energous Corp., IPRP, PCT/US2015/067243, Jun. 27, 2017, 7 pgs.
Energous Corp., IPRP, PCT/US2015/067245, Jun. 27, 2017, 7 pgs.
Energous Corp., IPRP, PCT/US2015/067246, Jun. 27, 2017, 9 pgs.
Energous Corp., IPRP, PCT/US2015/067249, Jun. 27, 2017, 7 pgs.
Energous Corp., IPRP, PCT/US2015/067250, Mar. 30, 2016, 10 pgs.
Energous Corp., IPRP, PCT/US2015/067271, Jul. 4, 2017, 5 pgs.
Energous Corp., IPRP, PCT/US2015/067275, Jul. 4, 2017, 7 pgs.
Energous Corp., IPRP, PCT/US2015/067279, Jul. 4, 2017, 7 pgs.
Energous Corp., IPRP, PCT/US2015/067282, Jul. 4, 2017, 6 pgs.
Energous Corp., IPRP, PCT/US2015/067287, Jul. 4, 2017, 6 pgs.
Energous Corp., IPRP, PCT/US2015/067291, Jul. 4, 2017, 4 pgs.
Energous Corp., IPRP, PCT/US2015/067294, Jul. 4, 2017, 6 pgs.
Energous Corp., IPRP, PCT/US2015/067325, Jul. 4, 2017, 8 pgs.
Energous Corp., IPRP, PCT/US2015/067334, Jul. 4, 2017, 5 pgs.
Energous Corp., IPRP, PCT/US2016/068495, Jun. 26, 2018, 7 pgs.
Energous Corp., IPRP, PCT/US2016/068498, Jun. 26, 2018, 6 pgs.
Energous Corp., IPRP, PCT/US2016/068504, Jun. 26, 2018, 5 pgs.
Energous Corp., IPRP, PCT/US2016/068551, Jun. 26, 2018, 6 pgs.
Energous Corp., IPRP, PCT/US2016/068565, Jun. 26, 2018, 9 pgs.
Energous Corp., IPRP, PCT/US2016/068987, Jul. 3, 2018, 7 pgs.
Energous Corp., IPRP, PCT/US2016/068993, Jul. 3, 2018, 10 pgs.
Energous Corp., IPRP, PCT/US2016/069313, Jul. 3, 2018, 7 pgs.
Energous Corp., IPRP, PCT/US2016/069316, Jul. 3, 2018, 12 pgs.
Energous Corp., IPRP, PCT/US2017/046800, Feb. 12, 2019, 10 pgs.
Energous Corp., IPRP, PCT/US2017/065886, Jun. 18, 2019, 10 pgs.
Energous Corp., IPRP, PCT/US2018/012806, Jul. 9, 2019, 6 pgs.
Energous Corp., IPRP, PCT/US2018/025465, Oct. 1, 2019, 8 pgs.
Energous Corp., IPRP, PCT/US2018/031768, Nov. 12, 2019, 8 pgs.
Energous Corp., IPRP, PCT/US2018/031786, Apr. 14, 2020, 7 pgs.
Energous Corp., IPRP, PCT/US2018/058178, May 5, 2020, 7 pgs.
Energous Corp., IPRP, PCT/US2019/015820, Aug. 4, 2020, 7 pgs.
Energous Corp., ISRWO, PCT/US2014/037072, Sep. 12, 2014, 8 pgs.
Energous Corp., ISRWO, PCT/US2014/037109, Apr. 8, 2016, 12 pgs.
Energous Corp., ISRWO, PCT/US2014/037170, Sep. 15, 2014, 11 pgs.
Energous Corp., ISRWO, PCT/US2014/040648, Oct. 10, 2014, 11 pgs.
Energous Corp., ISRWO, PCT/US2014/040697, Oct. 1, 2014, 12 pgs.
Energous Corp., ISRWO, PCT/US2014/040705, Sep. 23, 2014, 8 pgs.
Energous Corp., ISRWO, PCT/US2014/041323, Oct. 1, 2014, 10 pgs.
Energous Corp., ISRWO, PCT/US2014/041342, Jan. 27, 2015, 10 pgs.
Energous Corp., ISRWO, PCT/US2014/041534, Oct. 13, 2014, 10 pgs.
Energous Corp., ISRWO, PCT/US2014/041546, Oct. 16, 2014, 12 pgs.
Energous Corp., ISRWO, PCT/US2014/041558, Oct. 10, 2014, 8 pgs.
Energous Corp., ISRWO, PCT/US2014/044810 Oct. 21, 2014, 12 pgs.
Energous Corp., ISRWO, PCT/US2014/045102, Oct. 28, 2014, 14 pgs.
Energous Corp., ISRWO, PCT/US2014/045119, Oct. 13, 2014, 11 pgs.
Energous Corp., ISRWO, PCT/US2014/045237, Oct. 13, 2014, 16 pgs.
Energous Corp., ISRWO, PCT/US2014/046941, Nov. 6, 2014, 11 pgs.
Energous Corp., ISRWO, PCT/US2014/046956, Nov. 12, 2014, 10 pgs.
Energous Corp., ISRWO, PCT/US2014/046961, Nov. 24, 2014, 16 pgs.
Energous Corp., ISRWO, PCT/US2014/047963, Nov. 7, 2014, 13 pgs.
Energous Corp., ISRWO, PCT/US2014/048002, Nov. 13, 2014, 11 pgs.
Energous Corp., ISRWO, PCT/US2014/049666, Nov. 10, 2014, 7 pgs.
Energous Corp., ISRWO, PCT/US2014/049669, Nov. 13, 2014, 10 pgs.
Energous Corp., ISRWO, PCT/US2014/049673, Nov. 18, 2014, 10 pgs.
Energous Corp., ISRWO, PCT/US2014/054891, Dec. 18, 2014, 12 pgs.
Energous Corp., ISRWO, PCT/US2014/054897, Feb. 17, 2015, 10 pgs.
Energous Corp., ISRWO, PCT/US2014/054953, Dec. 4, 2014, 7 pgs.
Energous Corp., ISRWO, PCT/US2014/055195, Dec. 22, 2014, 11 pgs.
Energous Corp., ISRWO, PCT/US2014/059317, Feb. 24, 2015, 13 pgs.
Energous Corp., ISRWO, PCT/US2014/059340, Jan. 15, 2015, 13 pgs.
Energous Corp., ISRWO, PCT/US2014/059871, Jan. 23, 2015, 12 pgs.
Energous Corp., ISRWO, PCT/US2014/062661, Jan. 27, 2015, 12 pgs.
Energous Corp., ISRWO, PCT/US2014/062672, Jan. 26, 2015, 11 pgs.
Energous Corp., ISRWO, PCT/US2014/062682, Feb. 12, 2015, 10 pgs.

(56) References Cited

OTHER PUBLICATIONS

Energous Corp., ISRWO, PCT/US2014/068282, Mar. 19, 2015, 13 pgs.
Energous Corp., ISRWO, PCT/US2014/068568, Mar. 20, 2015, 10 pgs.
Energous Corp., ISRWO, PCT/US2014/068586, Mar. 20, 2015, 11 pgs.
Energous Corp., ISRWO, PCT/US2015/067242, Mar. 16, 2016, 9 pgs.
Energous Corp., ISRWO, PCT/US2015/067243, Mar. 10, 2016, 11 pgs.
Energous Corp., ISRWO, PCT/US2015/067245, Mar. 17, 2016, 8 pgs.
Energous Corp., ISRWO, PCT/US2015/067246, May 11, 2016, 18 pgs.
Energous Corp., ISRWO, PCT/US2015/067249, Mar. 29, 2016, 8 pgs.
Energous Corp., ISRWO, PCT/US2015/067250, Mar. 30, 2016, 11 pgs.
Energous Corp., ISRWO, PCT/US2015/067271, Mar. 11, 2016, 6 pgs.
Energous Corp., ISRWO, PCT/US2015/067275, Mar. 3, 2016, 8 pgs.
Energous Corp., ISRWO, PCT/US2015/067279, Mar. 11, 2015, 13 pgs.
Energous Corp., ISRWO, PCT/US2015/067282, Jul. 5, 2016, 7 pgs.
Energous Corp., ISRWO, PCT/US2015/067287, Feb. 2, 2016, 8 pgs.
Energous Corp., ISRWO, PCT/US2015/067291, Mar. 4, 2016, 10 pgs.
Energous Corp., ISRWO, PCT/US2015/067294, Mar. 29, 2016, 7 pgs.
Energous Corp., ISRWO, PCT/US2015/067325, Mar. 10, 2016, 9 pgs.
Energous Corp., ISRWO, PCT/US2015/067334, Mar. 3, 2016, 6 pgs.
Energous Corp., ISRWO, PCT/US2016/068495, Mar. 30, 2017, 9 pgs.
Energous Corp., ISRWO, PCT/US2016/068498, May 17, 2017, 8 pgs.
Energous Corp., ISRWO, PCT/US2016/068504, Mar. 30, 2017, 8 pgs.
Energous Corp., ISRWO, PCT/US2016/068551, Mar. 17, 2017, 8 pgs.
Energous Corp., ISRWO, PCT/US2016/068565, Mar. 8, 2017, 11 pgs.
Energous Corp., ISRWO, PCT/US2016/068987, May 8, 2017, 10 pgs.
Energous Corp., ISRWO, PCT/US2016/068993, Mar. 13, 2017, 12 pgs.
Energous Corp., ISRWO, PCT/US2016/069313, Nov. 13, 2017, 10 pgs.
Energous Corp., ISRWO, PCT/US2016/069316, Mar. 16, 2017, 15 pgs.
Energous Corp., ISRWO, PCT/US2017/046800, Sep. 11, 2017, 13 pgs.
Energous Corp., ISRWO, PCT/US2017/065886, Apr. 6, 2018, 13 pgs.
Energous Corp., ISRWO, PCT/US2018/012806, Mar. 23, 2018, 9 pgs.
Energous Corp., ISRWO, PCT/US2018/025465, Jun. 22, 2018, 9 pgs.
Energous Corp., ISRWO, PCT/US2018/031768, Jul. 3, 2018, 9 pgs.
Energous Corp., ISRWO, PCT/US2018/031786, Aug. 8, 2018, 9 pgs.
Energous Corp., ISRWO, PCT/US2018/039334, Sep. 11, 2018, 9 pgs.
Energous Corp., ISRWO, PCT/US2018/051082, Dec. 12, 2018, 9 pgs.
Energous Corp., ISRWO, PCT/US2018/058178, Mar. 13, 2019, 10 pgs.
Energous Corp., ISRWO, PCT/US2018/064289, Apr. 25, 2019, 12 pgs.
Energous Corp., ISRWO, PCT/US2019/015820, May 14, 2019, 9 pgs.
Energous Corp., ISRWO, PCT/US2019/021817, Apr. 6, 2019, 11 pgs.
Energous Corp., ISRWO, PCT/US2019/039014, Oct. 4, 2019, 15 pgs.
Energous Corp., ISRWO, PCT/US2020/016975, May 15, 2020, 15 pgs.
Notice of Intent to Issue Reexam Certificate: 90/013793 Feb. 2, 2017, 8 pgs.
Order Granting Reexamination Request, App No: 90/013793 Aug. 31, 2016, 23 pgs.
*Ossia Inc.* vs *Energous Corp.*, Declaration of Stephen B. Heppe in Support of Petition for Post-Grant Review of U.S. Pat. No. 9124125, PGR2016-00023, May 31, 2016, 144 pgs.
*Ossia Inc.* vs *Energous Corp.*, Declaration of Stephen B. Heppe in Support of Petition for Post-Grant Review of U.S. Pat. No. 9124125, PGR2016-00024, May 31, 2016, 122 pgs.
*Ossia Inc.* vs *Energous Corp.*, Patent Owner Preliminary Response, Sep. 8, 2016, 95 pgs.
*Ossia Inc.* vs *Energous Corp.*, Petition for Post Grant Review of U.S. Pat. No. 9124125, May 31, 2016, 86 pgs.
*Ossia Inc.* vs *Energous Corp.*, Petition for Post-Grant Review of U.S. Pat. No. 9124125, May 31, 2016, 92 pgs.
*Ossia Inc.* vs *Energous Corp.*, PGR2016-00023—Institution Decision, Nov. 29, 2016, 29 pgs.
*Ossia Inc.* vs *Energous Corp.*, PGR2016-00024—Institution Decision, Nov 29, 2016, 50 pgs.
*Ossia Inc.* vs *Energous Corp.*, PGR2016-00024—Judgement—Adverse, Jan. 20, 2017, 3 pgs.
Extended European Search Report, EP14818136.5, dated Jul. 21, 2016, 9 pgs.
Extended European Search Report, EP14822971.9, dated Feb. 10, 2017, 10 pgs.
Extended European Search Report, EP14868901.1, dated Jul. 17, 2017, 6 pgs.
Extended European Search Report, EP15874273.4, dated May 11, 2018, 7 pgs.
Extended European Search Report, EP15876033.0, dated Jun. 13, 2018, 10 pgs.
Extended European Search Report, EP15876036.3, dated May 3, 2018, 9 pgs.
Extended European Search Report, EP15876043.9, dated Aug. 9, 2018, 9 pgs.
Extended European Search Report, EP16189052.0, dated Feb. 10, 2017, 13 pgs.
Extended European Search Report, EP16189300.3, dated Mar. 24, 2017, 6 pgs.
Extended European Search Report, EP16189319.3, dated Feb. 10, 2017, 11 pgs.
Extended European Search Report, EP16189974.5, dated Mar. 13, 2017, 7 pgs.
Extended European Search Report, EP16189982.8, dated Feb. 7, 2017, 11 pgs.
Extended European Search Report, EP16189987.7, dated Feb. 9, 2017, 10 pgs.
Extended European Search Report, EP16189988.5, dated Mar. 13, 2017, 6 pgs.
Extended European Search Report, EP16193743.8, dated Feb. 8, 2017, 9 pgs.
Extended European Search Report, EP16196205.5, dated Apr. 7, 2017, 9 pgs.
Extended European Search Report, EP16880139.7, dated Jul. 12, 2019, 5 pgs.
Extended European Search Report, EP16880153.8, dated Jul. 2, 2019, 9 pgs.
Extended European Search Report, EP16880158.7, dated Jul. 15, 2019, 8 pgs.

(56) References Cited

OTHER PUBLICATIONS

Extended European Search Report, EP16882597.4, dated Aug. 7, 2019, 9 pgs.
Extended European Search Report, EP16882696.4, dated Jul. 3, 2019, 10 pgs.
Extended European Search Report, EP17840412.5, dated Jul. 15, 2019, 8 pgs.
Extended European Search Report, EP17882087.4, dated Sep. 17, 2019, 10 pgs.
Extended European Search Report, EP18204043.6, dated Feb. 14, 2019, 5 pgs.
Extended European Search Report, EP21159553.3, dated May 31, 2021, 8 pgs.
Adamiuk et al. "Compact, Dual-Polarized UWB-Antanna, Embedded in a Dielectric," IEEE Transactions on Antenna and Propagation, IEEE Service Center, Piscataway, NJ, US vol. 56, No. 2, Feb. 1, 2010, 8 pgs.
Gill et al. "A System for Change Detection and Human Recognition in Voxel Space using the Microsoft Kinect Sensor," 2011 IEEE Applied Imagery Pattern Recognition Workshop. 8 pgs.
Han et al. Enhanced Computer Vision with Microsoft Kinect Sensor: A Review, IEEE Transactions on Cybernetics vol. 43, No. 5. pp. 1318-1334, Oct. 3, 2013.
Hsieh et al. "Development of a Retrodirective Wireless Microwave Power Transmission System", IEEE, 2003 pp. 393-396.
Leabman "Adaptive Band-partitioning for Interference Cancellation in Communication System," Thesis Massachusetts Institute of Technology, Feb. 1997, pp. 1-70.
Li et al. High-Efficiency Switching-Mode Charger System Design Considerations with Dynamic Power Path Management, Mar./Apr. 2012 Issue, 8 pgs.
Mao et al. "BeamStar: An Edge-Based Approach to Routing in Wireless Sensors Networks", IEEE Transactions on Mobile Computing, IEEE Service Center, Los Alamitos, CA US, vol. 6, No. 11, Nov. 1, 2007, 13 pgs.
Mascarenas et al. "Experimental Studies of Using Wireless Energy Transmission for Powering Embedded Sensor Nodes," Nov. 28, 2009, Journal of Sound and Vibration, 13 pgs.
Mishra et al. "SIW-based Slot Array Antenna and Power Management Circuit for Wireless Energy Harvesting Applications", IEEE Apsursi, Jul. 2012, 2 pgs.
Nenzi et al "U-Helix: On-Chip Short Conical Antenna", 2013 7th European Conference on Antennas and Propagation (EUCAP), ISBN:978-1-4673-2187-7, IEEE, Apr. 8, 2013, 5 pgs.
Singh "Wireless Power Transfer Using Metamaterial Bonded Microstrip Antenna for Smart Grid WSN", Fourth International Conference on Advances in Computing and Communications (ICACC), Aug. 27-29, 2014, Abstract 1 pg.
Smolders "Broadband Microstrip Array Antennas" Institute of Electrical 1-15 and Electronics Engineers, Digest of the Antennas and Propagation Society International Symposium. Seattle, WA, Jun. 19-24, 1994, Abstract 3 pgs.
Van Veen et al., "Beamforming: A Versatile Approach to Spatial Filtering", IEEE, ASSP Magazine, Apr. 1988, pp. 4-24.
Zhai et al. "A Practical Wireless Charging System Based on Ultra-Wideband Retro-Reflective Beamforming" 2010 IEEE Antennas and Propagation Society International Symposium, Toronto, ON 2010, 4 pgs.
Energous Corp., ISRWO, PCT/US2020/067566, Apr. 27, 2021, 12 pgs.
Energous Corp., IPRP, PCT/US2020/067566, Jul. 5, 2022, 8 pgs.

\* cited by examiner

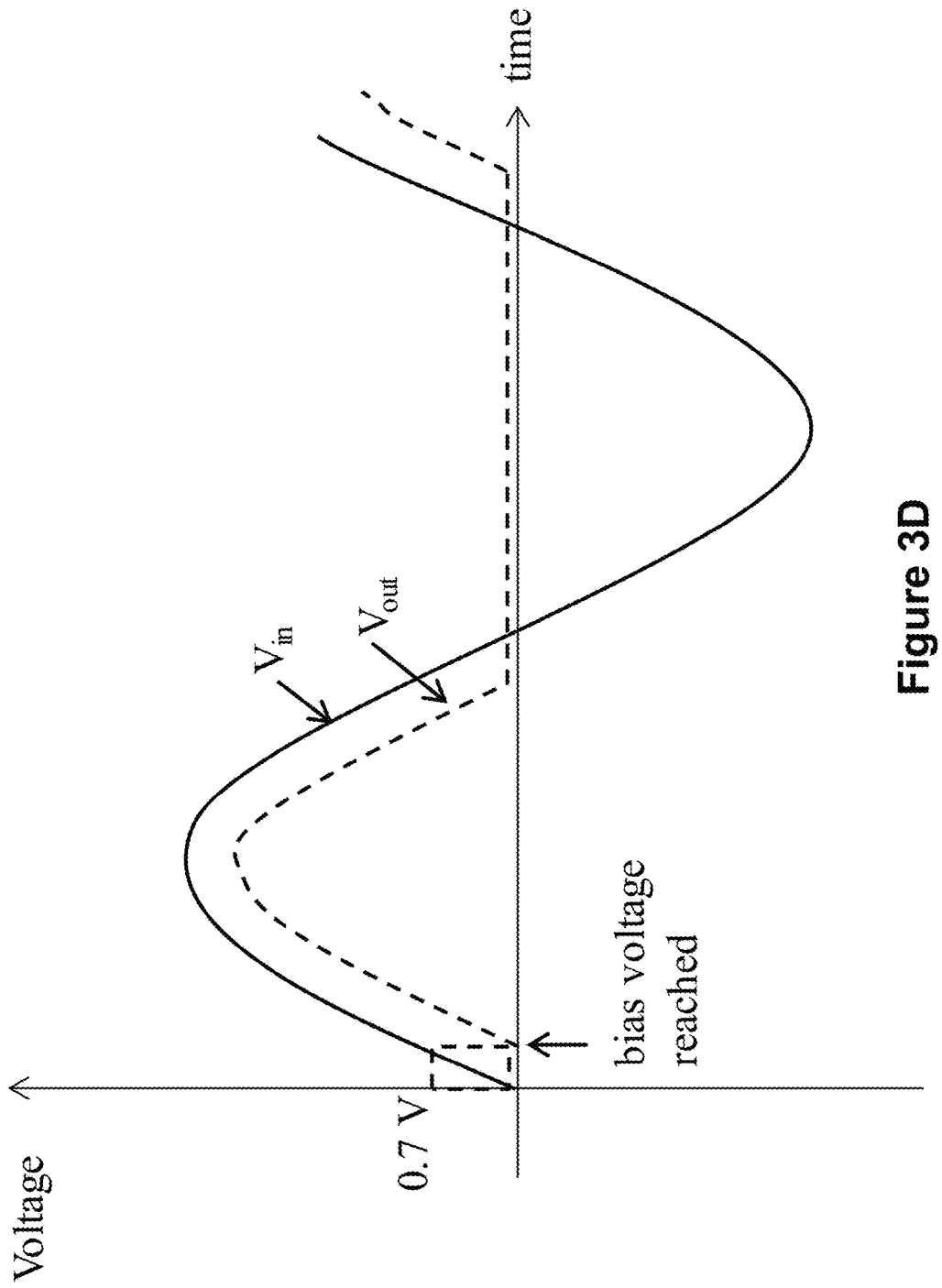

WIRELESS POWER RECEIVER WITH A TRANSISTOR RECTIFIER

CROSS-REFERENCE TO RELATED APPLICATIONS

This application is a continuation of U.S. Non-Provisional patent application Ser. No. 15/803,476, filed on Nov. 3, 2017, entitled "Wireless Power Receiver With a Synchronous Rectifier," which claims priority from U.S. Provisional Patent Application No. 62/417,115, filed Nov. 3, 2016 and entitled "Synchronous Rectifier for Wireless Power Receivers," which are hereby incorporated by reference in its entirety.

This application is related to U.S. patent application Ser. No. 14/856,337 filed on Sep. 16, 2015; U.S. patent application Ser. No. 14/856,317, filed Sep. 16, 2015 and entitled "Receiver Devices Configured to Operate with a Wireless Charging System"; U.S. patent application Ser. No. 14/856,186, filed Sep. 16, 2015 and entitled "Systems and Methods for Transmitting Power to Receivers"; U.S. patent application Ser. No. 14/856,219, filed Sep. 16, 2015 and entitled "Systems and Methods for Tracking Movement of Receivers in a Transmission Field"; U.S. patent application Ser. No. 14/854,820, filed Sep. 15, 2015 and entitled "Identifying Receivers in a Wireless Charging Transmission Field"; U.S. patent application Ser. No. 14/860,824, filed Sep. 22, 2015 and entitled "Receiver Devices Configured to Determine Location Within a Transmission Field"; U.S. patent application Ser. No. 14/860,843, filed Sep. 22, 2015 and entitled "Systems and Methods for Identifying Receiver Locations Using Sensor Technologies"; U.S. patent application Ser. No. 14/860,858, filed Sep. 22, 2015 and entitled "Systems and Methods for Preconfiguring Transmission Devices for Power Wave Transmissions"; U.S. patent application Ser. No. 14/861,285, filed Sep. 22, 2015 and entitled "Systems and Methods for Identifying Sensitive Objects in a Wireless Charging Field"; U.S. patent application Ser. No. 14/861,350, filed Sep. 22, 2015 and entitled "Systems and Methods for Preconfiguring Sensor Data for Wireless Charging Systems"; U.S. patent application Ser. No. 14/860,991, filed Sep. 22, 2015 and entitled "Systems and Methods for Generating and Transmitting Wireless Power Transmission Waves"; U.S. patent application Ser. No. 14/860,963, filed Sep. 22, 2015 and entitled "Systems and Methods for Determining and Generating Waveform for Wireless Power Transmission Waves"; U.S. patent application Ser. No. 14/861,246, filed Sep. 22, 2015 and entitled "Systems and Methods for Nullifying Energy Levels for Wireless Power Transmission Waves"; U.S. patent application Ser. No. 14/861,397, filed Sep. 22, 2015 and entitled "Systems and Methods for Selecting Antennas to Generate and Transmit Power Transmission Waves"; U.S. patent application Ser. No. 14/861,443, filed Sep. 22, 2015 and entitled "Wireless Power Transmission Device Having Antennas Oriented in Three Dimensions," all of which are incorporated herein by reference in their entireties.

TECHNICAL FIELD

The present disclosure relates generally to wireless power receivers, and more specifically to synchronous rectifiers for wireless power receivers.

BACKGROUND

Portable electronic devices, such as laptop computers, mobile phones, tablets, and other electronic devices, require frequent charging of a power-storing component (e.g., a battery) to operate. Many electronic devices require charging one or more times per day. Often, charging an electronic device requires manually connecting an electronic device to an outlet or other power source using a wired charging cable. In some cases, the power-storing component is removed from an electronic device and inserted into charging equipment. Accordingly, charging is time consuming, burdensome, and inefficient because users must carry around multiple charging cables and/or other charging devices, and frequently must locate appropriate power sources to charge their electronic devices. Additionally, conventional charging techniques potentially deprive a user of the ability to use the device while it is charging, and/or require the user to remain next to a wall outlet or other power source to which their electronic device or other charging equipment is connected.

Some other conventional charging systems utilize inductive coils to generate a magnetic field that is used to charge a device. However, such inductive coupling has a limited short range, such as a few inches or less. Users typically must place the device at a specific position on a charging pad and are unable to move the device to different positions on the pad, without interrupting or terminating the charging of the device. This results in a frustrating experience for many users as they may be unable to locate the device at the exact right position on the pad to start charging their device.

Additionally, existing antennas used for transmission of power waves have relatively large cross-sectional areas, such as 6 inches by 6 inches for transmission of power waves at a frequency of 900 MHz. Due to these large cross-sectional areas, integrating these antennas with devices results in noticeable and undesired changes to the aesthetic appearance of the devices, thereby reducing the likelihood that users will be willing to install such devices in their homes or offices.

Other conventional systems use radio frequency (RF) waves to transmit power. These RF waves form pockets of energy by a controlled constructive interference of the RF waves at the location of a wireless power receiver. However, the power received through the controlled constructive interference must be rectified to direct current (DC) that can be supplied to the electronic device to be charged. Wireless power receivers with traditional diode based rectifiers are lossy and consume a significant portion of the received power to operate.

SUMMARY

Accordingly, there is a need for improved antenna designs that help to address the shortcomings of conventional charging systems described above. In particular, there is a need for antennas that have a form factor that is suitable for integration within devices. Also, there is a need for a more efficient wireless power receiver with a rectifier that enables the wireless power receiver to transfer most of the received power to an associated electronic device.

In an embodiment, a wireless power receiver comprises: a field effect transistor (FET) including a source terminal, a drain terminal, and a gate terminal, wherein: the source terminal is connected to the ground; the drain terminal is connected to an alternating current (AC) voltage source; and the gate terminal is configured to be driven by a feed-forward signal tapped from the AC voltage source.

In another embodiment, a method comprises: receiving, by a drain terminal of a field effect transistor (FET) of a wireless power receiver, an input alternating current (AC) voltage waveform from a AC voltage source; and receiving, by a gate terminal of the FET of the wireless power receiver, a feed-forward signal tapped from the input AC voltage waveform, wherein the feed-forward signal biases the FET to operate as an open switch such that a connected load receives a current only during a positive cycle of the AV voltage waveform received from the AC voltage source.

Some embodiments provide a wireless power receiver that includes at least one radio frequency (RF) antenna and a field effect transistor (FET). The at least one RF antenna is configured to generate an alternating current (AC) waveform from received RF waves. The FET includes a source terminal configured to be electrically coupled to ground, a drain terminal electrically coupled to the at least one antenna, and a gate terminal configured to be driven by a feed-forward signal tapped from the AC waveform generated by the at least one antenna.

In some embodiments, the wireless power receiver includes a tap-line configured to carry the feed-forward signal from the at least one antenna to the gate terminal. In some embodiments, the tap-line is a micro-strip of a predetermined length that is selected such that the feed-forward signal arrives at the gate terminal completely out of phase or nearly completely out of phase with the AC waveform arriving at the drain terminal. In some embodiments, a feed-forward controller inserts a phase delay into the feed-forward signal.

In some embodiments, the feed-forward controller is configured to insert the phase delay into the feed-forward signal such that the feed-forward signal arrives at the gate terminal completely out of phase or nearly completely out of phase with the AC waveform arriving at the drain terminal. In some embodiments, the feed-forward controller is configured to insert the phase delay into the feed-forward signal such that the feed-forward signal arrives at the gate terminal with a predetermined phase offset with the AC waveform arriving at the drain terminal. In some embodiments, the one or more capacitors are configured to store electric charge during a negative cycle of the AC waveform. In some embodiments, the drain terminal outputs a direct current waveform to a load. In some embodiments, the FET is selected from the group consisting of: complementary metal oxide semiconductor (CMOS) P-type FET, CMOS N-type FET, Gallium arsenide (GaAs) FET, Gallium nitride (GaN) FET, silicon on insulator (SOI) FET, and a floating gate metal oxide FET (MOSFET). In some embodiments, the FET is configured to implement a Class-E or a Class-F switch.

In some embodiments, a method of receiving wireless power is provided. Radio frequency (RF) waves are received at a RF antenna. The waves are converted to an alternating current (AC) waveform. A drain terminal of a field effect transistor (FET) receives the AC waveform. A gate terminal of the FET receives a feed-forward signal tapped from the AC waveform. The feed-forward signal biases the FET to operate as an open switch such that a connected load receives a direct current (DC) waveform during a positive cycle of the AC waveform.

In some embodiments, a tap-line conducts the feed-forward signal from a source of the AC waveform (e.g., the at least one antenna) to the gate terminal. In some embodiments, the tap-line is a micro-strip described above. In some embodiments, a feed-forward controller inserts a phase delay in the feed-forward signal. In some embodiments, the feed-forward controller inserts the phase delay such that the feed-forward signal arrives at the gate terminal completely out of phase or nearly completely out of phase with the AC waveform arriving at the drain terminal. In some embodiments, the feed-forward controller inserts the phase delay such that the feed-forward signal arrives at the gate terminal with a predetermined phase offset with the AC waveform arriving at the drain terminal. In some embodiments, the one or more capacitors store electric charges from the current during a negative cycle of the AC waveform. In some embodiments, the FET is selected from the group consisting of: complementary metal oxide semiconductor (CMOS) P-type FET, CMOS N-type FET, Gallium arsenide (GaAs) FET, Gallium nitride (GaN) FET, silicon on insulator (SOI) FET, and a floating gate metal oxide FET (MOSFET). In some embodiments, the FET is configured to implement a Class-E or Class-F switch.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 3D shows a loss due to diode bias voltage in the prior art half-wave rectifier.

Figure 1:
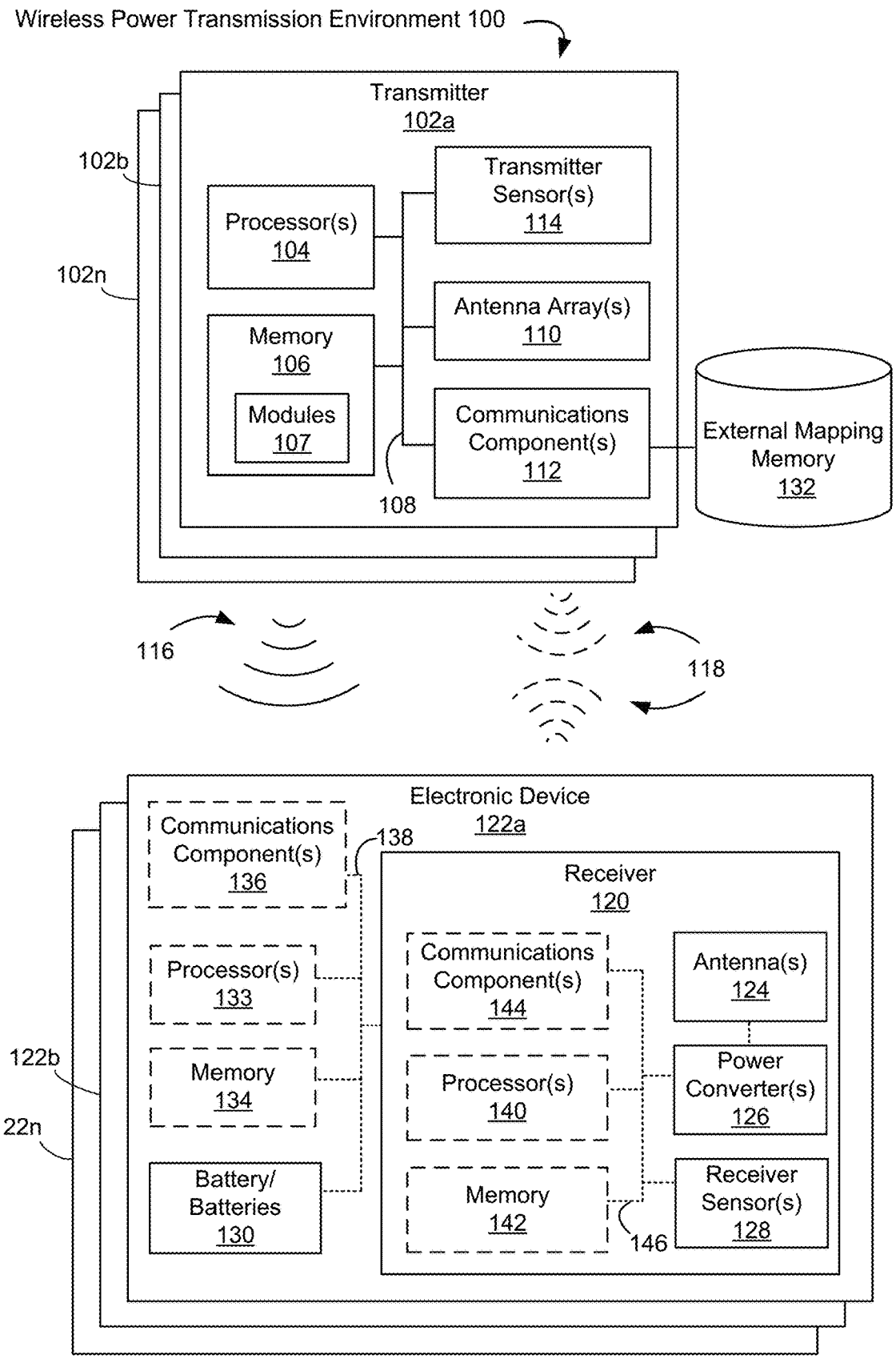
FIG. 1 is a block diagram illustrating a representative wireless power transmission system in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here. Furthermore, the various components and embodiments described herein may be combined to form additional embodiments not expressly described, without departing from the spirit or scope of the invention.

Reference will now be made to the exemplary embodiments illustrated in the drawings, and specific language will be used here to describe the same. It will nevertheless be understood that no limitation of the scope of the invention is thereby intended. Alterations and further modifications of the inventive features illustrated here, and additional applications of the principles of the inventions as illustrated here, which would occur to one skilled in the relevant art and having possession of this disclosure, are to be considered within the scope of the invention.

FIG. 1 is a block diagram illustrating a representative wireless power transmission system 100 in accordance with some embodiments. In accordance with some embodiments, the wireless power transmission system 100 includes transmitters 102 (e.g., transmitters 102a, 102b ... 102n) and a receiver 120. In some embodiments, the wireless power transmission environment 100 includes multiple receivers 120, each of which is associated with (e.g., coupled to) a respective electronic device 122.

In accordance with some embodiments, the transmitter 102 (e.g., transmitter 102a) includes processor(s) 104, memory 106, one or more antenna array(s) 110, communications component(s) 112, and one or more transmitter sensor(s) 114 interconnected via a communications bus 108. References to these components of transmitters 102 cover embodiments in which one or more than one of each of these components (and combinations thereof) are included.

In some embodiments, a single processor 104 (e.g., processor 104 of transmitter 102a) executes software modules for controlling multiple transmitters 102 (e.g., transmitters 102b ... 102n). In some embodiments, a single transmitter 102 (e.g., transmitter 102a) includes multiple processors 104 such as one or more transmitter processors (e.g., configured to control transmission of signals 116 by antenna(s) 110), one or more communications component processors (e.g., configured to control communications transmitted by the communications component(s) 112 and/or receive communications via the communications component(s) 112), and/or one or more sensor processors (e.g., configured to control operation of the transmitter sensor(s) 114 and/or receive output from the transmitter sensor(s) 114).

The receiver 120 receives the power signals 116 and/or the communication signals 118 transmitted by the transmitters 102. In some embodiments, the receiver 120 includes one or more rectennas 124 (e.g., an antenna array including multiple antenna elements and one or more rectifier elements), a power converter 126, a receiver sensor 128, and/or other components or circuitry (e.g., processor(s) 140, memory 142, and/or communications component(s) 144). References to these components of receiver 120 cover embodiments in which one or more than one of each of these components (and combinations thereof) are included. The receiver 120 converts energy from the received signals 116 (e.g., power waves) into electrical energy to power and/or charge the electronic device 122. For example, the receiver 120 uses the power converter 126 to convert captured energy from the power waves 116 to alternating current (AC) electricity or to direct current (DC) electricity usable to power and/or charge the electronic device 122. In some embodiments, the power converter 126 include at least one rectifier, while in some other embodiments, the antenna(s) 1254 and the power converter(s) 126 include at least one rectenna (i.e., a combination of an antenna and rectifier). Non-limiting examples of the power converter 126 include rectifiers, rectifying circuits, and voltage conditioners, among other suitable circuitry and devices.

In some embodiments, receiver 120 is a standalone device that is detachably coupled to one or more electronic devices 122. For example, electronic device 122 has processor(s) 133 for controlling one or more functions of electronic device 122 and receiver 120 has processor(s) 140 for controlling one or more functions of receiver 120.

In some embodiments, as shown, receiver 120 is a component of electronic device 122. For example, processor(s) 133 controls functions of electronic device 122 and receiver 120.

In some embodiments, electronic device 122 includes processor(s) 133, memory 134, communications component(s) 136, and/or battery/batteries 130. In some embodiments, these components are interconnected by way of a communications bus 138. In some embodiments, communications between electronic device 122 and receiver 120 occur via communications component(s) 136 and/or 144. In some embodiments, communications between electronic device 122 and receiver 120 occur via a wired connection between communications bus 138 and communications bus 146. In some embodiments, electronic device 122 and receiver 120 share a single communications bus.

In some embodiments, the receiver 120 receives one or more power waves 116 directly from the transmitter 102. In some embodiments, the receiver 120 harvests energy from one or more pockets of energy created by one or more power waves 116 transmitted by the transmitter 102.

In some embodiments, after the power waves 116 are received and/or energy is harvested from a pocket of energy, circuitry (e.g., integrated circuits, amplifiers, rectifiers, and/or voltage conditioner) of the receiver 120 converts the energy of the power waves (e.g., radio frequency electromagnetic radiation) to a suitable form (e.g., electricity) for powering the electronic device 122 and/or storage in a battery 130 of the electronic device 122. In some embodiments, a rectifying circuit of the receiver 120 translates the electrical energy from AC to DC for use by the electronic device 122. In some embodiments, a voltage conditioning circuit increases or decreases the voltage of the electrical energy as required by the electronic device 122. In some embodiments, an electrical relay conveys electrical energy from the receiver 120 to the electronic device 122.

In some embodiments, the receiver 120 is a component of the electronic device 122. In some embodiments, a receiver 120 is coupled (e.g., detachably coupled) to the electronic device 122. In some embodiments, the electronic device 122 is a peripheral device of receiver 120. In some embodiments, the electronic device 122 obtains power from multiple transmitters 102. In some embodiments, the electronic device 122 is coupled to) multiple receivers 120. In some embodiments, the wireless power transmission system 100 includes a plurality of electronic devices 122, each having at least one respective receiver 120 that is used to harvest power waves from the transmitters 102 and provide usable power for charging/powering the electronic devices 122.

In some embodiments, the one or more transmitters 102 adjust one or more characteristics (e.g., phase, gain, direction, and/or frequency) of power waves 116. For example, a particular transmitter 102 (e.g., transmitter 102a) selects a subset of one or more antenna elements of antenna(s) 110 to initiate transmission of the power waves 116, cease transmission of the power waves 116, and/or adjust one or more characteristics used to transmit the power waves 116. In some embodiments, the one or more transmitters 102 adjust the power waves 116 such that trajectories of the power waves 116 converge at a predetermined location within a transmission field (e.g., a location or region in space), resulting in controlled constructive or destructive interference patterns.

In some embodiments, respective antenna array(s) 110 of the one or more transmitters 102 optionally include a set of one or more antennas configured to transmit the power waves 116 into respective transmission fields of the one or more transmitters 102. In some embodiments, integrated circuits (not shown) of the respective transmitter 102, such as a controller circuit and/or waveform generator, control the behavior of the antenna(s). For example, based on the information received from the receiver 120 via the communications signal 118, a controller circuit determines a set of one or more characteristics or waveform characteristics (e.g., amplitude, frequency, trajectory, phase, among other characteristics) used for transmitting power waves that effectively provide power to the receiver 120. In some embodiments, the controller circuit identifies a subset of antennas from the antenna(s) 110 that would be effective in transmitting the power waves 116. As another example, a waveform generator circuit of the respective transmitter 102 (e.g., coupled to the processor 104) converts energy and generates the power waves 116 having the waveform characteristics identified by the controller, and then provides the power waves to the antenna array(s) 110 for transmission.

In some instances, constructive interference of power waves occurs when two or more power waves 116 are in phase with each other and converge into a combined wave such that an amplitude of the combined wave is greater than amplitude of a single one of the power waves. For example the positive and negative peaks of sinusoidal waveforms arriving at a location from multiple antennas "add together" to create larger positive and negative peaks. In some instances and embodiments, a pocket of energy is formed at a location in a transmission field where constructive interference of power waves occurs.

In some instances, destructive interference of power waves occurs when two or more power waves are out of phase and converge into a combined wave such that the amplitude of the combined wave is less than the amplitude of a single one of the power waves. For example, the power waves "cancel each other out," thereby diminishing the amount of energy concentrated at a location in the transmission field. In some embodiments, destructive interference is used to generate a negligible amount of energy or "null" at a location within the transmission field where the power waves converge.

In some embodiments, the one or more transmitters 102 transmit power waves 116 that create two or more discrete transmission fields (e.g., overlapping and/or non-overlapping discrete transmission fields). In some embodiments, a first transmission field is managed by a first processor 104 of a first transmitter (e.g. transmitter 102a) and a second transmission field is managed by a second processor 104 of a second transmitter (e.g., transmitter 102b). In some embodiments, the two or more discrete transmission fields (e.g., overlapping and/or non-overlapping) are managed by the transmitter processors 104 as a single transmission field.

In some embodiments, the communications component(s) 112 transmit communication signals 118 via a wired and/or wireless communication connection to receiver 120. In some embodiments, the communications component 112 generates communications signals 118 to determine positioning of the receiver 120 (e.g., via triangulation). In some embodiments, the communication signals 118 are used to convey information between the transmitter 102 and the receiver 120. In some embodiments, the conveyed information is used for adjusting one or more characteristics used to transmit the power waves 116. In some embodiments, the communications signals 118 relay information related to device status, efficiency, user data, power consumption, billing, geo-location, and/or other types of information.

In some embodiments, the receiver 120 includes a transmitter (not shown), or is a part of a transceiver, that transmits communications signals 118 to communications component 112 of transmitter 102.

In some embodiments, the communications component 112 (e.g., communications component 112 of transmitter 102a) includes a communications component antenna for communicating with the receiver 120, other transmitters 102 (e.g., transmitters 102b through 102n), and/or other remote devices. In some embodiments, these communications signals 118 represent a distinct channel of signals transmitted by transmitter 102, independent from a channel of signals used for transmission of the power waves 116.

In some embodiments, the receiver 120 includes a receiver-side communications component (not shown) configured to communicate various types of data with one or more of the transmitters 102, through a respective communications signal 118 generated by the receiver-side communications component. The data optionally includes location indicators for the receiver 120 and/or the electronic device 122, a power status of the device 122, status information for the receiver 120, status information for the electronic device 122, status information regarding the power waves 116, and/or status information for pocket(s) of energy. In some embodiments, the receiver 120 provides data to the transmitter 101, via the communications signal 118, regarding the current operation of the system 100, including one or more of: information identifying a present location of the receiver 120 or the device 122, an amount of energy received by the receiver 120, and an amount of power received and/or used by the electronic device 122, among other possible types of information.

In some embodiments, the data contained within communications signals 118 is used by electronic device 122, receiver 120, and/or transmitters 102 for determining adjustments of the one or more characteristics used by the antenna(s) 110 to transmit the power waves 116. For example, using a communications signal 118, the transmitter 102 communicates data that is used to identify the receiver(s) 120 within a transmission field, identify the electronic device(s) 122, determine safe and effective waveform characteristics for power waves, and/or hone the placement of pockets of energy. In some embodiments, the receiver 120 uses a communications signal 118 to communicate data for alerting transmitters 102 that the receiver 120 has entered or is about to enter a transmission field, provide information about electronic device 122, provide user information that corresponds to electronic device 122, indicate the effectiveness of received power waves 116, and/or provide updated characteristics or transmission parameters that the one or more transmitters 102 use to adjust transmission of the power waves 116.

As an example, the communications component 112 of the transmitter 102 communicates (e.g., transmits and/or receives) one or more types of data (such as authentication data and/or transmission parameters) including various information such as a beacon message, a transmitter identifier, a device identifier for an electronic device 122, a user identifier, a charge level for the electronic device 122, a location of receiver 120 in a transmission field, and/or a location of the electronic device 122 in a transmission field.

In some embodiments, the transmitter sensor 114 and/or the receiver sensor 128 detect and/or identify conditions of the electronic device 122, the receiver 120, the transmitter 102, and/or a transmission field. In some embodiments, data generated by the transmitter sensor 114 and/or the receiver sensor 128 is used by the transmitter 102 to determine appropriate adjustments to the one or more characteristics used to transmit the power waves 116. In some embodiments, data from the transmitter sensor 114 and/or the receiver sensor 128 received by transmitter 102 includes raw sensor data and/or sensor data processed by a processor, such as a sensor processor. In some embodiments, the processed sensor data includes determinations based upon sensor data output. In some embodiments, sensor data is received from sensors that are external to the receiver 120 and the transmitters 102 (such as thermal imaging data, information from optical sensors, and others).

In some embodiments, the receiver sensor(s) 128 include a gyroscope that provides raw data such as orientation data (e.g., tri-axial orientation data). In some embodiments, processing this raw data includes determining a location of receiver 120 and/or a location of receiver antenna 124 using the orientation data.

In some embodiments, the receiver sensor(s) 128 include one or more infrared sensors (e.g., that output thermal imaging information), and processing this infrared sensor data includes identifying a person (e.g., indicating presence of the person and/or indicating an identification of the person) or other sensitive object based upon the thermal imaging information.

In some embodiments, the receiver sensor(s) 128 includes a gyroscope and/or an accelerometer that indicates an orientation of the receiver 120 and/or the electronic device 122. As an example, transmitter(s) 102 receive orientation information from the receiver sensor 128 and the transmitter(s) 102 (or a component thereof, such as the processor 104) uses the received orientation information to determine whether the electronic device 122 is flat on a table, in motion, and/or in use (e.g., near to a user's ear).

In some embodiments, the receiver sensor 128 is a sensor of the electronic device 122 (e.g., an electronic device 122 that is remote from receiver 120). In some embodiments, the receiver 120 and/or the electronic device 122 includes a communication system for transmitting signals (e.g., sensor signals output by the receiver sensor 128) to the transmitter 102.

Non-limiting examples of transmitter sensor 114 and/or receiver sensor 128 include infrared/pyro-electric sensors, ultrasonic sensors, laser sensors, optical sensors, Doppler sensors, gyro sensors, accelerometers, microwave sensors, millimeter sensors, RF standing-wave sensors, resonant LC sensors, capacitive sensors, and/or inductive sensors. In some embodiments, technologies for the transmitter sensor 114 and/or the receiver sensor 128 include binary sensors that acquire stereoscopic sensor data, such as the location of a human or other sensitive object.

In some embodiments, the transmitter sensor 114 and/or the receiver sensor 128 is configured for human recognition (e.g., is capable of distinguishing between a person and other objects, such as furniture) and/or human identification (e.g., is capable of distinguishing between two persons). Examples of sensor data output by human recognition-enabled sensors include: body temperature data, infrared range-finder data, motion data, activity recognition data, silhouette detection and recognition data, gesture data, heart rate data, portable devices data, and wearable device data (e.g., biometric readings and output, accelerometer data).

In some embodiments, the transmitters 102 adjust one or more characteristics used to transmit the power waves 116 to ensure compliance with electromagnetic field (EMF) exposure protection standards for human subjects. Maximum exposure limits are defined by US and European standards in terms of power density limits and electric field limits (as well as magnetic field limits). These include, for example, limits established by the Federal Communications Commission (FCC) for MPE, and limits established by European regulators for radiation exposure. Limits established by the FCC for MPE are codified at 47 CFR § 1.1310. For electromagnetic field (EMF) frequencies in the microwave range, power density can be used to express an intensity of exposure. Power density is defined as power per unit area. For example, power density can be commonly expressed in terms of watts per square meter ($W/m^2$), milliwatts per square centimeter ($mW/cm^2$), or microwatts per square centimeter ($\mu W/cm^2$). In some embodiments, output from transmitter sensor 114 and/or receiver sensor 128 is used by transmitter 102 to detect whether a person or other sensitive object enters a power transmission region (e.g., a location within a predetermined distance of a transmitter 102, power waves generated by transmitter 102, and/or a pocket of energy). In some embodiments, in response to detecting that a person or other sensitive object has entered the power transmission region, the transmitter 102 adjusts one or more power waves 116 (e.g., by ceasing power wave transmission, reducing power wave transmission, and/or adjusting the one or more characteristics of the power waves). In some embodiments, in response to detecting that a person or other sensitive object has entered the power transmission region, the transmitter 102 activates an alarm (e.g., by transmitting a signal to a loudspeaker that is a component of transmitter 102 or to an alarm device that is remote from transmitter 102). In some embodiments, in response to detecting that a person or other sensitive object has entered a power transmission region, the transmitter 102 transmits a digital message to a system log or administrative computing device.

In some embodiments, the antenna array(s) 110 includes multiple antenna elements (e.g., configurable "tiles") collectively forming an antenna array. In various embodiments, the antenna(s) 110 generate RF power waves, ultrasonic power waves, infrared power waves, and/or magnetic resonance power waves. In some embodiments, the antenna(s) 110 (e.g., of a single transmitter, such as transmitter 102a, and/or of multiple transmitters, such as transmitters 102a, 102b, . . . , 102n) transmit two or more power waves that intersect at a defined location (e.g., a location corresponding to a detected location of a receiver 120), thereby forming a pocket of energy at the defined location.

In some embodiments, transmitter 102 assigns a first task to a first subset of antenna elements of antenna(s) 110, a second task to a second subset of antenna elements of antenna(s) 110, and so on, such that the constituent antennas of antenna(s) 110 perform different tasks (e.g., determining locations of previously undetected receivers 120 and/or transmitting power waves 116 to one or more receivers 120). As one example, the antenna(s) 110 includes ten antennas, nine antennas transmit power waves 116 that form a pocket of energy and the tenth antenna operates in conjunction with communications component 112 to identify new receivers in the transmission field. In another example, the antenna(s) 110 includes ten antenna elements is split into two groups of five antenna elements, each of which transmits power waves 116 to two different receivers 120 in the transmission field.

In some embodiments, a device for wirelessly charging a battery includes a transmitter unit having a transmitter and an antenna unit comprising the antenna array in communication with the transmitter. In some embodiments, the antenna unit is configured to transmit a wireless signal for use in charging a battery. The battery may be in a wearable device such as a smart watch, or a mobile device such as a smart phone. In some embodiments, the wireless signal is used for operating an electronic device. In some embodiments, the antenna unit is configured as a linear array. In some embodiments, the linear array is longer than 2 feet. In some embodiments, the linear array is formed from multiple linear subarrays with spaces between the multiple linear subarrays. The antenna unit comprising the array of antennas may be configured as a matrix. In some embodiments, the antenna elements are regularly spaced. In some embodiments, the antenna elements are variably or irregularly spaced. In some embodiments, the antenna elements are grouped into sub-arrays, and the sub-arrays are selectable for transmitting wireless power signals by the selected sub-arrays. In some embodiments, the antenna elements are individually selectable. In some embodiments, a processing unit (e.g., processor(s) 104) is configured to cause a transmitter to generate and transmit a wireless transmission signal via the antenna element(s).

Figure 2A:
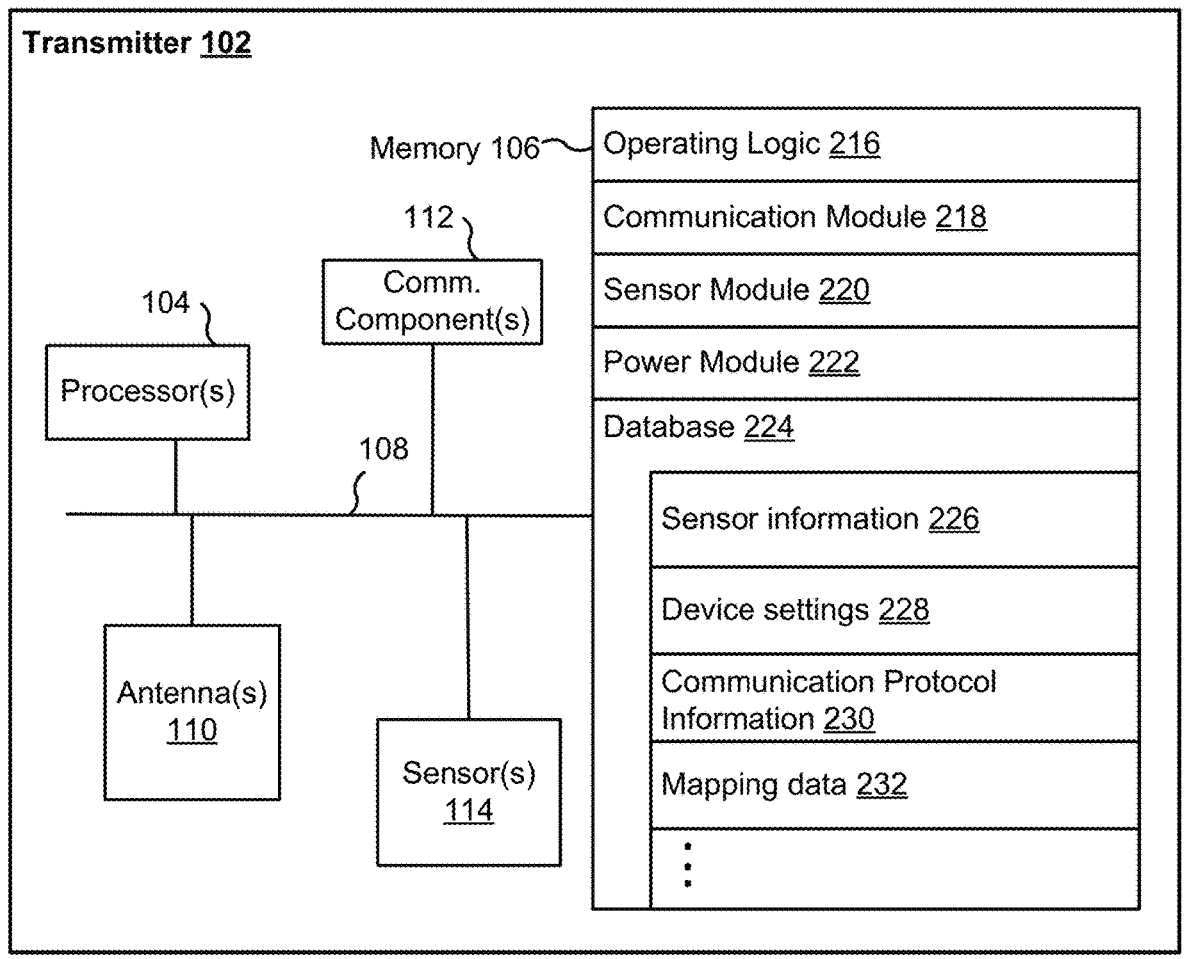
FIG. 2A is a block diagram illustrating a representative transmitter device in accordance with some embodiments.

FIG. 2A is a block diagram illustrating a representative transmitter device 102 (also sometimes referred to herein as a transmitter) in accordance with some embodiments. In some embodiments, the transmitter device 102 includes one or more processing units (e.g., CPUs, ASICs, FPGAs, microprocessors, and the like) 104, one or more communications components 112, memory 106, antenna(s) 110, and one or more communication buses 108 for interconnecting these components (sometimes called a chipset). In some embodiments, the transmitter device 102 includes one or more sensor(s) 114 as described above with reference to FIG. 1. In some embodiments, the transmitter device 102 includes one or more output devices such as one or more indicator lights, a sound card, a speaker, a small display for displaying textual information and error codes, etc. In some embodiments, the transmitter device 102 includes a location detection device, such as a GPS (global positioning satellite) or other geo-location receiver, for determining the location of the transmitter device 102. In some embodiments, the antenna(s) 110 include one or more multi-band antennas (such as those described below in reference to FIGS. 3-5B).

In various embodiments, the one or more sensor(s) 114 include one or more thermal radiation sensors, ambient temperature sensors, humidity sensors, IR sensors, occupancy sensors (e.g., RFID sensors), ambient light sensors, motion detectors, accelerometers, and/or gyroscopes.

The communications component(s) 112 enable communication between the transmitter 102 and one or more communication networks. In some embodiments, the communications component(s) 112 include, e.g., hardware capable of data communications using any of a variety of wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) wired protocols (e.g., Ethernet, HomePlug, etc.), and/or any other suitable communication protocol, including communication protocols not yet developed as of the filing date of this document.

The memory 106 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 106, or alternatively the non-volatile memory within memory 106, includes a non-transitory computer-readable storage medium. In some embodiments, the memory 106, or the non-transitory computer-readable storage medium of the memory 106, stores the following programs, modules, and data structures, or a subset or superset thereof:

- Operating logic 216 including procedures for handling various basic system services and for performing hardware dependent tasks;
- Communication module 218 for coupling to and/or communicating with remote devices (e.g., remote sensors, transmitters, receivers, servers, mapping memories, etc.) in conjunction with communications component(s) 112;
- Sensor module 220 for obtaining and processing sensor data (e.g., in conjunction with sensor(s) 114) to, for example, determine the presence, velocity, and/or positioning of object in the vicinity of the transmitter 102;
- Power-wave generating module 222 for generating and transmitting (e.g., in conjunction with antenna(s) 110) power waves, including but not limited to, forming pocket(s) of energy at given locations; and
- Database 224, including but not limited to:
  - Sensor information 226 for storing and managing data received, detected, and/or transmitted by one or more sensors (e.g., sensors 114 and/or one or more remote sensors);
  - Device settings 228 for storing operational settings for the transmitter 102 and/or one or more remote devices;
  - Communication protocol information 230 for storing and managing protocol information for one or more protocols (e.g., custom or standard wireless protocols, such as ZigBee, Z-Wave, etc., and/or custom or standard wired protocols, such as Ethernet); and
  - Mapping data 232 for storing and managing mapping data (e.g., mapping one or more transmission fields).

Each of the above-identified elements (e.g., modules stored in memory 106 of the transmitter 102) are optionally stored in one or more of the previously mentioned memory devices, and corresponds to a set of instructions for performing the function(s) described above. The above identified modules or programs (e.g., sets of instructions) need not be implemented as separate software programs, procedures, or modules, and thus various subsets of these modules are optionally combined or otherwise rearranged in various embodiments. In some embodiments, the memory 106, optionally, stores a subset of the modules and data structures identified above. Furthermore, the memory 106, optionally, stores additional modules and data structures not described above, such as a tracking module for tracking the movement and positioning of objects within a transmission field.

In some instances and embodiments, the transmitter(s) 102 are positioned in households and commercial settings, such as conference rooms, where it is necessary and/or preferable that the transmitter(s) 102 are sized in a manner that results in a small footprint and/or profile. Although the size of the footprint (e.g., width of overall antenna arrays) in some embodiments has to have a certain length for creating the energy pockets at various distances, the profiles (e.g., length of the antenna elements along the z-axis, which defines the distance that the transmitters 102 extend from a wall) is optionally reduced to be more viable for use by consumers and businesses.

Figure 2B:
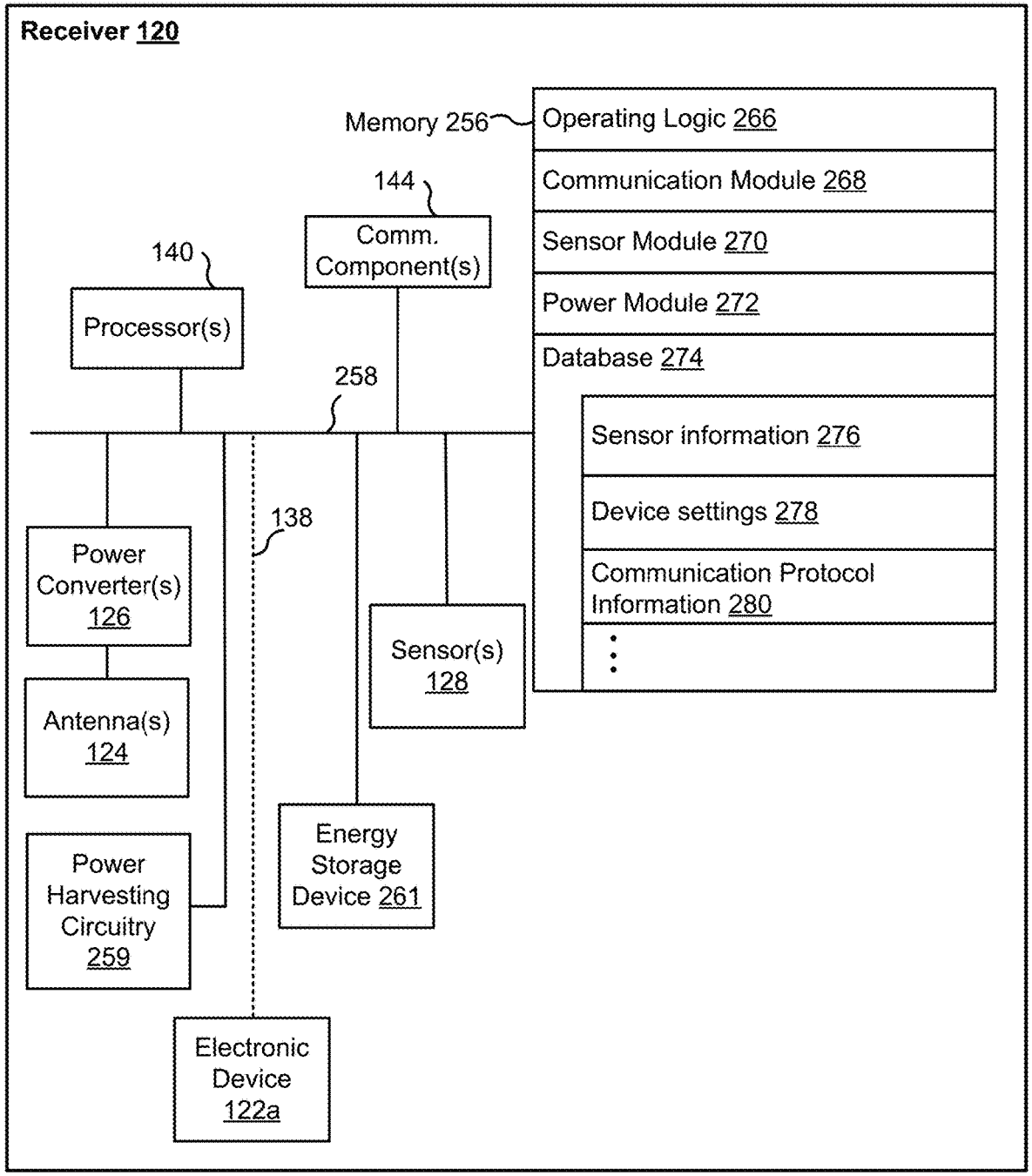
FIG. 2B is a block diagram illustrating a representative receiver device in accordance with some embodiments.

FIG. 2B is a block diagram illustrating a representative receiver device 120 (also sometimes called a receiver) in accordance with some embodiments. In some embodiments, the receiver device 120 includes one or more processing units (e.g., CPUs, ASICs, FPGAs, microprocessors, and the like) 140, one or more communications components 144, memory 256, antenna(s) 124, power converter(s) 126, power harvesting circuitry 259, and one or more communication buses 258 for interconnecting these components (sometimes called a chipset). In some embodiments, the receiver device 120 includes one or more sensor(s) 128 such as one or sensors described above with reference to FIG. 1. In some embodiments, the receiver device 120 includes an energy storage device 261 for storing energy harvested via the power harvesting circuitry 259. In various embodiments, the energy storage device 261 includes one or more batteries (e.g., battery 130, FIG. 1), one or more capacitors, one or more inductors, and the like.

As described above in reference to FIG. 1, in some embodiments, the receiver 120 is internally or externally connected to an electronic device (e.g., electronic device 122a, FIG. 1) via a connection (e.g., a bus) 138.

In some embodiments, the power harvesting circuitry 259 includes one or more rectifying circuits and/or one or more power converters. In some embodiments, the power harvesting circuitry 259 includes one or more components (e.g., a power converter 126) configured to convert energy from power waves and/or energy pockets to electrical energy (e.g., electricity). In some embodiments, the power harvesting circuitry 259 is further configured to supply power to a coupled electronic device (e.g., an electronic device 122), such as a laptop or phone. In some embodiments, supplying power to a coupled electronic device include translating electrical energy from an AC form to a DC form (e.g., usable by the electronic device 122). In some embodiments, the antenna(s) 124 include one or more multi-band antennas (such as those described below in reference to FIGS. 3-5B).

In some embodiments, the receiver device 120 includes one or more output devices such as one or more indicator lights, a sound card, a speaker, a small display for displaying textual information and error codes, etc. (in some embodiments, the receiver device 120 sends information for display at an output device of an associated electronic device). In some embodiments, the receiver device 120 includes a location detection device, such as a GPS (global positioning satellite) or other geo-location receiver, for determining the location of the receiver device 120.

In various embodiments, the one or more sensor(s) 128 include one or more thermal radiation sensors, ambient temperature sensors, humidity sensors, IR sensors, occupancy sensors (e.g., RFID sensors), ambient light sensors, motion detectors, accelerometers, and/or gyroscopes.

The communications component(s) 144 enable communication between the receiver 120 and one or more communications networks. In some embodiments, the communications component(s) 144 include, e.g., hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document.

The memory 256 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 256, or alternatively the non-volatile memory within memory 256, includes a non-transitory computer-readable storage medium. In some embodiments, the memory 256, or the non-transitory computer-readable storage medium of the memory 256, stores the following programs, modules, and data structures, or a subset or superset thereof:

Operating logic 266 including procedures for handling various basic system services and for performing hardware dependent tasks;

Communication module 268 for coupling to and/or communicating with remote devices (e.g., remote sensors, transmitters, receivers, servers, mapping memories, etc.) in conjunction with communications component(s) 144;

Sensor module 270 for obtaining and processing sensor data (e.g., in conjunction with sensor(s) 128) to, for example, determine the presence, velocity, and/or positioning of the receiver 120, a transmitter 102, or an object in the vicinity of the receiver 120;

Wireless power-receiving module 272 for receiving (e.g., in conjunction with antenna(s) 124 and/or power harvesting circuitry 259) energy from power waves and/or energy pockets; optionally converting (e.g., in conjunction with power harvesting circuitry 259) the energy (e.g., to direct current); transferring the energy to a coupled electronic device (e.g., an electronic device 122); and optionally storing the energy (e.g., in conjunction with energy storage device 261); and Database 274, including but not limited to:
  Sensor information 276 for storing and managing data received, detected, and/or transmitted by one or more sensors (e.g., sensors 128 and/or one or more remote sensors);
  Device settings 278 for storing operational settings for the receiver 120, a coupled electronic device (e.g., an electronic device 122), and/or one or more remote devices; and
  Communication protocol information 280 for storing and managing protocol information for one or more protocols (e.g., custom or standard wireless protocols, such as ZigBee, Z-Wave, etc., and/or custom or standard wired protocols, such as Ethernet).

Each of the above identified elements (e.g., modules stored in memory 256 of the receiver 120) are optionally stored in one or more of the previously mentioned memory devices, and corresponds to a set of instructions for performing the function(s) described above. The above identified modules or programs (e.g., sets of instructions) need not be implemented as separate software programs, procedures, or modules, and thus various subsets of these modules are optionally combined or otherwise rearranged in various embodiments. In some embodiments, the memory 256, optionally, stores a subset of the modules and data structures identified above. Furthermore, the memory 256, optionally, stores additional modules and data structures not described above, such as an identifying module for identifying a device type of a connected device (e.g., a device type for an electronic device 122).

In some embodiments, the antennas (e.g., antenna(s) 110 and/or antenna(s) 124) have orientations that cause the wireless power signals 116 to be transmitted at different polarizations depending on an orientation of the electronic device with respect to the antennas. For example, in accordance with some embodiments, the receiver 120 includes a monopole or a dipole antenna so that orientation of the receiver 120 with respect to the antenna(s) 110 has minimal impact on the amount of power that is received from the wireless power signals 116.

A wireless power receiver may include a rectifier to rectify alternating current (AC) received at one or more antennas of the receiver to direct current (DC). Conventional rectifiers may use diodes for rectifying AC to DC. As such, a conventional rectifier may operate as follows: a diode may operate like a valve for electric current and allows the flow of the current in one direction and opposes the flow of the current in other direction. Therefore, for a load that is configured to operate using DC, a diode may be placed in between an AC source and the load. When the AC is flowing in a first direction, the diode may be forward biased (i.e. may operate as a closed switch) to allow the current to flow through the load; and when the AC is flowing in a second direction that is opposite to the first direction, the diode may be reverse biased (i.e. may operate as an open switch) such that no current flows through the load. Therefore, a unidirectional current without a change in polarity may flow through the load.

As mentioned above, in some embodiments the power converter(s) 126 of FIGS. 1 and 2B, include one or more rectifiers or rectennas (i.e., antennas with rectifiers). Conventional rectifiers are often bridge rectifiers or the like that use a series of diodes arranged so that the output from the rectifier is always a positive signal (e.g., a DC signal), regardless of the incoming signal's polarity (e.g., an AC signal). Diodes, however, are lossy components in an electrical circuit, and may consume a significant amount of the power that they are being implemented to rectify. Generally, a typical diode may have a threshold voltage of 0.7 V, i.e., it may consume about 0.7 V to be forward biased. Consequently, there is a lossy voltage drop across a diode when a current is flowing through the diode of about 0.7 V.

In light of this issue, there is a need a rectifier with a lower loss of voltage and that consumes significantly less power compared to the conventional diode-based rectifiers. Moreover, as diodes heat-up, their performance suffers. Other systems may use a transistor as a switching device, but these systems typically require a separate power source to bias the gate of the transistor. FIG. 3B shows the characteristics of a current vs. voltage relationship for a typical diode. A bias voltage level must be reached before current flows when the diode is positively biased. Below the bias voltage or when the diode is negatively biased, no current flows through it. While not a typical operational setup for a diode, there is a breakdown voltage when a diode is negatively biased beyond a voltage at which the diode characteristics described here break down and the current flows in the reverse direction.

Figure 3A:
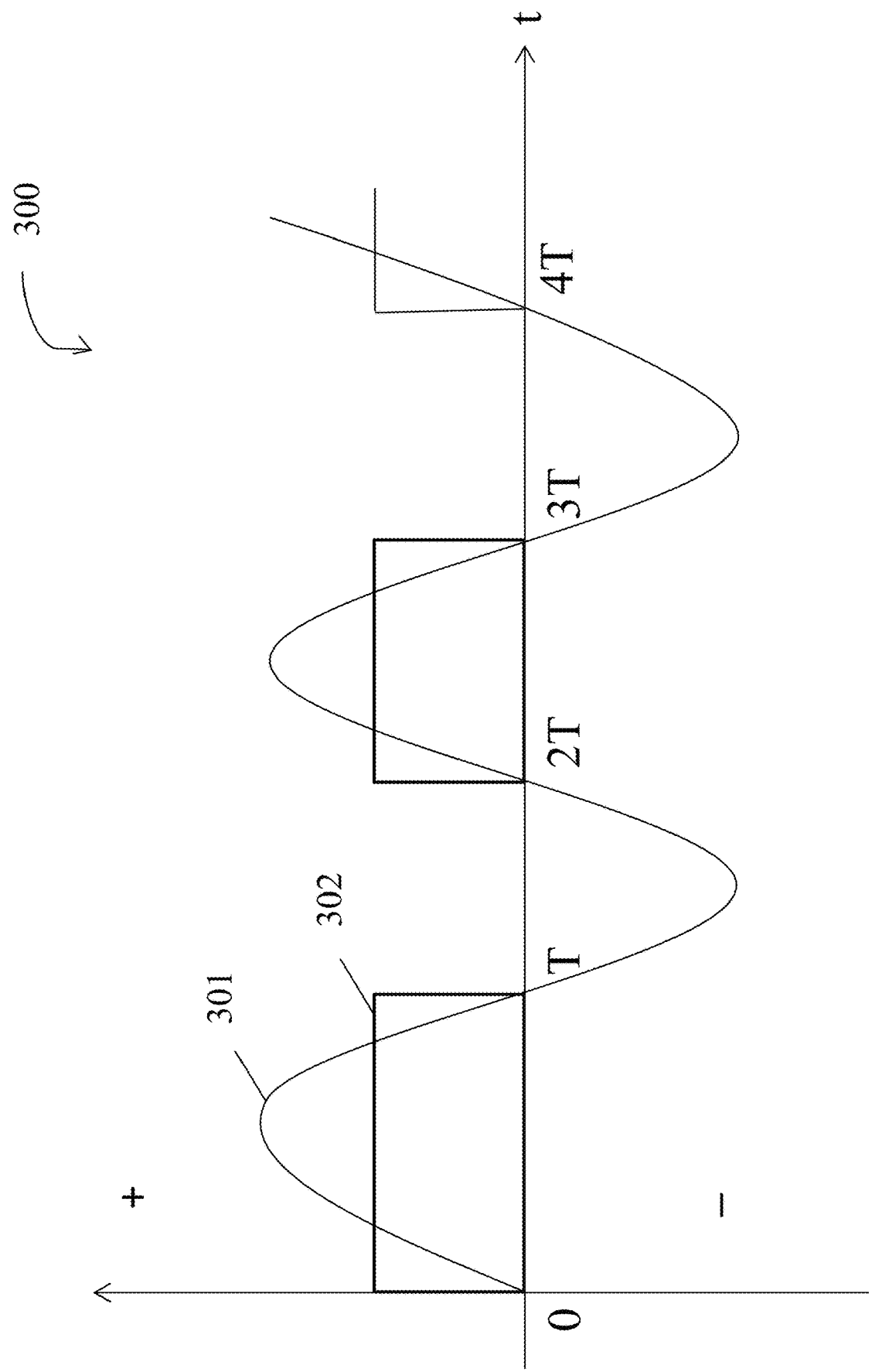
FIG. 3A schematically illustrates a synchronized switching of a switching device in a rectifier, according an exemplary embodiment.
Figure 3B:
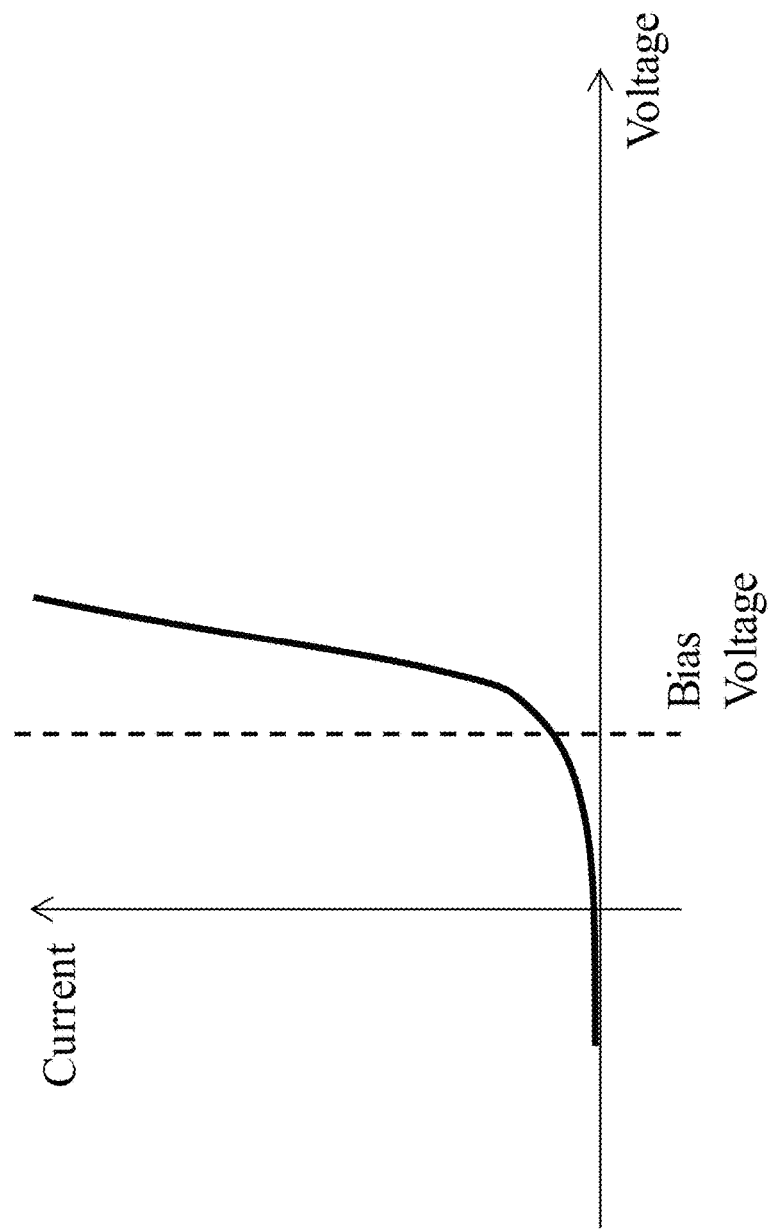
FIG. 3B shows prior art diode characteristics.
Figure 3C:
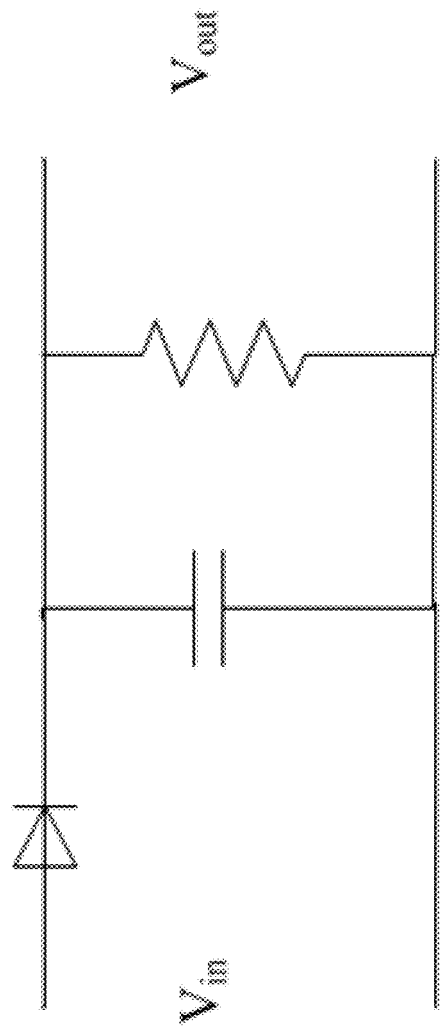
FIG. 3C shows a prior art half-wave rectifier with a diode.

FIG. 3C shows the typical implementation of a half-wave rectifier using a diode. FIG. 3D shows the input output voltage relationship for a half-wave rectifier using the circuitry of FIG. 3C. Due to the bias voltage required to turn on a diode (i.e., the voltage required to allow current to flow through the diode), and due to the voltage drop across the diode, there is a loss of energy incurred. FIG. 3D shows the loss due to the bias voltage as well as the voltage drop across the diode. The embodiments disclosed herein negate or reduce this loss by using field-effect transistors (FETs) rather than diodes in rectifier implementation.

In applications where a wirelessly received waveform is rectified, there may be a need to synchronize the switching points in the rectifier with the received waveform. To synchronize the switching with the voltage waveform generated by a receiving antenna, the received voltage is tapped-off by a tap-line and it is used to bias the FET. E.g., in a Class-E amplifier. In other words, the voltage waveform generated in the antenna is fed forward by the feed-forward tap-line such that the FET switches synchronously with the received AC voltage waveform. In some embodiments, the rectifiers described herein use a Class-E amplifier as a switching device.

In some embodiments, the tap-line is a micro-strip of a preselected length. The length is selected such that the voltage waveform biases the FET synchronous with the voltage waveform arriving at the drain of the FET. For example, in some embodiments, the voltage waveform arriving at the gate of the FET is 180 degrees phase shifted from the voltage waveform arriving at the drain of the FET. Therefore, during the positive cycle of the AC voltage, wherein the AC power source has a positive voltage, i.e. higher potential than the ground, the FET operates as an open switch, thereby having no conduction path through the FET. As the current cannot pass through the FET in the positive cycle, the current passes through the load. However, during the negative cycle of the AC voltage, wherein the AC power source has a negative voltage, i.e. lower potential than the ground, the FET operates as a closed switch, thereby providing a path of least resistance for a current from the ground to the AC voltage of the drain. Therefore, the current flows from the ground towards the power source, in other words the drain, through the FET. A resistive load may not provide the path of least resistance, and therefore the current does not flow through the load in the negative cycle of the AC voltage. IN some embodiments, during the negative cycle of the AC voltage, the charge from the current from the ground towards the power source is stored at one or more capacitors, and the stored charge is used during the positive cycle of the AC voltage.

In some embodiments, a feed-forward controller circuit is used to control the phase of the voltage waveform passing through the tap-line to the gate of the FET. For example, in some embodiments, the controller circuit is a LC circuit introducing the requisite amount of phase delay such that the zero-crossings of the feed-forward voltage waveforms at the gate of the FET match with the zero-crossings of the voltage waveform seen by the drain of the FET. In some embodiments, the feed-forward controller circuit is programmable.

In some embodiments, the phase of feed-forward voltage is controlled such that the transistor switches asynchronously with the received waveform. By doing so, a portion of the received power is rectified to be transferred to the load. The remaining power is reflected back to the antenna or sent to the ground such that the circuit components do not heat up due the excess amount of unused power. In other embodiments, the phase of the feed-forward voltage is controlled such that the switching of the transistor does not allow for any rectification of the received power.

Although the figures and description below describe an electrical ground for the sake of brevity, one ordinarily skilled in the art should appreciate that the ground may refer to an equipotential surface.

FIG. 3A schematically illustrates a synchronized switching 300 of a switching device in a rectifier. An incoming alternating current (AC) or radio frequency (RF) wave 301 may reverse the polarity in every time period T. For example, for a 5.8 GHz wave has $5.8*10^9$ cycles every second, and therefore the number of times the polarity switched per second is $2*5.8*10^9$. In this case, the time period T is approximately $8.62*10^{-11}$ seconds, or 86.2 picoseconds. To be synchronous with the polarity reversal, the switching device may have to switch between the two states at the time the polarity of the RF wave 301 reverses. As shown in the timing graph 302, for example a bias-voltage, for the switching device, may also switch the state every T time period. In the context of rectifying a wirelessly received waveform, for example an RF waveform, in addition to the time period T, the switching device may switch between its states at the same time the polarity of the RF wave 301 is reversed. For a load configured to operate using the positive polarity of the RF wave 301, the switching device may close a circuit providing a current to the load, and may open the circuit such that no current flows to the load. The switching device may open the circuit or may close the circuit based on a bias voltage provided to the switching device. Therefore, to achieve an efficient switching, the bias voltage may have to be synchronized with the phase of the RF wave 301 such that the switching device switches exactly at the zero-crossings of the RF wave 301, or as close to it as possible.

Figure 4:
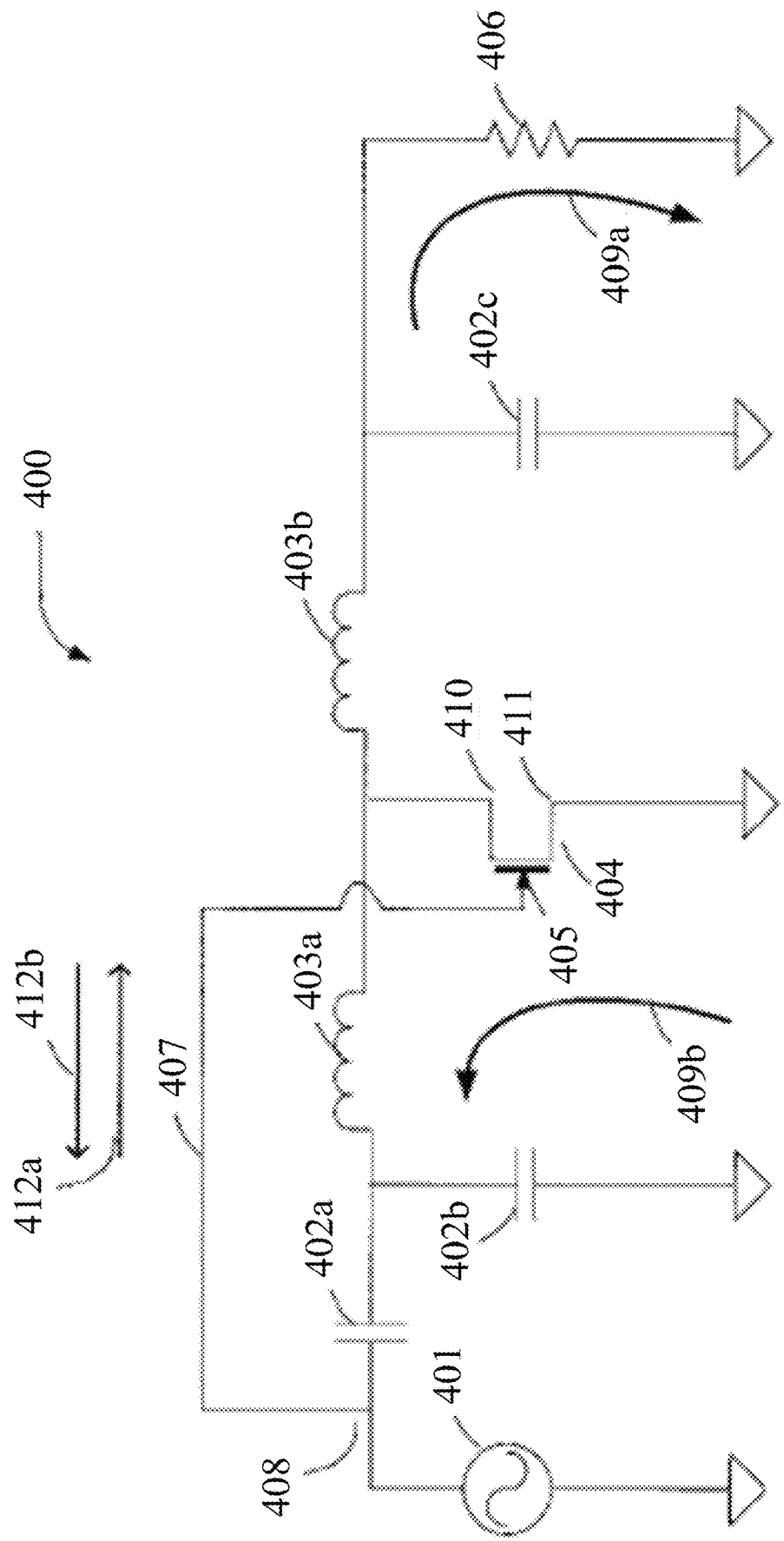
FIG. 4 is a circuit diagram illustrating a representative system for a synchronous rectification of an alternating current (AC) in accordance with some embodiments.

FIG. 4 illustrates a system 400 for a synchronous rectification of an alternating current (AC) signal, accordingly to an exemplary embodiment. The system 400 is configured to rectify AC generated by an AC power source 401 to supply a direct current (DC) to a load 406. In the context of rectifying a wireless waveform received through an antenna, the AC waveform, for example the RF waveform received through one or more antennas may be the power source 401, as explained further below. In some embodiments, the system 400 comprises one or more electrical components such as capacitors 402, inductors 403, one or more transistors 404, resistors (not shown), and/or other various circuit components. In some embodiments, the system 400 uses the electrical components for electrical functions such as storing electrical charges temporarily, controlling the fluctuation of the voltage across various portions of the circuit, and/or controlling the fluctuation of current passing through various portions of the circuit. In some embodiments, the system 400 further includes control circuits to control various aspects of the system 400 and its operation. In some embodiments, the system 400 also includes one or more impedance matching circuits, resonance matching circuits, filtering circuits, and/or other kinds of circuits.

In some embodiments, AC power source 401 is a radio frequency (RF) antenna or any other type of energy harvesting device, which receives power from one or more power waves. For instance, in some embodiments, the AC power source 401 is a receiving antenna, where the electrons within the antenna are excited by electromagnetic waves to generate AC in a conductor connected to the antenna. In some embodiments, in addition to the antenna, RF receiving circuitry is also included in the receiver, for example to down-convert the received signal to baseband. In some embodiments, the load 406 is any device that is powered by the power harvested from one or more power RF waves. In some embodiments, the load 406 is configured to operate using DC power. Although the aforementioned embodiment describes receiving AC power from one or more power waves and rectifying the AC into DC power for the load 406, it should be understood that the system 400 may be used for any type of rectification, regardless the source of AC power and the load device.

In some embodiments, the capacitors 402 are any suitable capacitors. For example, the capacitors 402 may have fixed capacitance values or may be have variable capacitance values. For capacitors 402 having variable capacitance, the capacitance is adjusted manually or by a control circuit (not shown). In some embodiments, the system 400 uses the capacitors 402 as a temporary storage of charges during the operation of the system 400. In some embodiments, the system 400 temporarily stores the charge in the capacitors 402 and releases the stored charge to control the voltage fluctuations across various portions of the circuit. In some embodiments, the system 400 uses the capacitors 402, for example capacitor 402a, to filter-out or convert to DC from the AC. The inductors 403 may be any kind of inductors known in the art. In some embodiments, the system 400 uses the inductors 403 to smooth out the fluctuation of the current passing through the inductors 403.

In some embodiments, the transistor 404 is a field effect transistor (FET). For example, in some embodiments, the transistor 404 is a complementary metal oxide semiconductor (CMOS) P-type FET or N-type FET. In some embodiments, the transistor 404 is a Gallium arsenide (GaAs) FET or a Gallium nitride (GaN) FET. In some embodiments, the transistor 404 is a 2.5 V silicon on insulator (SOI) CMOS NFET implementing a Class-E switch. In some embodiments, the transistor may be a floating gate FET, for example floating gate MOSFET. In some embodiments, the Class-E switch is used to construct a Class-E power amplifier. In some embodiments, a Class-F switch is used to construct a synchronous Class-F rectifier. In some embodiments, a Class-E switch is used to construct a synchronous Class-E rectifier. In some embodiments, the transistor 404 comprises a gate 405, a drain 210, and a source 211. It should be understood that one or more types of the transistors 404 described herein are merely exemplary, and other transistors and/or switching devices may be used without deviating from the scope of this disclosure.

In operation, the AC power source 401 may generate an AC voltage. In some implementations, the frequency of the generated AC voltage may be fixed, for example at 5.8 GHz. In other implementations, the frequency of the AC voltage may be variable. In these implementations, the frequency of the AC voltage may fluctuate within a frequency band. One ordinarily skilled in the art appreciates that the AC voltage may reverse its polarity at every cycle. Furthermore, as the AC power source 401 reverses the polarity of the AC voltage, the direction of the flow of current through one or more portions of the system 400 reverses as well. For example, during the positive polarity ("positive cycle") of the AC voltage generated by the AC power source 401, a current may be moving in a direction 412a. During the negative polarity ("negative cycle") of the AC voltage generated by the AC power source 401, the current may be moving in an opposite direction 412b. While reversing the polarity of the voltage, that is, transitioning from the positive cycle to the negative cycle and vice-versa, the AC voltage generated by the power source 401 may pass through a zero-crossing. A zero-crossing may be defined as a point where the value of the AC voltage generated by the AC power source is zero. When the current and the voltage are in phase, the zero crossing for the voltage may coincide with the zero-crossing of the current generated by the voltage. A person ordinarily skilled in the art understands that, for an efficient rectification of the AC to DC, the transistor 404 may have to switch at every zero-crossing of the voltage or current. In other words, the transistor 404 may have to be synchronized with the alternating current or voltage. Failure to switch at the zero-crossing, i.e. lack of synchronous switching of the transistor 404, may result in the loss of power. Although the following description applies to both synchronization with the phases of each of alternating voltages and currents in a circuit, the following description uses synchronization based on the phases of the voltage for the sake of brevity.

To synchronize the switching of the transistor 404 with the AC voltage generated by the AC power source, the system 400 includes a tap-line 407 connected at a position 408 to a power line coming out of the AC power source. In some embodiments, the tap-line 407 may comprise a micro-strip of a preselected length. The length of the micro-strip may be selected such that the phase of the waveform seen by the drain 410 of the transistor 404 is out of phase of the waveform seen by the gate 405 of the transistor 404. In some embodiments, the length of the micro-strip is selected to be different for different frequencies of the AC voltage being rectified. For instance, for any point in time, if the reference phase at the voltage source is φREF and the phase of the waveform seen by the drain 410 is φREF+φOFFSET, the length of the tap-line 407 may be selected such that the phase of the waveform seen by gate 405 is φREF+φOFFSET+π or φREF+φOFFSET−π. Therefore, during the positive cycle of the AC when the current is moving in the direction 412a, the voltage waveform seen by the drain 410 may have a positive polarity while the voltage waveform seen by the gate 405 may have a negative polarity, and vice versa. The voltage waveform with negative polarity may bias the gate 405 such that the transistor 404 operates as an open switch, that is, there may be no conduction path for the current through the transistor 404. Therefore, the current may pass through the inductor 403b and onto the load 406 in the direction 409a.

During the negative cycle of the AC, when the current is moving in the direction 412b, the voltage waveform seen by the drain 410 may have a negative polarity while the voltage seen by the gate 405 may have a positive polarity due to the predetermined length of the tap-line 407, as detailed above. The voltage waveform with the positive polarity at the gate 405 may bias the gate 405 such that the transistor 404 operates as a closed switch, that is, there may be a conduction path from the ground through the transistor 404 towards the power source 401. Therefore, as the power source 401 is at a lower potential that the ground, the transistor 404 may provide a path of least resistance between the ground and the power source 401. As a result, the current may flow from the ground and through the transistor in the direction 409b. On the contrary, the load 406 may not provide a path of least resistance between the ground and the power source 401, and therefore no current may flow from the load 406 during the negative cycle of the AC.

During the negative cycle of the AC, the system 400 may store charges from the current flowing in the direction 409b, 412b in one or more charge storage devices, such as the capacitor 402b. The system 400 may transfer the stored charges from the capacitor 402b to the load during one or more subsequent positive cycles of the AC when current is allowed to pass through the load 406. The system 400 may use the stored the charge to smooth out the current passing through the load 406 during the positive cycle of the AC.

Figure 5:
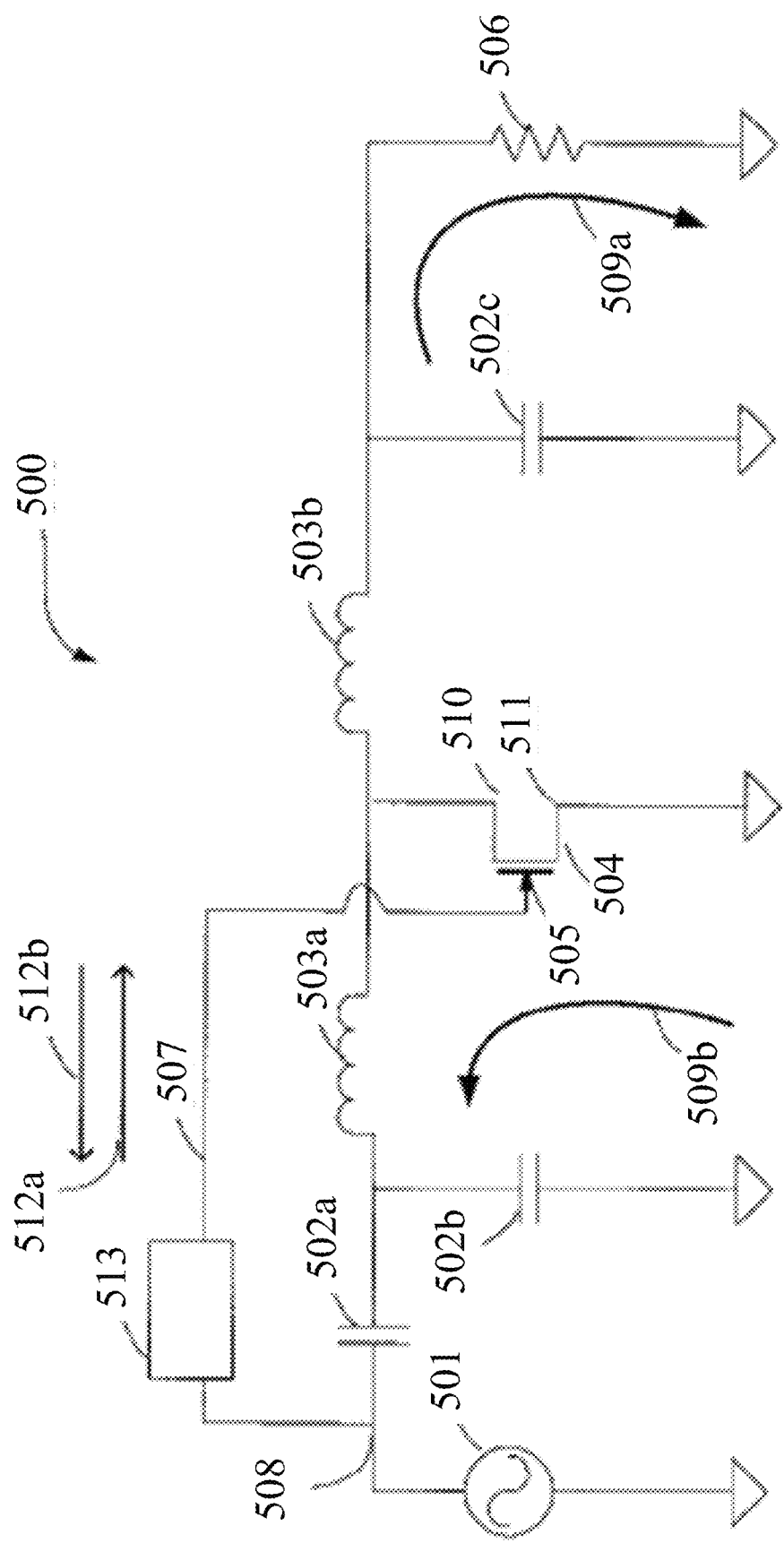
FIG. 5 is a circuit diagram illustrating a representative system for a synchronous rectification of an alternating current (AC) in accordance with some embodiments.

FIG. 5 illustrates a system 500 for a synchronous rectification of an alternating current (AC), accordingly to an exemplary embodiment. The system 500 may be configured to rectify AC generated by an AC power source 501 to supply a direct current (DC) to a load 506. The system 500 may comprise electrical components such as capacitors 502, inductors 503, one or more transistors 504, resistors (not shown), and/or other various circuit components. The system 500 may use the electrical components for electrical functions such as storing electrical charges temporarily, controlling the fluctuation of the voltage across various portions of the circuit, and/or controlling the fluctuation of current passing through various portions of the circuit. The system 500 may further include control circuits to control various aspects of the system 500 and its operation. The system 500 may also include impedance matching circuits, resonance matching circuits, filtering circuits, and/or other kinds of circuits.

In some embodiments, the AC power source 501 is a radio frequency (RF) antenna or any other type of energy harvesting device, which receives power from one or more power waves. In some embodiments, it may also include additional receiver circuitry, for instance RF receiving circuitry, down-converter. For instance, in some embodiments, the AC power source 501 is a receiving antenna, wherein the electrons within the antenna may be excited by the electrical component of electromagnetic waves thereby generating an AC in a wire connected to the antenna. In some embodiments, the load 506 is any device that is powered by the power harvested from one or more RF power waves, i.e., RF waves that transmit power. In some instances, the load 506 is configured to operate using DC power. Although the aforementioned embodiment describes receiving AC power from one or more power waves and rectifying the AC into DC power for the load 506, it should be understood that the system 500 may be used for any type of rectification, regardless the source of AC power and the load device.

The capacitors 502 may be any kind of capacitors. For example, in some embodiments, the capacitors 502 have fixed capacitance values or may be have variable capacitance values. For capacitors 502 having variable capacitance, the capacitance may be adjusted manually or by a control circuit (not shown). The system 500 may use the capacitors 502 as a temporary storage of charges during the operation of the system 500. In some embodiments, the system 500 temporarily stores the charge in the capacitors 502 and release the stored charge to control the voltage fluctuations across various portions of the circuit. In some embodiments, the system 500 uses the capacitors 502, for example the capacitor 502a, to convert or filter-out DC from the AC. The inductors 503 may be any kind of inductors known in the art. In some embodiments, the system 500 uses the inductors 503 to smooth the fluctuation of the current passing through the inductors 503.

In some embodiments, the transistor 504 is a field effect transistor (FET). For example, in some embodiments, the transistor 504 is a complementary metal oxide semiconductor (CMOS) P-type FET or N-type FET. In some embodiments, the transistor 504 is a Gallium arsenide (GaAs) FET or a Gallium nitride (GaN) FET. In some embodiments, the transistor 504 is a 2.5 V silicon on insulator (SOI) CMOS NFET implementing a class-E switch. In some embodiments, the transistor is a floating gate MOSFET. In some embodiments, the Class-E switch may be used to construct a Class-E power amplifier. In some embodiments, a Class-F switch is used to construct a synchronous Class-F rectifier. In some embodiments, a Class-E switch is used to construct a synchronous class-E rectifier. The transistor 504 may comprise a gate 505, a drain 310, and a source 311. It should be understood that one or more types of the transistors 504 described herein are merely exemplary, and other transistors and/or switching devices may be used without deviating from the scope of this disclosure.

In operation, the AC power source 501 may generate an AC voltage. In some implementations, the frequency of the generated AC voltage may be fixed, for example at 5.8 GHz. In other implementations, the frequency of the AC voltage may be variable. In these implementations, the frequency of the AC voltage may fluctuate within a frequency band. One ordinarily skilled in the art appreciates that the AC voltage may reverse its polarity at every cycle. Furthermore, as the AC power source 501 reverses the polarity of the AC voltage, the direction of the flow of current through one or more portions of the system 500 reverses as well. For example, during the positive polarity ("positive cycle") of the AC voltage generated by the AC power source 501, a current may be moving in a direction 512*a*. During the negative polarity ("negative cycle") of the AC voltage generated by the AC power source 501, the current may be moving in an opposite direction 5312*b*. While reversing the polarity of the voltage, that is, transitioning from the positive cycle to the negative cycle and vice-versa, the AC voltage generated by the power source 501 may pass through a zero-crossing. A zero-crossing may be defined as a point where the value of the AC voltage generated by the AC power source is zero. When the current and the voltage are in phase, the zero crossing for the voltage may coincide with the zero-crossing of the current generated by the voltage. A person ordinarily skilled in the art understands that, for an efficient rectification of the AC to DC, the transistor 504 may have to switch at every zero-crossing of the voltage or current. In other words, the transistor 504 may have to be synchronized with the alternating current or voltage. Failure to switch the zero-crossing, i.e. lack of synchronous switching of the transistor 504, may result in the loss of power. Although the following description applies to both synchronization with the phases of each of alternating voltages and currents in a circuit, the following description uses synchronization based on the phases of the voltage for the sake of brevity.

To synchronize the switching of the transistor 504 with the AC voltage generated by the AC power source, the system 500 includes a tap-line 507 connected at a position 508 to a power line coming out of the AC power source. In some embodiments, a feed-forward controller 513 may be connected to the tap-line 507. In some embodiments, the feed-forward controller 513 may be a series LC circuit to shift the phase of a voltage waveform. The feed-forward controller 513 may control the phase of the voltage, for example by inserting a delay, in the tap-line 507 to synchronize and control the rectification of the AC voltage generated by the AC power source 501. For example, the feed-forward controller 513 may select the phase of the waveform passing through the tap-line 507 to the gate 505 of the transistor such the phase of the waveform seen by the drain 310 of the transistor 504 is out of phase of the waveform seen by the gate 505. For instance, for any point in time, if the reference phase at the voltage source is φREF and the phase of the waveform seen by the drain 510 is $\varphi_{REF}+\varphi_{OFFSET}$, the feed-forward controller may select the that the phase of the waveform seen by gate 505 to be $\varphi_{REF}+\varphi_{OFFSET}+\pi$ or $\varphi_{REF}+\varphi_{OFFSET}-\pi$. Therefore, during the positive cycle of the AC when the current is moving in the direction 512*a*, the voltage waveform seen by the drain 510 may have a positive polarity while the voltage waveform seen by the gate 505 may have a negative polarity. The voltage waveform with negative polarity may bias the gate 505 such that the transistor 504 operates as an open switch, that is, there may be no conduction path for the current through the transistor 504. Therefore, the current may pass through the inductor 503*b* and onto the load 506 in the direction 509*a*.

During the negative cycle of the AC, when the current is moving in the direction 512*b*, the voltage waveform seen by the drain 510 may have a negative polarity while the voltage seen by the gate 505 may have a positive polarity due to the phase selection by the feed-forward controller 513, as detailed above. The voltage waveform with the positive polarity at the gate 505 may bias the gate 505 such that the transistor 504 operates as a closed switch, that is, there may be a conduction path from the ground through the transistor 504 towards the power source 501. Therefore, as the power source 501 is at a lower potential that the ground, the transistor 504 may provide a path of least resistance between the ground and the power source 501. As a result, the current may flow from the ground and through the transistor in the direction 509*b*. On the contrary, the load 506 may not provide a path of least resistance between the ground and the power source 501, and therefore no current may flow from the load 506 during the negative cycle of the AC.

During the negative cycle of the AC, the system 500 may store charges from the current flowing in the direction 509*b*, 512*b* in one or more charge storage devices, such as the capacitor 502*b*. The system 500 may transfer the stored charges from the capacitor 502*b* to the load during one or more subsequent positive cycles of the AC when current is allowed to pass through the load 506. The system 500 may use the stored the charge to smooth out the current passing through the load 506 during the positive cycle of the AC.

In some embodiments, the feed-forward controller 513 may control the phase of the waveform through the tap-line such that the tap-line biases one or more switching devices (for example transistor 504) such that the switching may occur out of phase with the voltage waveform. Such out of phase switching may regulate the amount of power being rectified by the system 500. In some embodiments, the switching is completely out of phase by one or more switching devices such that no power is being rectified by the system 500, and the incoming power may be bounced back to the power source. Therefore, in these embodiments, the unwanted power may be kept out of various components of the system 500, thereby avoiding unnecessary heating of the components of the system 500.

Figure 6:
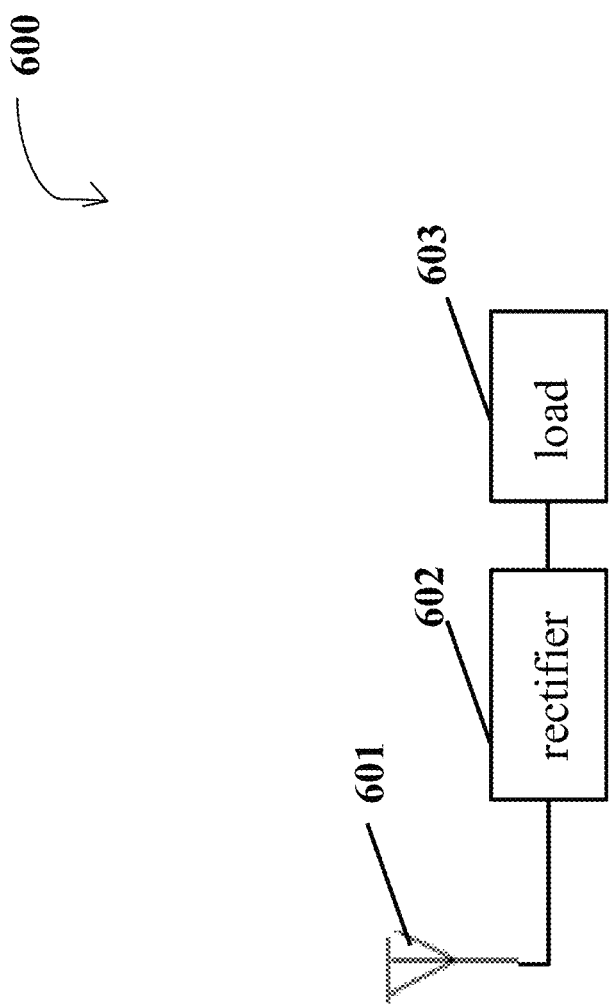
FIG. 6 is a block diagram illustrating a representative a wireless power receiver in accordance with some embodiments.

FIG. 6 shows an exemplary wireless power receiver 600, according to an exemplary embodiment. In some embodiments, the wireless power receiver 600 comprises an antenna 601, a rectifier 602, and a load 603. In some embodiments, the antenna 601 receives radio frequency (RF) power waves transmitted from one or more transmitters and generate an alternating current (AC) voltage from the RF power waves. In some embodiments, the antenna 601 is any type of antenna such a patch antenna, a loop antenna, and/or a spiral antenna. In some embodiments, the AC voltage generated by the antenna 601 is conducted to the rectifier 602. In some embodiments, the rectifier 602 is a synchronous rectifier that uses a field effect transistor (FET) as a Class-E switch. In some embodiments, the rectifier 602 converts the received AC voltage to DC voltage and supply the DC voltage to the load 603.

In some embodiments, the receiver 600 comprises electrical components such as capacitors, inductors, resistors, and/or other various circuit components. In some embodiments, the receiver 600 uses the electrical components for electrical functions such as storing electrical charges temporarily, controlling the fluctuation of the voltage across various portions of the circuit, and/or controlling the fluctuation of current passing through various portions of the circuit. In some embodiments, the receiver 600 further includes control circuits to control various aspects of the receiver 600 and its operation. In some embodiments, the receiver 600 also includes impedance matching circuits, resonance matching circuits, filtering circuits, and/or other kinds of circuits. In some embodiments, the receiver 600 also comprises one or more power converters to step up or step down voltages at various portions of the receiver 600.

The capacitors may be any kind of capacitors. For example, the capacitors may have fixed capacitance values or may be have variable capacitance values. For capacitors having variable capacitance, the capacitance may be adjusted manually or by a control circuit. The receiver 600 may use the capacitors as a temporary storage of charges during the operation of the receiver 600. A person ordinarily skilled in the art appreciates that, the receiver 600 may temporarily store the charge in the capacitors and release the stored charge to control the voltage fluctuations across various portions of the receiver 600. The receiver 600 may also use the capacitors to filter out DC component in an AC. The inductors may be any kind of inductors known in the art. The receiver 600 may use the inductors to smooth the fluctuation of the current passing through the inductors.

The foregoing method descriptions and the process flow diagrams are provided merely as illustrative examples and are not intended to require or imply that the steps of the various embodiments must be performed in the order presented. As will be appreciated by one of skill in the art the steps in the foregoing embodiments may be performed in any order. Words such as "then," "next," and the like, are not intended to limit the order of the steps; these words are simply used to guide the reader through the description of the methods. Although process flow diagrams may describe the operations as a sequential process, many of the operations can be performed in parallel or concurrently. In addition, the order of the operations may be rearranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module that may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product. The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein. While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A wireless power receiver, comprising:
   at least one radio frequency (RF) antenna configured to generate an alternating current (AC) waveform from received RF waves;
   a power line configured to carry a first signal based on the AC current generated by the least one RF antenna;
   a tap-line coupled to the power line, wherein the tap-line is configured to carry a second signal, the second signal being based on the AC current generated by the least one RF antenna and distinct from the first signal; and
   a transistor coupled to at least the power line and the tap-line, wherein the transistor is configured to provide a direct current (DC) waveform to a load based on the first and second signals.

2. The wireless power receiver of claim 1, wherein providing the DC waveform to the load based on the first and second signals includes:
   alternating between switching states based on the first and second signals,
   providing the first signal to the load during a first switching state, and
   forgoing providing the first signal to the load during a second switching state.

3. The wireless power receiver of claim 2, wherein forgoing providing the first signal to the load during the second switching state includes providing the first signal to a capacitor.

4. The wireless power receiver of claim 3, wherein after the second switching state and during a subsequent first switching state:
   the transistor is further configured to provide the first signal to the load; and
   the capacitor is configured to release a stored first signal such that the DC waveform provided to the load has a smooth current.

5. The wireless power receiver of claim 1, wherein the second signal is a feed-forward signal having a different phase from the first signal.

6. The wireless power receiver of claim 1, wherein the tap-line is a micro-strip of a predetermined length that is selected such that the second signal arrives at the transistor completely out of phase or nearly completely out of phase with the first signal.

7. The wireless power receiver of claim 1, wherein the tap-line includes a feed-forward controller configured to insert a phase delay into the second signal.

8. The wireless power receiver of claim 7, wherein the feed-forward controller is configured to insert the phase delay into the second signal such that the second signal arrives at the transistor completely out of phase or nearly completely out of phase with the first signal.

9. The wireless power receiver of claim 7, wherein the feed-forward controller is configured to insert the phase delay into the second signal such that the second signal arrives at the transistor with a predetermined phase offset with the first signal.

10. The wireless power receiver of claim 1, wherein the transistor is selected from the group consisting of: complementary metal oxide semiconductor (CMOS) P-type field effect transistor (FET), CMOS N-type FET, Gallium arsenide (GaAs) FET, Gallium nitride (GaN) FET, silicon on insulator (SOI) FET, and a floating gate metal oxide FET (MOSFET).

11. The wireless power receiver of claim 1, wherein transistor is configured to implement a Class-E or a Class-F switch.

12. The wireless power receiver of claim 1, wherein the first signal is received at a drain of the transistor, the second signal is received at a gate of the transistor, and a source of the transistor is coupled to ground.

13. A method of receiving wireless power comprising:
    receiving radio frequency (RF) waves at a RF antenna;
    generating an alternating current (AC) waveform from the RF waves;
    providing, via a power line, a first signal to a transistor, wherein the first signal is based on the AC waveform;
    providing, via a tap-line coupled to the power line, a second signal to the transistor wherein the second signal is based on the AC waveform and distinct from the first signal; and
    providing, via the transistor, a direct current (DC) waveform to a load based on the first and second signals.

14. The method of claim 13, wherein providing, via the transistor, the DC waveform to the load based on the first and second signals includes:
    alternating between switching states based on the first and second signals,
    providing the first signal to the load during a first switching state, and
    forgoing providing the first signal to the load during a second switching state.

15. The method of claim 14, wherein forgoing providing the first signal to the load during the second switching state includes providing the first signal to a capacitor.

16. The method of claim 15, further comprising after the second switching state and during a subsequent first switching state:
    providing, via the transistor, the first signal to the load; and
    releasing, from the capacitor, a stored first signal such that the DC waveform provided to the load has a smooth current.

17. The method of claim 13, wherein the second signal is a feed-forward signal having a different phase from the first signal.

18. The method of claim 13, wherein the tap-line includes a feed-forward controller, and the method comprises:
    inserting, by the feed-forward controller, a phase delay in the second signal.

19. The method of claim 18, wherein the feed-forward controller inserts the phase delay such that the second signal arrives at the transistor completely out of phase or nearly completely out of phase with the first signal.

20. The method of claim 18, wherein the feed-forward controller inserts the phase delay such that the second signal arrives at the transistor with a predetermined phase offset with the first signal.

21. The method of claim 13, wherein the tap-line is a micro-strip of a predetermined length that is selected such that the second signal arrives at the transistor completely out of phase with the first signal.

22. The method of claim 13, wherein the transistor is selected form from the group consisting of: complementary metal oxide semiconductor (CMOS) P-type field effect transistor (FET), CMOS N-type FET, Gallium arsenide (GaAs) FET, Gallium nitride (GaN) FET, silicon on insulator (SOI) FET, and a floating gate metal oxide FET (MOSFET).

23. The method of claim 13, wherein the transistor is configured to implement a Class-E or a Class-F switch.

24. The method of claim 13, wherein the first signal is received at a drain of the transistor, the second signal is received at a gate of the transistor, and a source of the transistor is coupled to ground.

\* \* \* \* \*